US010020322B2

(12) United States Patent
Ito et al.

(10) Patent No.: US 10,020,322 B2
(45) Date of Patent: Jul. 10, 2018

(54) TRANSISTOR AND SEMICONDUCTOR DEVICE

(71) Applicant: Semiconductor Energy Laboratory Co., Ltd., Atsugi-shi, Kanagawa-ken (JP)

(72) Inventors: Daigo Ito, Kanagawa (JP); Takahisa Ishiyama, Kanagawa (JP); Katsuaki Tochibayashi, Kanagawa (JP); Yoshinori Ando, Kanagawa (JP); Yasutaka Suzuki, Kanagawa (JP); Mitsuhiro Ichijo, Kanagawa (JP); Toshiya Endo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/390,894

(22) Filed: Dec. 27, 2016

(65) Prior Publication Data
US 2017/0186779 A1 Jun. 29, 2017

(30) Foreign Application Priority Data
Dec. 29, 2015 (JP) ................. 2015-257709

(51) Int. Cl.
*H01L 29/10* (2006.01)
*H01L 27/12* (2006.01)
(Continued)

(52) U.S. Cl.
CPC ........ *H01L 27/1225* (2013.01); *H01L 27/124* (2013.01); *H01L 27/1248* (2013.01);
(Continued)

(58) Field of Classification Search
CPC ............... H01L 27/1225; H01L 27/124; H01L 27/1248; H01L 27/1255; H01L 29/4908; H01L 29/7869
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Yosef Gebreyesus
(74) *Attorney, Agent, or Firm* — Fish & Richardson P.C.

(57) ABSTRACT

A highly reliable semiconductor device which includes an oxide semiconductor is provided. Alternatively, a transistor having normally-off characteristics which includes an oxide semiconductor is provided. The transistor includes a first conductor, a first insulator, a second insulator, a third insulator, a first oxide, an oxide semiconductor, a second conductor, a second oxide, a fourth insulator, a third conductor, a fourth conductor, a fifth insulator, and a sixth insulator. The second conductor is separated from the sixth insulator by the second oxide. The third conductor and the fourth conductor are separated from the sixth insulator by the fifth insulator. The second oxide has a function of suppressing permeation of oxygen as long as oxygen contained in the sixth insulator
(Continued)

is sufficiently supplied to the oxide semiconductor through the second oxide. The fifth insulator has a barrier property against oxygen.

28 Claims, 45 Drawing Sheets

(51) Int. Cl.
- *H01L 29/49* (2006.01)
- *H01L 29/786* (2006.01)
- *H01L 29/778* (2006.01)
- *H01L 29/24* (2006.01)

(52) U.S. Cl.
CPC ...... *H01L 27/1255* (2013.01); *H01L 29/4908* (2013.01); *H01L 29/7781* (2013.01); *H01L 29/7782* (2013.01); *H01L 29/7786* (2013.01); *H01L 29/7869* (2013.01); *H01L 29/24* (2013.01); *H01L 2224/05* (2013.01); *H01L 2224/48463* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,519,387 B2 | 8/2013 | Endo et al. |
| 8,547,771 B2 | 10/2013 | Koyama |
| 8,748,240 B2 | 6/2014 | Yamazaki |
| 8,753,928 B2 | 6/2014 | Yamazaki et al. |
| 8,785,258 B2 | 7/2014 | Yamazaki |
| 8,796,681 B2 | 8/2014 | Yamade et al. |
| 8,809,992 B2 | 8/2014 | Yamazaki et al. |
| 8,828,794 B2 | 9/2014 | Yamazaki et al. |
| 8,865,555 B2 | 10/2014 | Yamazaki et al. |
| 8,878,173 B2 | 11/2014 | Yamazaki |
| 8,912,080 B2 | 12/2014 | Yamazaki |
| 8,927,990 B2 | 1/2015 | Sasaki et al. |
| 8,969,130 B2 | 3/2015 | Tanaka et al. |
| 9,012,913 B2 | 4/2015 | Noda et al. |
| 9,023,684 B2 | 5/2015 | Suzawa et al. |
| 9,082,860 B2 | 7/2015 | Nakano et al. |
| 9,099,560 B2 | 8/2015 | Yamazaki |
| 9,356,054 B2 | 5/2016 | Miyairi et al. |
| 9,502,572 B2 | 11/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0224174 A1* | 9/2008 | Sasaki ............... H01L 21/8252 257/197 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0079778 A1 | 4/2011 | Yamazaki et al. |
| 2011/0101335 A1 | 5/2011 | Yamazaki et al. |
| 2013/0161611 A1 | 6/2013 | Yamazaki et al. |
| 2013/0187150 A1 | 7/2013 | Yamazaki et al. |
| 2014/0027762 A1 | 1/2014 | Tsurume et al. |
| 2014/0138675 A1* | 5/2014 | Yamazaki ......... H01L 29/66757 257/43 |
| 2014/0326992 A1 | 11/2014 | Hondo et al. |
| 2014/0332800 A1* | 11/2014 | Hanaoka ............. H01L 29/7869 257/43 |
| 2014/0339548 A1* | 11/2014 | Yamazaki ........... H01L 29/7869 257/43 |

(56) References Cited

U.S. PATENT DOCUMENTS

| | | | | |
|---|---|---|---|---|
| 2014/0339549 | A1* | 11/2014 | Yamazaki | H01L 29/7869 257/43 |
| 2015/0187814 | A1* | 7/2015 | Miyairi | H01L 27/1225 257/43 |
| 2015/0187823 | A1* | 7/2015 | Miyairi | H01L 27/1225 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-395.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 :SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn Fe, Ni, Cu,or Zn] at Temperatures Over 1000° C.", Journal of Solid State Chemistry, 1985, vol. 60, pp. 382-384

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., Development of Driver-Integrated Panel Using Amorphous In—Ga—Zn-Oxide TFT, AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

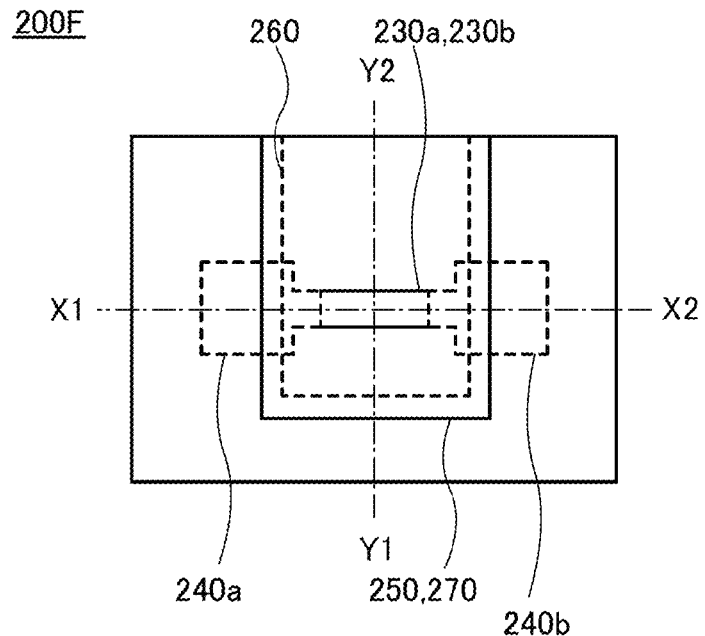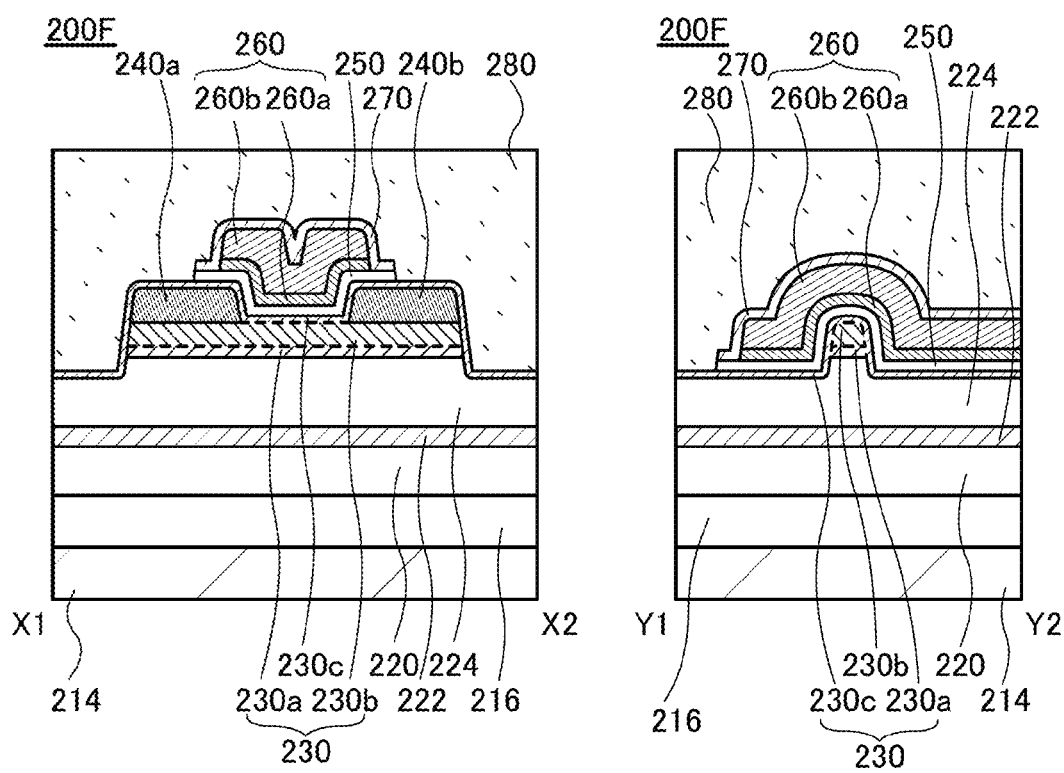

TRANSISTOR AND SEMICONDUCTOR DEVICE

BACKGROUND OF THE INVENTION

1. Field of the Invention

One embodiment of the present invention relates to a transistor. One embodiment of the present invention relates to an object, a method, or a manufacturing method. One embodiment of the present invention relates to a process, a machine, manufacture, or a composition of matter. One embodiment of the present invention relates to a semiconductor device, a light-emitting device, a display device, an electronic appliance, a lighting device, and a manufacturing method thereof. For example, one embodiment of the present invention relates to an LSI, a CPU, a power device mounted in a power circuit, a semiconductor integrated circuit including a memory, a thyristor, a converter, an image sensor, or the like, and an electronic device including any of the above as a component.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

A transistor including an oxide semiconductor is known to have a problem of low reliability because of high possibility of change in electrical characteristics, although the transistor including an oxide semiconductor can be operated at higher speed than a transistor including amorphous silicon and can be manufactured more easily than a transistor including polycrystalline silicon. For example, the threshold voltage of the transistor is changed in some cases after a bias-temperature stress test (BT test).

REFERENCE

Patent Document

[Patent Document 1] Japanese Published Patent Application No. 2012-257187

SUMMARY OF THE INVENTION

An object of one embodiment of the present invention is to improve the reliability of a semiconductor device including an oxide semiconductor. There is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

Another object is to provide a transistor having high reliability. Another object is to provide a transistor with extremely low leakage current in an off state.

Another object is to provide a semiconductor device having high reliability. Another object is to provide semiconductor devices with high productivity. Another object is to provide semiconductor devices with high yield. Another object is to provide a semiconductor device that occupies a small area.

Another object is to provide a highly integrated semiconductor device. Another object is to provide a semiconductor device which can operate at high speed. Another object is to provide a semiconductor device with low power consumption.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A transistor of one embodiment of the present invention includes: a first conductor serving as a second gate electrode; a first insulator over the first conductor; a second insulator over the first insulator; a third insulator over the second insulator; a first oxide over the third insulator; an oxide semiconductor over the first oxide; a second conductor over the oxide semiconductor; a second oxide over the third insulator, the first oxide, the oxide semiconductor, and the second conductor; a fourth insulator over the second oxide; a third conductor over the fourth insulator; a fourth conductor over the third conductor; a fifth insulator over the fourth insulator, the third conductor, and the fourth conductor; and a sixth insulator over the second oxide, the fourth insulator, and the fifth insulator. An end portion of the oxide semiconductor is substantially aligned with an end portion of the first oxide. The second conductor includes a region serving as a source or a drain. The fourth insulator includes a region serving as a gate insulating film. The third conductor includes a region serving as a first gate electrode. The fourth conductor comprises a region serving as the first gate electrode. An end portion of the fourth conductor is substantially aligned with an end portion of the third conductor. An end portion of the fourth insulator is substantially aligned with an end portion of the fifth insulator. The second conductor is separated from the sixth insulator by the second oxide. The third conductor and the fourth conductor are separated from the sixth insulator by the fifth insulator. The first insulator, the third insulator, the fourth insulator, and the sixth insulator each include a region containing oxygen in excess of the stoichiometric composition. The second oxide is configured to suppress permeation of oxygen as long as oxygen contained in the sixth insulator is sufficiently supplied to the oxide semiconductor through the second oxide. The fifth insulator has a barrier property against oxygen.

Another embodiment of the present invention is the above-described transistor in which the first oxide, the oxide semiconductor, and the second oxide each contain In-M-Zn oxide (M is Al, Ga, Y, or Sn).

Another embodiment of the present invention is the above-described transistor in which the second conductor contains tungsten.

Another embodiment of the present invention is the above-described transistor in which the second conductor is tungsten in which the amount of released oxygen that is converted into oxygen atoms in TDS analysis at a temperature in the range from 50° C. to 500° C. is less than or equal to $3.4 \times 10^{15}$ atoms/cm$^2$.

Another embodiment of the present invention is the above-described transistor in which the third conductor contains titanium nitride and the fourth conductor comprises tungsten.

Another embodiment of the present invention is a semiconductor device including the above-described transistor and a capacitor. One of a source and a drain of the transistor is electrically connected to one of a pair of electrodes of the capacitor.

Another embodiment of the present invention is the above-described semiconductor device further including a second transistor. The second transistor contains silicon in a semiconductor region, and one of a source and a drain of the transistor is electrically connected to a gate of the second transistor.

Another embodiment of the present invention is a semiconductor wafer including the transistor described above or the semiconductor device described above and a region for dicing.

A change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

A novel semiconductor device can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:
FIGS. 12A to 12C illustrate a top view and a cross-sectional structure of a transistor of one embodiment.

DETAILED DESCRIPTION OF THE INVENTION

Figure 1:
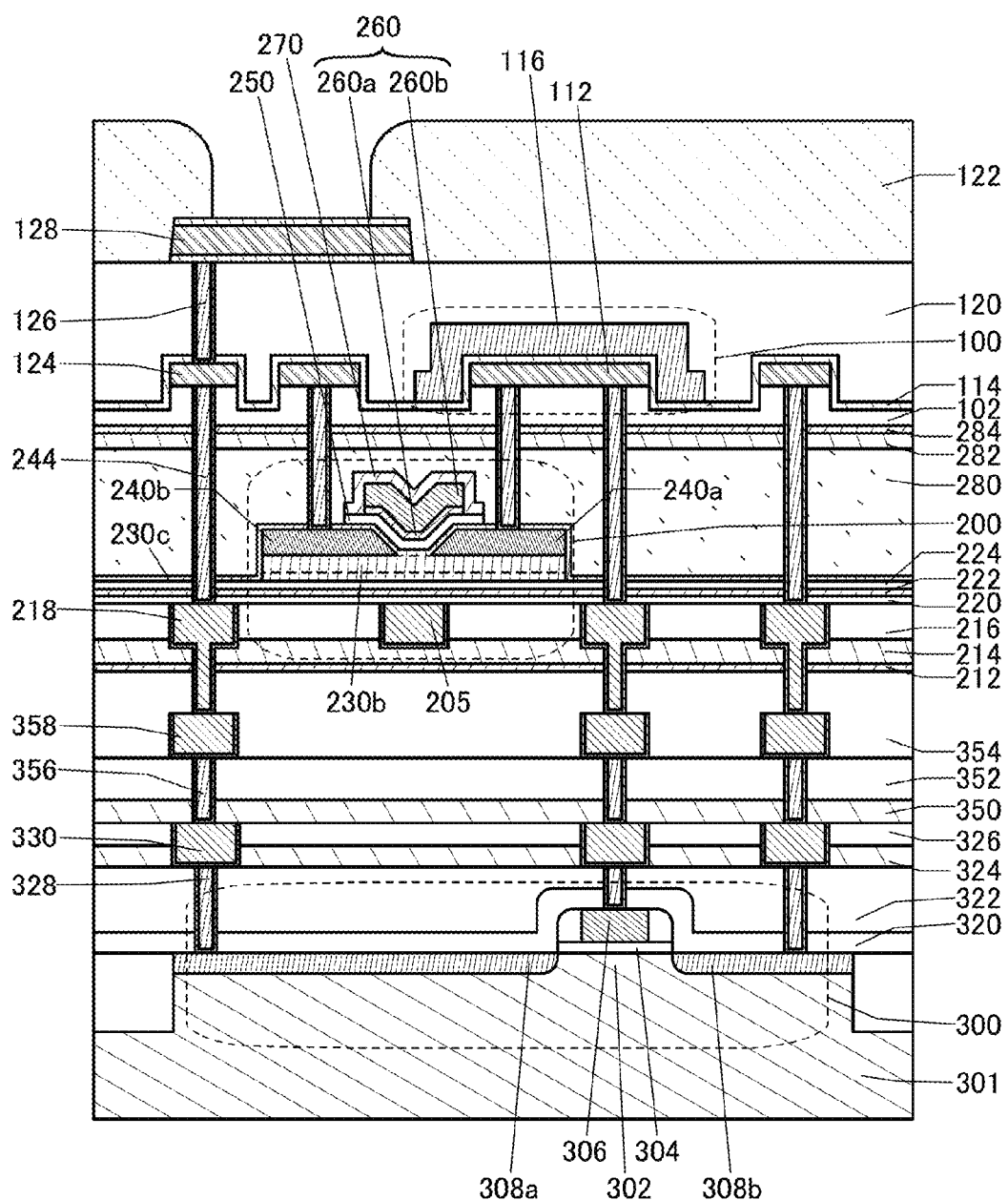
FIG. 1 illustrates a cross-sectional structure of a semiconductor device of one embodiment.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the expression that an end portion of a layer A is "substantially aligned" with an end portion of a layer B includes the case where the end portions of the layers A and B which are stacked are not completely aligned with each other; for example, the end portion of the layer A may be located inward from the end portion of the layer B, or may be located outward from the end portion of the layer B. For example, it can be said that an end portion of a layer A and an end portion of a layer B, which are stacked and etched using the same mask, are substantially aligned with each other.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, one mode of a semiconductor device is described with reference to FIG. 1, FIG. 2, FIG. 3, FIG. 4, FIG. 5, FIG. 6, and FIGS. 7A and 7B.

[Structure Examples]

Figure 5:
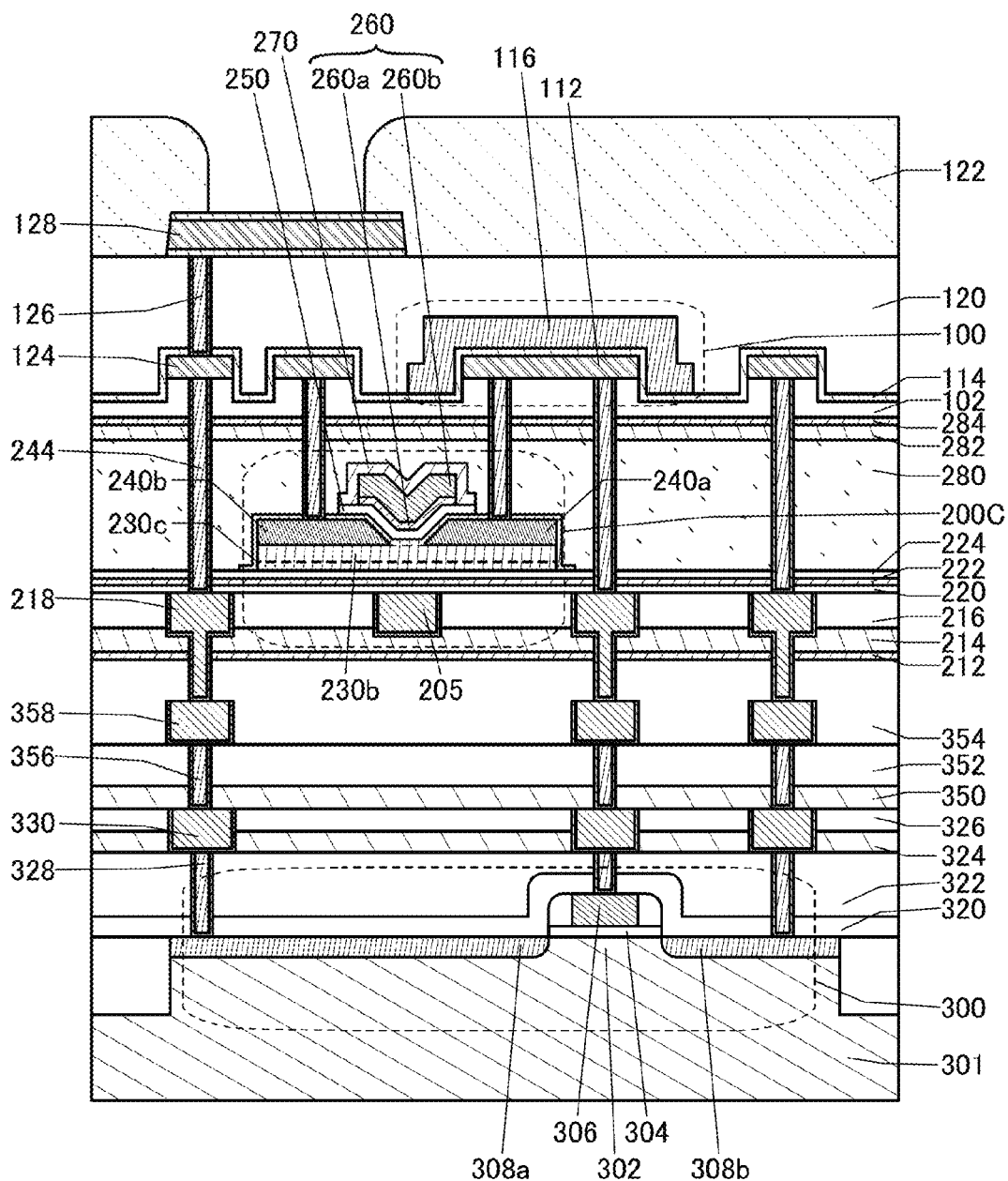
FIG. 5 illustrates a cross-sectional structure of a semiconductor device of one embodiment.
Figure 6:
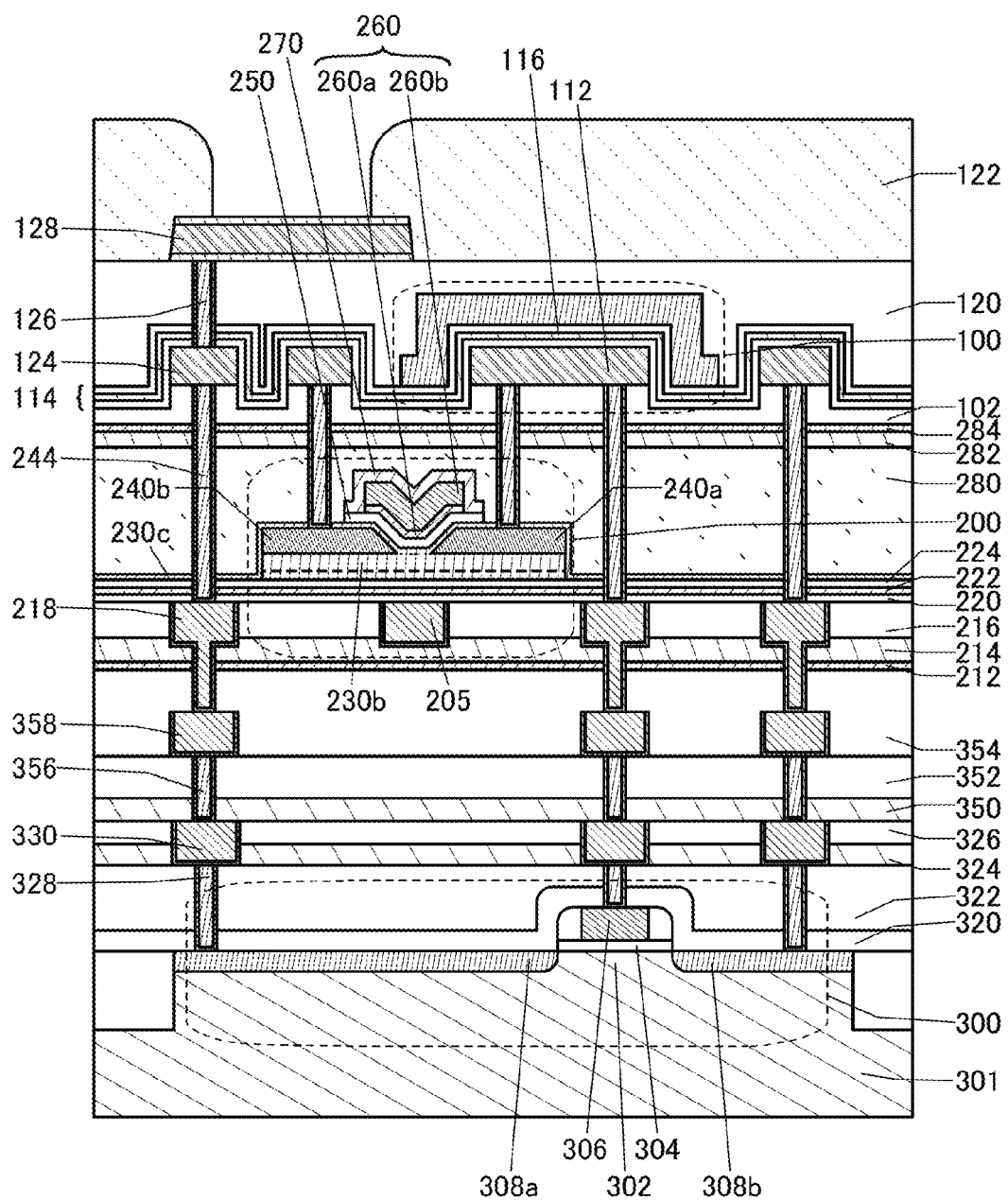
FIG. 6 illustrates a cross-sectional structure of a semiconductor device of one embodiment.
Figure 7A:
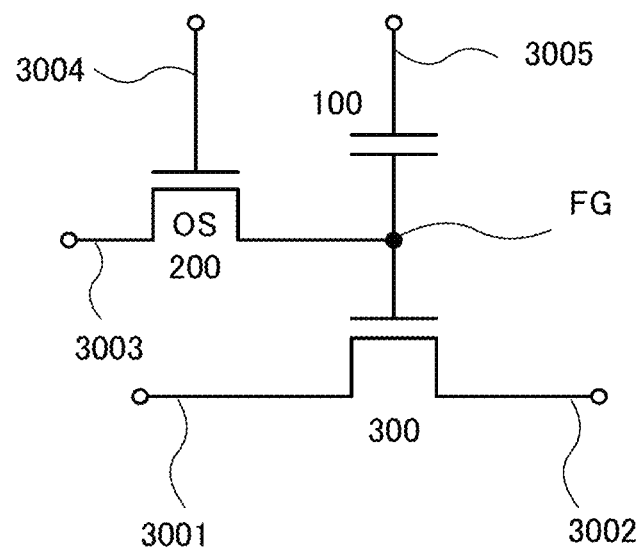
FIGS. 7A and 7B are each a circuit diagram of a semiconductor device of one embodiment.

Examples of a semiconductor device (memory device) of one embodiment of the present invention are shown in FIG. 1, FIG. 2, FIG. 3, FIG. 4, FIG. 5, FIG. 6, and FIGS. 7A and 7B. Note that FIG. 7A is a circuit diagram of FIG. 1, FIG. 2, FIG. 3, FIG. 4, FIG. 5, and FIG. 6.

<Circuit Configuration 1 of Semiconductor Device>

Semiconductor devices shown in FIG. 1, FIG. 2, FIG. 3, FIG. 4, FIG. 5, FIG. 6, and FIG. 7A each include a transistor 300, a transistor 200, and a capacitor 100.

The transistor 200 is a transistor in which a channel is formed in a semiconductor layer including an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 7A, a first wiring 3001 is electrically connected to a source of the transistor 300. A second wiring 3002 is electrically connected to a drain of the transistor 300. A third wiring 3003 is electrically connected to one of a source and a drain of the transistor 200. A fourth wiring 3004 is electrically connected to a gate of the transistor 200. A gate of the transistor 300 and the other of the source and the drain of the transistor 200 are electrically connected to one electrode of the capacitor 100. A fifth wiring 3005 is electrically connected to the other electrode of the capacitor 100.

The semiconductor device in FIG. 7A has a feature that the potential of the gate of the transistor 300 can be retained, and thus enables writing, retaining, and reading of data as follows.

Writing and retaining of data will be described. First, the potential of the fourth wiring 3004 is set to a potential at which the transistor 200 is turned on, so that the transistor 200 is turned on. Accordingly, the potential of the third wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the fourth wiring 3004 is set to a potential at which the transistor 200 is turned off, so that the transistor 200 is turned off. Thus, the charge is retained at the node FG (retaining).

In the case where the off-state current of the transistor 200 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 300, an apparent threshold voltage $V_{th\_H}$ at the time when the high-level electric charge is given to the gate of the transistor 300 is lower than an apparent threshold voltage $V_{th\_L}$ at the time when the low-level electric charge is given to the gate of the transistor 300. Here, an apparent threshold voltage refers to the potential of the fifth wiring 3005 which is needed to make the transistor 300 be in "on state". Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 300 is brought into "on state". On the other hand, in the case where the low-level charge is supplied to the node FG in writing, even when the potential of the fifth wiring 3005 is $V_0$ ($<V_{th\_L}$), the transistor 300 remains in "off state". Thus, the data retained in the node FG can be read by determining the potential of the second wiring 3002.

By arranging semiconductor devices each having the structure illustrated in FIG. 7A in a matrix, a memory device (memory cell array) can be formed.

Note that in the case where memory cells are arrayed, it is necessary that data of a desired memory cell is read in read operation. For example, a configuration in which data of a desired memory cell can be read by supplying a potential at which the transistor 300 is in "off state" regardless of the charge supplied to the node FG, that is, a potential lower than $V_{th\_H}$ to the fifth wiring 3005 of memory cells from which data is not read may be employed. As another example, a configuration in which data of a desired memory cell can be read by supplying a potential at which the transistor 300 is in "on state" regardless of the charge supplied to the node FG, that is, a potential higher than $V_{th\_L}$ to the fifth wiring 3005 of memory cells from which data is not read may be employed.

<Circuit Configuration 2 of Semiconductor Device>

Figure 7B:
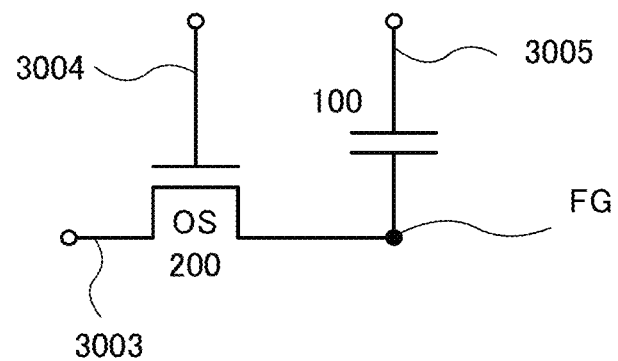

A semiconductor device in FIG. 7B is different from the semiconductor device in FIG. 7A in that the transistor 300 is not provided. Also in this case, data can be written and retained in a manner similar to that of the semiconductor device in FIG. 7A.

Reading of data in the semiconductor device in FIG. 7B is described. When the transistor 200 is brought into on state, the third wiring 3003 which is in a floating state and the capacitor 100 are brought into conduction, and the electric charge is redistributed between the third wiring 3003 and the capacitor 100. As a result, the potential of the third wiring 3003 is changed. The amount of change in the potential of the third wiring 3003 varies depending on the potential of the one electrode of the capacitor 100 (or the electric charge accumulated in the capacitor 100).

For example, the potential of the third wiring 3003 after the charge redistribution is $(C_B \times V_{B0} + C \times V)/(CB+C)$, where V is the potential of the one electrode of the capacitor 100, C is the capacitance of the capacitor 100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including a first semiconductor may be used for a driver circuit for driving a memory cell, and a transistor including a second semiconductor may be stacked over the driver circuit as the transistor 200.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure of Semiconductor Device>

The semiconductor device of one embodiment of the present invention includes the transistor 300, the transistor 200, and the capacitor 100 as shown in FIG. 1. The transistor 200 is provided over the transistor 300, and the capacitor 100 is provided over the transistor 300 and the transistor 200.

The transistor 300 is provided on a substrate 301 and includes a conductor 306, an insulator 304, a semiconductor region 302 that is a part of the substrate 301, and low-resistance regions 308a and 308b functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308a and 308b functioning as a source region and a drain region, and the like contain the second semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained as the second semiconductor. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 308a and 308b contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Figure 2:
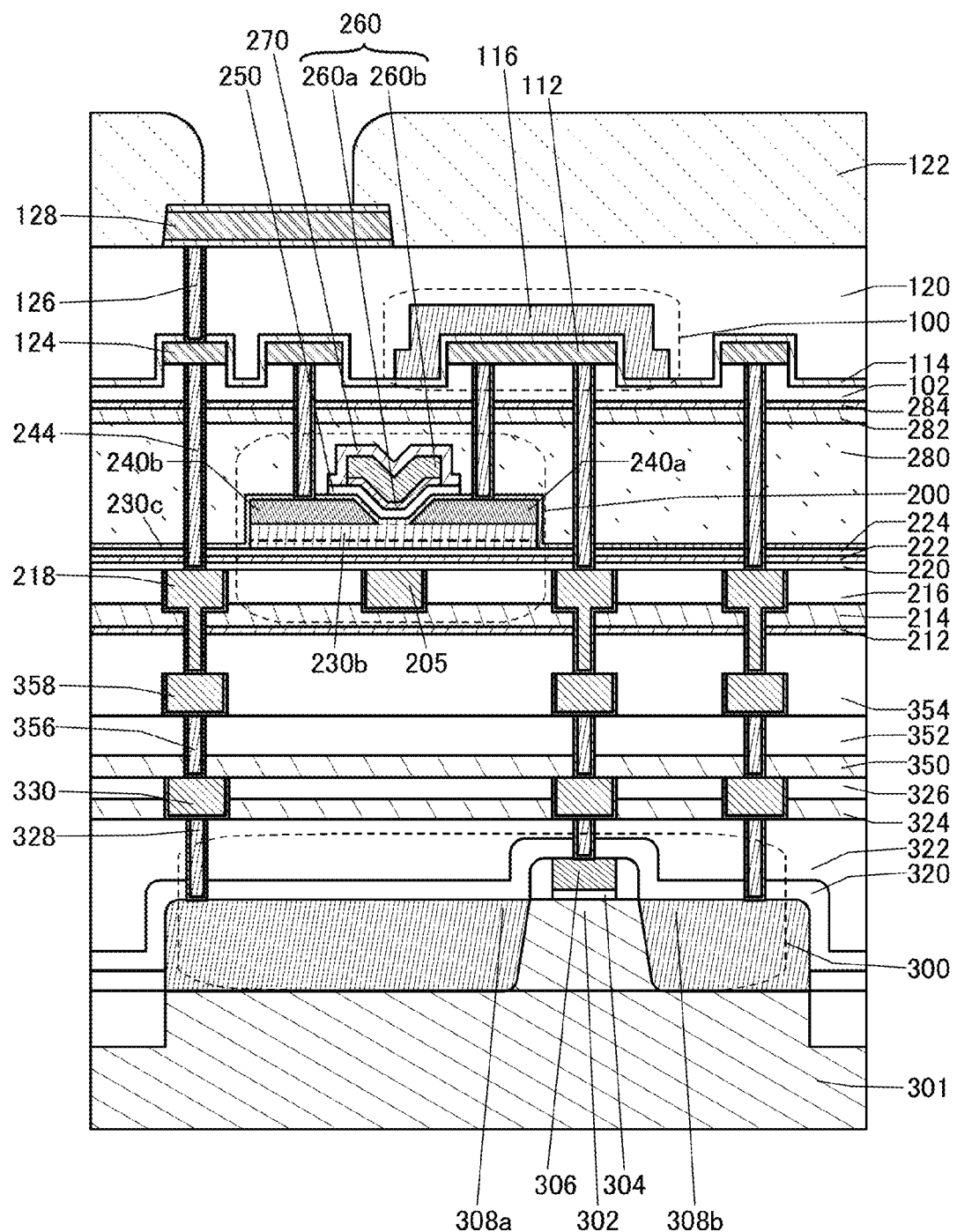
FIG. 2 illustrates a cross-sectional structure of a semiconductor device of one embodiment.

The transistor 300 shown in FIG. 1 is a planar transistor; however, the structure is not limited thereto, and an appropriate transistor may be used in accordance with a circuit configuration or a driving method. For example, the transistor 300 may be a fin-type transistor as shown in FIG. 2. In FIG. 2, the semiconductor region 302 (part of the substrate 301) in which a channel is formed has a protruding shape. Furthermore, the conductor 306 is provided to cover a side surface and a top surface of the semiconductor region 302 with the insulator 304 therebetween. Note that the conductor 306 may be formed using a material for adjusting the work function. An insulator serving as a mask for forming the projection may be provided in contact with a top surface of the projection. Although the case where the projection is formed by processing part of the semiconductor substrate is described here, a semiconductor film having a protruding shape may be formed by processing an SOI substrate.

In the case of using the circuit configuration shown in FIG. 7B, the transistor 300 may be omitted.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor 200 is formed.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, further preferably lower than 3. For example, the relative dielectric constant of the insulator 324 is preferably 0.7 times or less that of the insulator 326, further preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 1, an insulator 350, an insulator 352, and an insulator 354 are stacked sequentially. Furthermore, a conductor 356 and a conductor 358 are formed in the insulator 350, the insulator 352, and the insulator 354. The conductor 356 and the conductor 358 each function as a plug or a wiring. Note that the conductor 356 and the conductor 358 can be formed using a material similar to that used for forming the conductor 328 and the conductor 330.

Note that for example, the insulator 350 is preferably formed using an insulator having a barrier property against hydrogen, like the insulator 324. Furthermore, the conductor 356 and the conductor 358 preferably include a conductor having a barrier property against hydrogen. The conductor having a barrier property against hydrogen is preferably formed particularly in an opening portion of the insulator 350 having a barrier property against hydrogen. In such a structure, the transistor 300 and the transistor 200 can be separated by a barrier layer, so that diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 212 and an insulator 214 are stacked sequentially over the insulator 354. A material having a barrier property against oxygen or hydrogen is preferably used for one or both of the insulator 212 and the insulator 214.

The insulator 212 is preferably formed using, for example, a film having a barrier property that prevents hydrogen or impurities from diffusing from a region where the substrate 301 or the transistor 300 is formed or the like into a region where the transistor 200 is formed. Therefore, the insulator 212 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

A semiconductor device of one embodiment of the present invention may have a structure where the insulator 212 is not provided.

An insulator 216 is provided over the insulator 214. The insulator 216 can be formed using a material similar to that used for forming the insulator 320. For example, a silicon oxide film, a silicon oxynitride film, or the like can be used as the insulator 216.

A conductor 218, a conductor forming the transistor 200, and the like are embedded in the insulator 212, the insulator 214, and the insulator 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, the conductor 218 in a region in contact with the insulator 212 and the insulator 214 is preferably a conductor having a barrier property against oxygen, hydrogen, and water. In such a structure, the transistor 300 and the transistor 200 can be separated by a layer having a barrier property against oxygen, hydrogen, and water, so that diffusion of hydrogen from the transistor 300 into the transistor 200 can be prevented.

The transistor 200 is provided over the insulator 214, and an insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess oxygen region) is preferably formed. In particular, in the case of using an oxide semiconductor in the transistor 200, when an insulator including an excess oxygen region is provided as an interlayer film or the like in the vicinity of the transistor 200, oxygen vacancies in the transistor 200 are reduced, whereby the reliability can be improved.

As the insulator including the excess oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder.

Although the structure of the transistor 200 is described in detail with reference to FIGS. 8A to 8C, FIGS. 9A to 9C, FIGS. 10A to 10C, FIGS. 11A to 11C, and FIGS. 12A to 12C, the transistor 200 includes a conductor 240a, a conductor 240b, and a conductor 260. The conductor 240a functions as one of a source and a drain and the conductor 240b functions as the other of the source and the drain. The conductor 260 includes a conductor 260a and a conductor 260b and functions as a gate electrode. The insulator 280 includes an excess oxygen region; thus, oxygen is supplied to the transistor 200 (specifically, an oxide 230b), whereby oxygen vacancies can be reduced. However, if there is a structure which absorbs oxygen in an oxygen supply path, oxygen is not sufficiently supplied in some cases. Specifically, part of oxygen which is to be moved from the insulator 280 to the oxide 230b is absorbed in the conductor 240a, the conductor 240b, and the conductor 260 in some cases.

Thus, in the semiconductor device of one embodiment of the present invention, a film which suppresses or substantially suppresses permeation of oxygen is provided between the insulator 280 and the conductors 240a, 240b, and 260, whereby a sufficient amount of oxygen can be supplied from the insulator 280 to the oxide 230b. In other words, in the semiconductor device of one embodiment of the present invention, a film which controls or substantially controls permeation of oxygen is provided between the insulator 280 and the conductors 240a, 240b, and 260, whereby a sufficient amount of oxygen can be supplied from the insulator 280 to the oxide 230b. With such a structure, the electrical characteristics of the transistor 200 become stable, and a highly reliable semiconductor device can be obtained.

In FIG. 1, an insulator 270 is provided between the conductor 260 and the insulator 280. The insulator 270 preferably has a barrier property against oxygen. In addition, an oxide 230c is provided between the insulator 280 and the conductors 240a and 240b. The oxide 230c serves as a path for supplying oxygen to the oxide 230b, which is located under the oxide 230c; thus, it is preferable that the oxide 230c not suppress the permeation of oxygen completely, but substantially suppress the permeation of oxygen. In this specification, to "substantially suppress permeation of oxygen" means suppressing permeation of an excess of oxygen which exceeds a sufficient amount of oxygen to be supplied from the insulator 280 to the oxide 230b. The amount of oxygen which can be permeated through the oxide 230c can be estimated from, for example, the amount of oxygen released from the conductors 240a and 240b. Further, to "substantially control permeation of oxygen" has similar meaning.

For example, in the transistor of one embodiment of the present invention, the amount of oxygen released from the conductors 240a and 240b that is converted into oxygen atoms per unit area of the conductors 240a and 240b is lower than or equal to $3.4 \times 10^{15}$ atoms/cm$^2$, preferably lower than or equal to $6.8 \times 10^{14}$ atoms/cm$^2$ in TDS analysis in the range from 50° C. to 500° C., for example.

Figure 3:
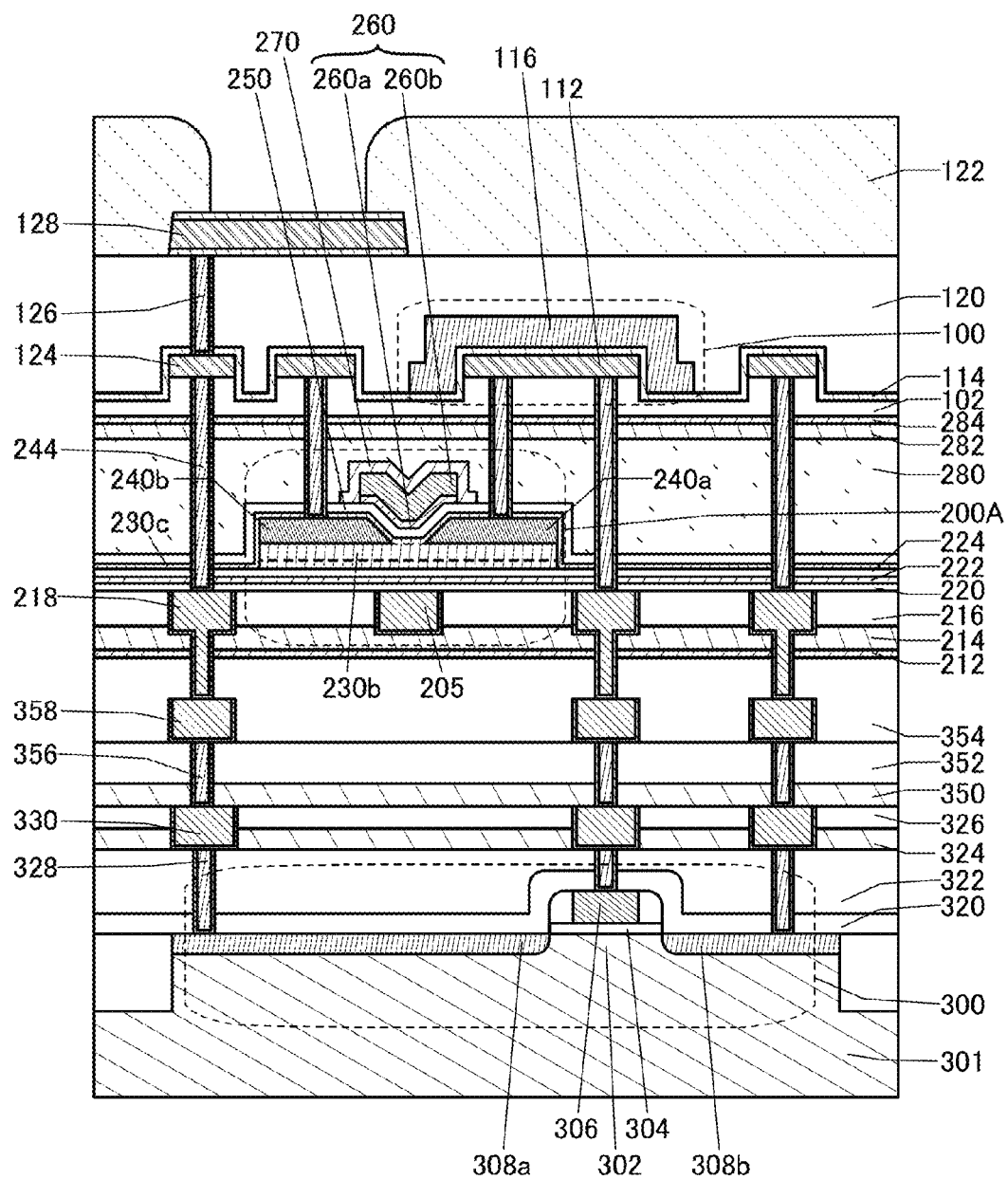
FIG. 3 illustrates a cross-sectional structure of a semiconductor device of one embodiment.
Figure 4:
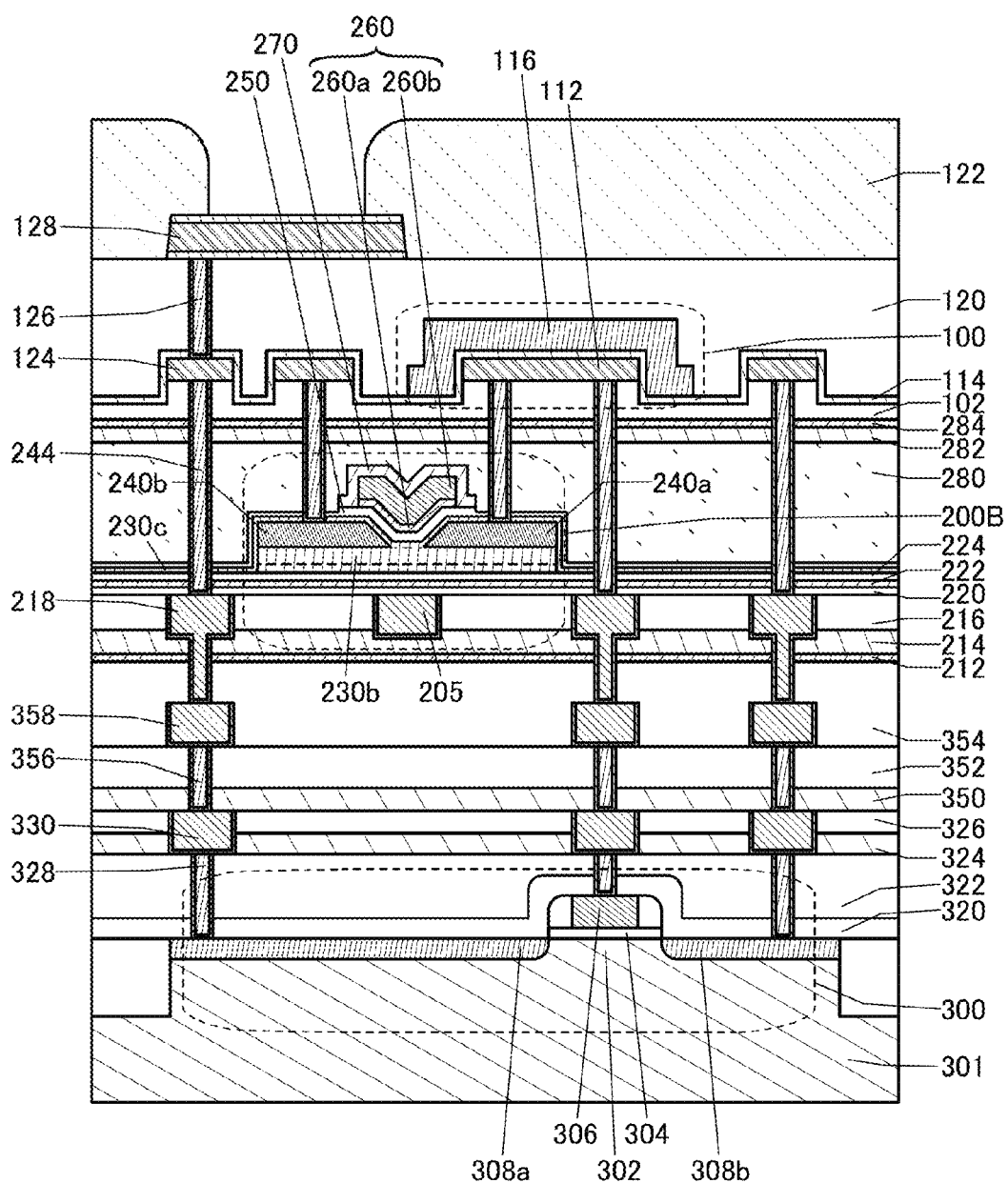
FIG. 4 illustrates a cross-sectional structure of a semiconductor device of one embodiment.

The film provided between the insulator 280 and the conductors 240a and 240b is not limited to a single layer. As illustrated in FIG. 3, a stack of the oxide 230c and an insulator 250 may cover the conductors 240a and 240b. The insulator 250 functions as a gate insulating layer in a transistor 200A. Alternatively, as illustrated in FIG. 4, the thickness of a region of the insulator 250 that covers the conductors 240a and 240b may be smaller than the thickness of a region of the insulator 250 that functions as a gate insulating layer of a transistor 200B. Alternatively, as illustrated in FIG. 5, the oxide 230c may be provided only in a region where a transistor 200C is provided.

An insulator 282, an insulator 284, and an insulator 102 are stacked sequentially over the insulator 280. A conductor 244 and the like are embedded in an insulator 220, an insulator 222, an insulator 224, the insulator 280, the insulator 282, the insulator 284, and the insulator 102. Note that the conductor 244 functions as a plug or a wiring that is electrically connected to the capacitor 100, the transistor 200, or the transistor 300. The conductor 244 can be formed using a material similar to that used for forming the conductor 328 and the conductor 330.

A material having a barrier property against oxygen or hydrogen is preferably used for the insulator 282 and the insulator 284. Thus, the insulator 282 can be formed using a material similar to that used for forming the insulator 214. The insulator 284 can be formed using a material similar to that used for forming the insulator 212.

As the insulator 282 and the insulator 284, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The insulator 102 is preferably formed using a material having a low dielectric constant, like the insulator 326. For example, the relative dielectric constant of the insulator 102 is preferably lower than 4, further preferably lower than 3. In the case where a material with a low dielectric constant is used as an interlayer film, the parasitic capacitance between wirings can be reduced.

Therefore, a structure can be obtained in which the transistor 200 and the insulator 280 including the excess oxygen region are positioned between a stacked-layer structure of the insulator 212 and the insulator 214 and a stacked-layer structure of the insulator 282, the insulator 284, and the insulator 102. The insulator 212, the insulator 214, the insulator 282, and the insulator 284 have a barrier property that prevents diffusion of oxygen or impurities such as hydrogen and water.

Oxygen released from the insulator 280 and the transistor 200 can be prevented from diffusing into a layer where the capacitor 100 is formed or a layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the excess oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

The capacitor 100 and a conductor 124 are provided over the insulator 284. The capacitor 100 is provided over the insulator 102 and includes a conductor 112, an insulator 114, and a conductor 116. Note that the conductor 124 functions as a plug or a wiring that is electrically connected to the capacitor 100, the transistor 200, or the transistor 300.

The conductor 112 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 112 is formed concurrently with another component such as a conductor, Cu (copper), Al (aluminum), or the like which is a low-resistance metal material may be used.

Note that the conductor 124 can be formed using a material similar to that used for forming the conductor 112 functioning as an electrode of the capacitor.

The insulator 114 is provided over the conductor 124 and the conductor 112. The insulator 114 can have a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

In the case where the insulator 114 has a stacked-layer structure, for example, the stacked-layer structure is preferably formed using a high dielectric constant (high-k) material such as aluminum oxide and a material with high dielectric strength such as silicon oxynitride. In the capacitor 100 having the structure, a sufficient capacitance can be provided because of a high dielectric constant (high-k) insulator, and the dielectric strength can be increased and the electrostatic breakdown can be prevented because of an insulator with high dielectric strength. FIG. 6 shows an example where the insulator 114 has a three-layer structure. For example, the insulator 114 has a structure where a silicon oxide film, an aluminum oxide film, and a silicon oxide film are stacked in this order.

The conductor 116 is provided over the conductor 112 with the insulator 114 therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

For example, as shown in FIG. 1, the insulator 114 is provided to cover a top surface and a side surface of the conductor 112. Furthermore, the conductor 116 is provided to cover the top surface and the side surface of the conductor 112 with the insulator 114 therebetween. In the structure, the conductor 116 faces the side surface of the conductor 112 with the insulator 114 therebetween. That is, a capacitance is formed also on the side surface of the conductor 112, so that a capacitance per projected area of a capacitor can be increased. Thus, the semiconductor device can be reduced in area, highly integrated, and miniaturized.

An insulator 120 is provided over the conductor 116 and the insulator 114. A conductor 126 is embedded in the insulator 120 and the insulator 114. Furthermore, a conductor 128 is provided over the insulator 120, and an insulator 122 is provided over the conductor 128 to expose part of the conductor 128. Note that the conductor 126 and the conductor 128 each function as a plug or a wiring that is electrically connected to the transistor 200 or the transistor 300. The conductor 126 can be formed using a material similar to that used for forming the conductor 328 and the conductor 330.

The insulator 120 and the insulator 122 can be formed using a material similar to that used for forming the insulator 320. The insulator 120 covering the capacitor 100 may function as a planarization film that covers a roughness thereunder. The insulator 122 may function as a protective film for protecting a surface of the semiconductor device.

The above is the description of the structure example.

With the use of the structure, a change in electrical characteristics can be prevented and reliability can be improved in a semiconductor device including a transistor including an oxide semiconductor. Furthermore, a transistor including an oxide semiconductor with high on-state current can be provided. Furthermore, a transistor including an oxide semiconductor with low off-state current can be provided. Furthermore, a semiconductor device with low power consumption can be provided.

At least part of this embodiment can be implemented in combination with any of the other embodiments described in this specification as appropriate.

Embodiment 2

In this embodiment, one mode of a semiconductor device is described with reference to FIGS. 8A to 8C, FIGS. 9A to 9C, FIGS. 10A to 10C, FIGS. 11A to 11C, and FIGS. 12A to 12C.

<Transistor Structure 1>

Figure 8A:
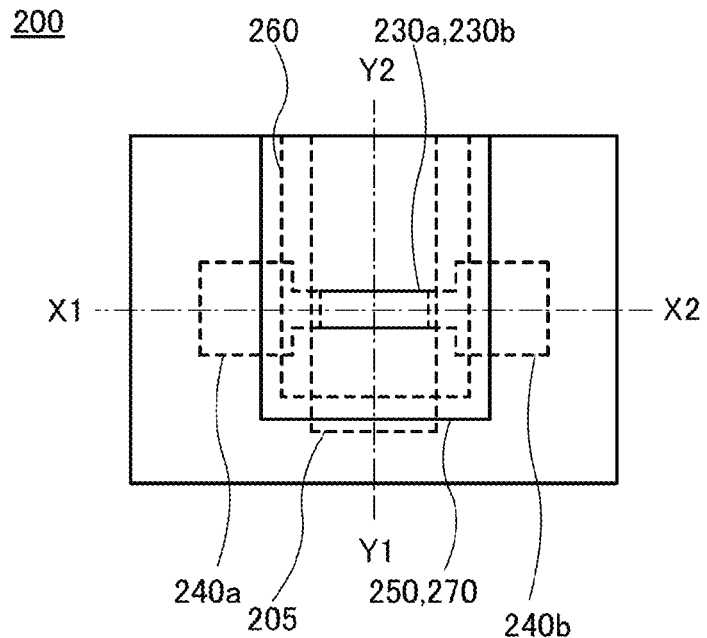
FIGS. 8A to 8C illustrate a top view and a cross-sectional structure of a transistor of one embodiment.
Figure 8B:
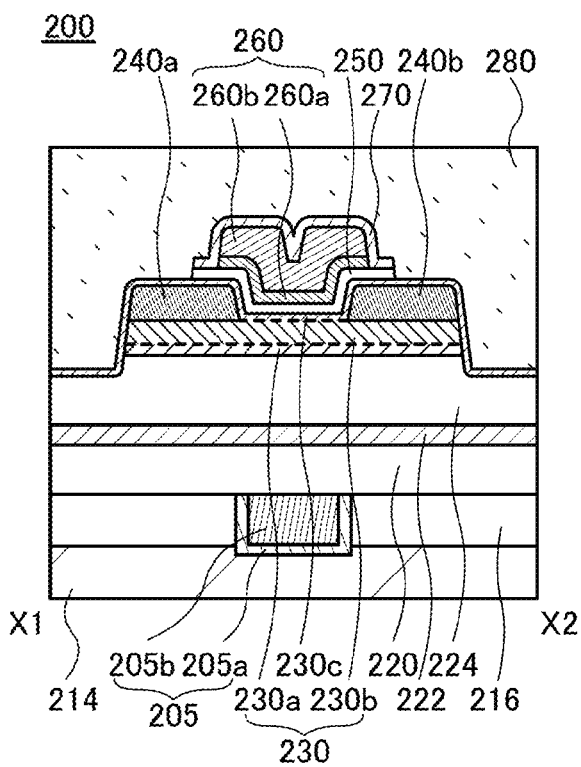
Figure 8C:
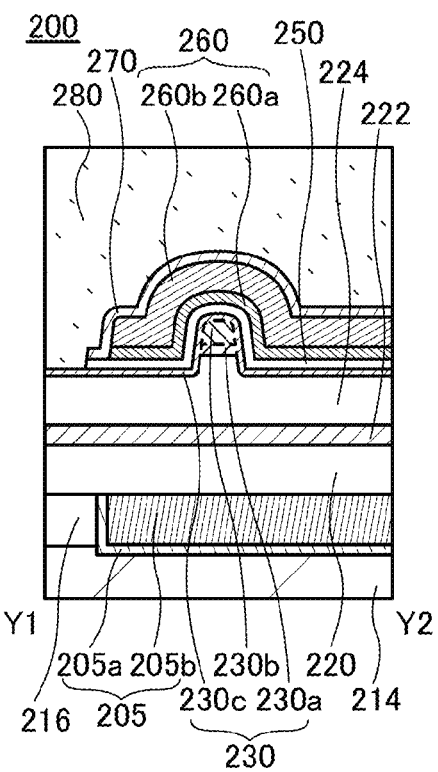

An example of a transistor of one embodiment of the present invention is described below. FIGS. 8A to 8C are a top view and cross-sectional views illustrating a transistor of one embodiment of the present invention. FIG. 8A is a top view. FIG. 8B is a cross-sectional view taken along dashed-dotted line X1-X2 in FIG. 8A. FIG. 8C is a cross-sectional view taken along dashed-dotted line Y1-Y2 in FIG. 8A. Note that for simplification of the drawing, some components in the top view in FIG. 8A are not illustrated.

The transistor 200 includes: a conductor 205 that functions as a gate electrode; the insulator 220 over the conductor 205; the insulator 222 over the insulator 220; the insulator 224 over the insulator 222; an oxide 230a over the insulator 224; the oxide 230b provided over the oxide 230a so that an end portion of the oxide 230b is substantially aligned with that of the oxide 230a; the conductor 240a that functions as one of a source and a drain and the conductor 240b that functions as the other of the source and the drain over the oxide 230b; the oxide 230c over the insulator 224, the oxide 230a, the oxide 230b, the conductor 240a, and the conductor 240b; the insulator 250 that functions as a gate insulating film over the oxide 230b; the conductor 260a that functions as a gate electrode over the insulator 250; the conductor 260b that functions as a gate electrode and is provided over the conductor 260a so that an end portion of the conductor 260b is substantially aligned with that of the conductor 260a; the insulator 270 over the insulator 250, the conductor 260a, and the conductor 260b; and the insulator 280 over the oxide 230c, the insulator 250, and the insulator 270.

In the transistor 200, an end portion of the insulator 250 is substantially aligned with that of the insulator 270; the conductors 240a and 240b are separated from the insulator 280 by the oxide 230c; the conductors 260a and 260b are separated from the insulator 280 by the insulator 270; the insulators 220, 224, 250, and 280 each include a region containing oxygen in excess of that in the stoichiometric composition; the oxide 230c has a function of substantially suppressing the permeation of oxygen; and the insulator 270 has a barrier property against oxygen.

In FIGS. 8A to 8C, the oxide 230c is provided between the insulator 280 and the conductors 240a and 240b. In addition, the insulator 270 is provided between the insulator 280 and the conductor 260. When the oxide 230c has a function of substantially suppressing the permeation of oxygen and the insulator 270 has a barrier property against oxygen, the amount of oxygen absorbed by the conductor 240a, the conductor 240b, and the conductor 260 can be reduced and a sufficient amount of oxygen can be supplied from the insulator 280 to the oxide 230b.

When the transistor 200 is turned on, a current flows (a channel is formed) mainly in the oxide 230b. Thus, the oxide 230b can be referred to as an oxide semiconductor. Although current sometimes flows through a region in the vicinity of the interface (a mixed region in some cases) between the oxide 230b and the oxides 230a and 230c, the oxides 230a and 230c function as insulators at the other region.

Note that in the semiconductor device illustrated in FIGS. 8A to 8C, components having the same functions as the components in the semiconductor device illustrated in FIG. 1 are denoted by the same reference numerals.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

A two-layer structure of a conductor 205a and a conductor 205b is shown in FIGS. 8A to 8C, but the structure of the conductor 205 is not limited thereto, and a single-layer structure or a stacked-layer structure of three or more layers may be used. For example, a conductor having a barrier property against hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide 230 while conductivity of a wiring is ensured.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 220 and 224 are not necessarily formed of the same material.

The insulator 222 preferably has a single-layer structure or a stacked-layer structure formed using, for example, one or more of insulators containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 220 and 224 are formed using silicon oxide and the insulator 222 is formed using hafnium oxide, the insulators 220 and 224 may be formed by a chemical vapor deposition method (including a CVD method and an atomic layer deposition (ALD) method) and the insulator 222 may be formed by a sputtering method. Note that using a sputtering method for the formation of the insulator 222 might easily crystallize the insulator 222 at low temperature to generate a large amount of fixed charges.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The insulator 222 is preferably formed using a material having a barrier property against oxygen and hydrogen. When such a material is used, release of oxygen from the oxide in the transistor 200 or entry of an impurity such as hydrogen from the outside can be prevented.

The oxide 230a, the oxide 230b, and the oxide 230c are preferably formed using the first semiconductor, and metal oxide such as In-M-Zn oxide (M is Al, Ga, Y, or Sn) is used as the first semiconductor. In—Ga oxide or In—Zn oxide may be used as the oxide 230. As the oxides 230a, 230b, and 230c, a CAAC-OS which is described later is preferably used. The CAAC-OS is an oxide semiconductor having small numbers of impurities and oxygen vacancies and low carrier density; thus, a transistor including a CAAC-OS has small variation in electrical characteristics and high reliability.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide according to the present invention are described with reference to FIGS. 13A to 13C. Note that the proportion of oxygen atoms is not shown in FIGS. 13A to 13C. The terms of the atomic ratio of indium, the element M, and zinc contained in the oxide are denoted by [In], [M], and [Zn], respectively.

Figure 13A:
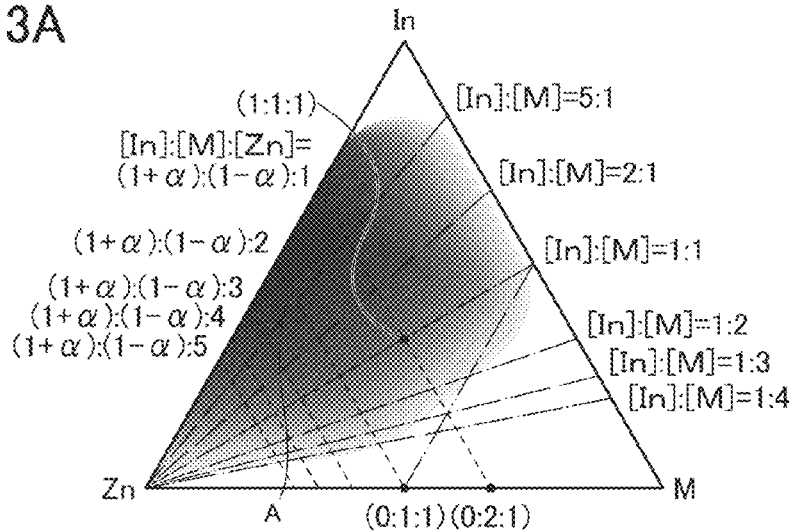
FIGS. 13A to 13C each illustrate an atomic ratio range of an oxide semiconductor of the present invention.
Figure 13B:
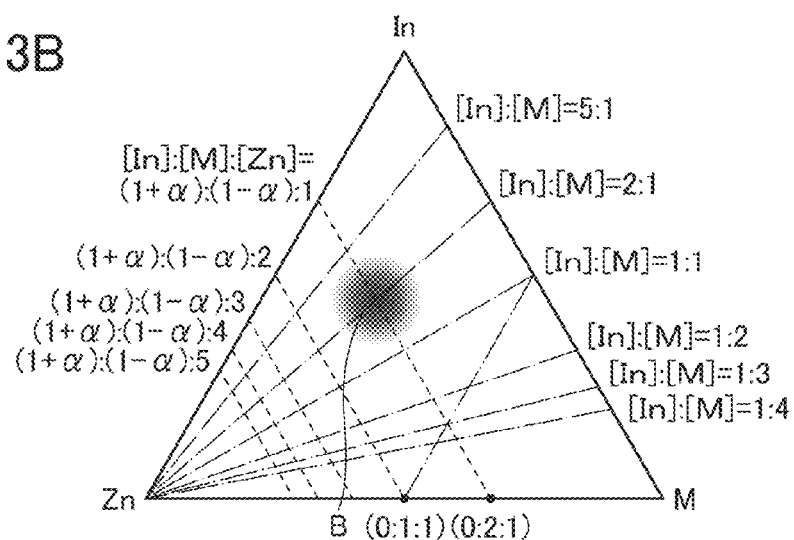
Figure 13C:
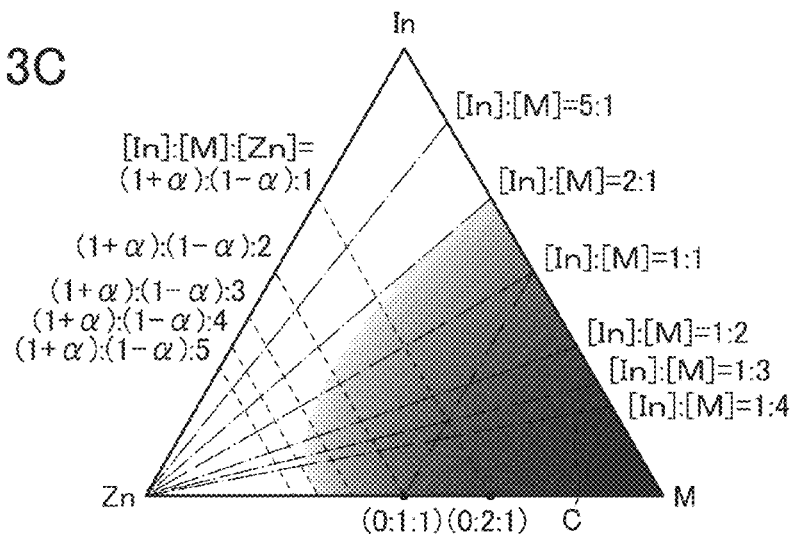

In FIGS. 13A to 13C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

An oxide having the atomic ratio of [In]:[M]:[Zn]=0:2:1 or a neighborhood thereof in FIGS. 13A to 13C tends to have a spinel crystal structure.

FIGS. 13A and 13B show examples of the preferred ranges of the atomic ratio of indium, the element M, and zinc contained in an oxide in one embodiment of the present invention.

Figure 14:
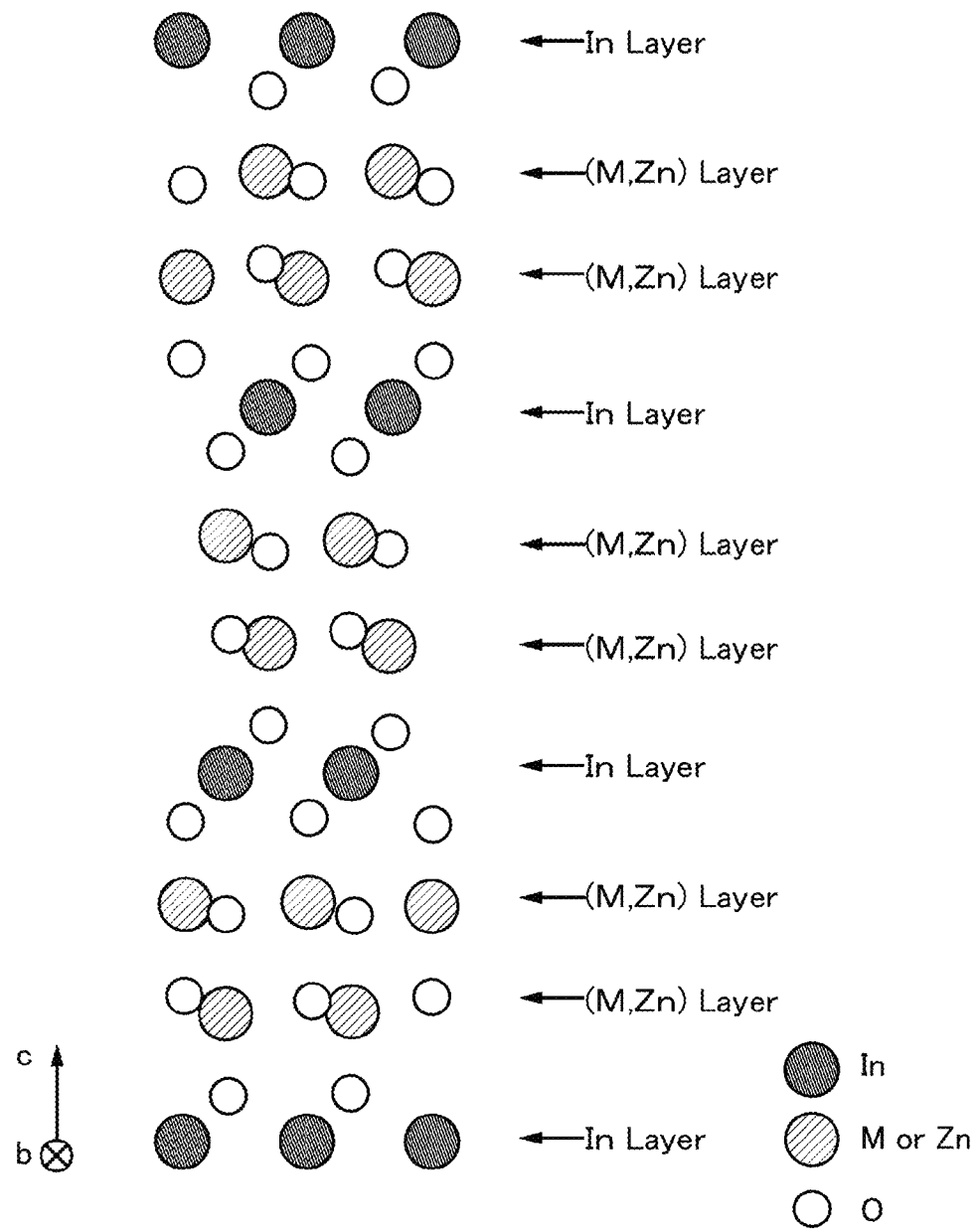
FIG. 14 illustrates a crystal structure of InMZnO$_4$.

FIG. 14 shows an example of the crystal structure of InMZnO$_4$ whose atomic ratio [In]:[M]:[Zn] is 1:1:1. The crystal structure shown in FIG. 14 is InMZnO$_4$ observed from a direction parallel to a b-axis. Note that a metal element in a layer that contains M, Zn, and oxygen (hereinafter, this layer is referred to as an "(M,Zn) layer") in FIG. 14 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 14.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of one In layer for every two (M,Zn) layers and a layered structure of one In layer for every three(M,Zn) layers.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 13C), insulation performance becomes better.

Accordingly, an oxide in one embodiment of the present invention preferably has an atomic ratio represented by a region A in FIG. 13A. With the atomic ratio, a layered structure with high carrier mobility and a few grain boundaries is easily obtained.

A region B in FIG. 13B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal of the oxide, which is measured by SIMS, is set lower than or equal to $1\times10^{18}$ atoms/cm$^3$, and preferably lower than or equal to $2\times10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; the nitrogen concentration of the oxide, which is measured by SIMS, is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide, which is measured by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel region in a transistor, the transistor can have stable electrical characteristics.

For example, in the case where an InGaZnO$_X$ (X>0) film is deposited by a thermal CVD method as the oxide, trimethylindium (In(CH$_3$)$_3$), trimethylgallium (Ga(CH$_3$)$_3$), and diethylzinc (Zn(C$_2$H$_5$)$_2$) are used. Without limitation to the above combination, triethylgallium (Ga(C$_2$H$_5$)$_3$) can be used instead of trimethylgallium and dimethylzinc (Zn(CH$_3$)$_2$) can be used instead of diethylzinc.

For example, in the case where an InGaZnO$_X$ (X>0) film is deposited by an ALD method as the oxide, an In(CH$_3$)$_3$ gas and an O$_3$ gas are sequentially introduced plural times to form an InO$_2$ layer, a Ga(CH$_3$)$_3$ gas and an O$_3$ gas are sequentially introduced plural times to form a GaO layer, and then a Zn(CH$_3$)$_2$ gas and an O$_3$ gas are sequentially introduced plural times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed using these gases. Note that although an H$_2$O gas which is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the oxide is deposited by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide is deposited by a sputtering method, the atomic ratio of In to M and Zn contained in the target may be 3:1:1, 3:1:2, 3:1:4, 1:1:0.5, 1:1:1, 1:1:2, 1:4:4, 5:1:7, 4:2:4.1, or a ratio close to these ratios, for example.

In the case where the oxide is deposited by a sputtering method, the oxide is deposited at a substrate temperature higher than or equal to 100° C. and lower than or equal to 750° C., higher than or equal to 110° C. and lower than or equal to 450° C., or higher than or equal to 130° C. and lower than or equal to 350° C., whereby the crystallinity of the oxide can be increased.

When the oxide is deposited by a sputtering method, an oxide having an atomic ratio different from the atomic ratio of the target may be deposited. Especially for zinc, the atomic ratio of zinc in the deposited film is smaller than the atomic ratio of the target in some cases. Specifically, the film has an atomic ratio of zinc of 40 atomic % to 90 atomic % of the atomic ratio of zinc in the target.

Next, the case where the oxide has a two-layer structure or a three-layer structure is described. A band diagram of a stacked structure of an oxide S1, an oxide S2, and an oxide S3 and insulators in contact with the stacked structure, a band diagram of a stacked structure of the oxide S1 and the oxide S2 and insulators in contact with the stacked structure, and a band diagram of a stacked structure of the oxide S2 and the oxide S3 and insulators in contact with the stacked structure are described with reference to FIGS. 15A to 15C.

Figure 15A:
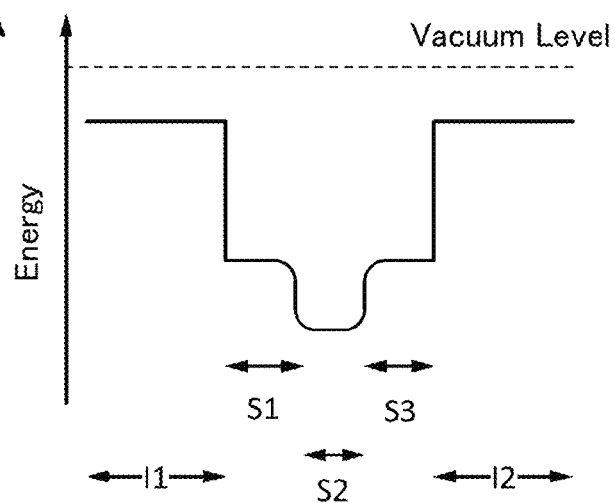
FIGS. 15A to 15C are each a band diagram of a stacked-layer structure of oxide semiconductors.
Figure 15B:
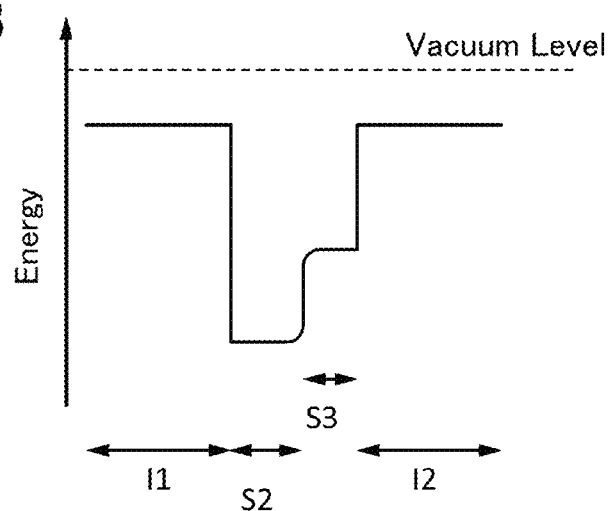
Figure 15C:
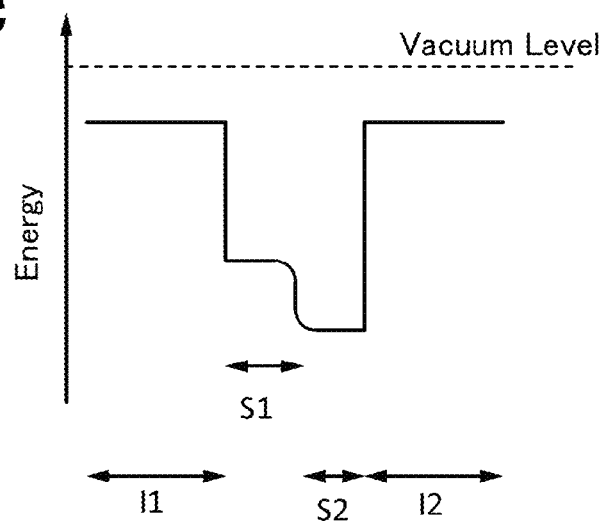

FIG. 15A is an example of a band diagram of a stacked structure including an insulator I1, the oxide S1, the oxide S2, the oxide S3, and an insulator I2 in a film thickness direction. FIG. 15B is an example of a band diagram of a stacked structure including the insulator I1, the oxide S2, the oxide S3, and the insulator I2 in a film thickness direction. FIG. 15C is an example of a band diagram of a stacked structure including the insulator I1, the oxide S1, the oxide S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As shown in FIGS. 15A to 15C, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 13C may be used as each of the oxides S1 and S3. Note that the region C in FIG. 13C represents the atomic ratio of [In]:[M]:[Zn]=0:1:0 or the vicinity thereof.

In the case where an oxide with the atomic ratio represented by the region A is used as the oxide S2, it is particularly preferable to use an oxide with [M]/[In] of greater than or equal to 1, preferably greater than or equal to 2 as each of the oxides S1 and S3. In addition, it is suitable to use an oxide with sufficiently high insulation performance and [M]/([Zn]+[In]) of greater than or equal to 1 as the oxide S3.

The insulator 250 can have a single-layer structure or a stacked-layer structure using, for example, one or more of insulators containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen and hydrogen, can be used. The insulator 250 formed of such a material each serve as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide 230 and the conductor 260 in the semiconductor device illustrated in FIGS. 8A to 8C. The oxide 230c may have a barrier property.

For example, an insulating film containing excess oxygen is provided in contact with the oxide 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

One of the conductor 240a and the conductor 240b functions as a source electrode, and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single-layer structure is shown in FIGS. 8A to 8C, a two-layer structure or a stacked-layer structure of three or more layers may be used.

For example, a stack of a titanium film and an aluminum film may be used as each of the conductors 240a and 240b. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Conductors 260a and 260b functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure where aluminum is used as the conductor 260a and a titanium film is used as the conductor 260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductors 260a and 260b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure of the above light-transmitting conductive material and the above metal.

The insulator 270 may be provided to cover the conductor 260. In the case where the insulator 280 is formed using an oxide material from which oxygen is released, the insulator 270 is formed using a substance having a barrier property against oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide 230 efficiently.

In the structure, a region of the oxide 230b where a channel is formed can be electrically surrounded by an electric field of the conductor 260 that functions as a gate electrode. Because of the s-channel structure, the channel might be formed in the entire oxide 230b, which faces the conductor 260 with the insulator 250 interposed therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

<Transistor Structure 2>

Figure 9A:
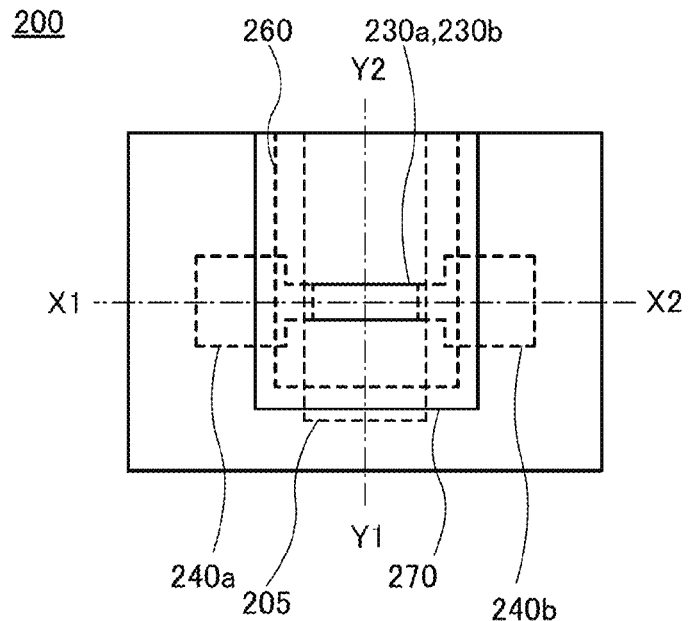
FIGS. 9A to 9C illustrate a top view and a cross-sectional structure of a transistor of one embodiment.
Figure 9B:
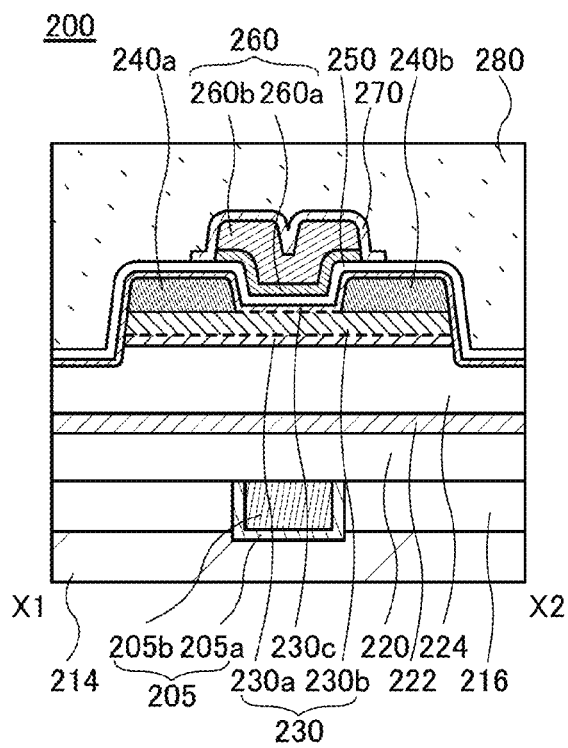

FIG. 9A illustrates a top surface of the transistor 200A in FIG. 3. For simplification of the figure, some films are omitted in FIG. 9A. FIG. 9B is a cross-sectional view taken along dashed-dotted line X1-X2 in FIG. 9A, and FIG. 9C is a cross-sectional view taken along dashed-dotted line Y1-Y2 in FIG. 9A.

Figure 9C:
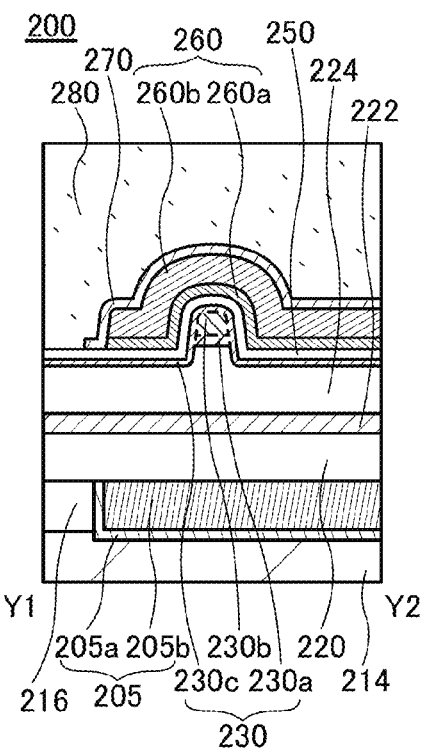

Note that in the transistor 200A in FIGS. 9A to 9C, components having the same function as the components in the transistor 200 in FIGS. 8A to 8C are denoted by the same reference numerals.

The structure illustrated in FIGS. 9A to 9C is different from that of the transistor 200 in FIGS. 8A to 8C in that a stack of the oxide 230c and the insulator 250 covers the conductors 240a and 240b.

<Transistor Structure 3>

Figure 10A:
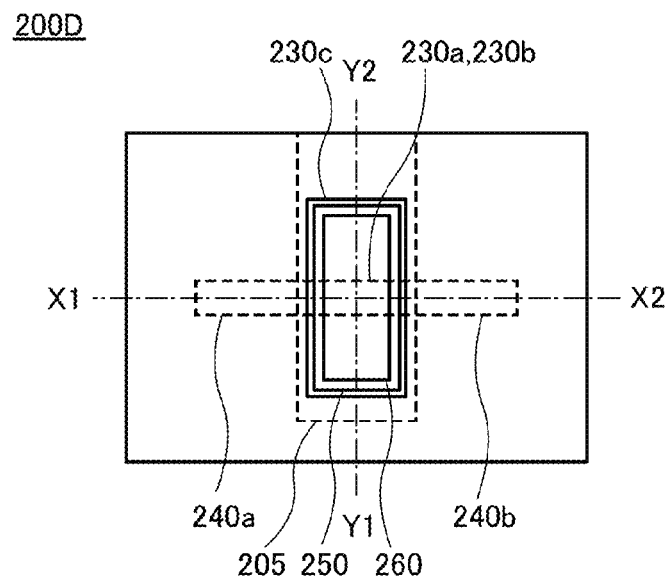
FIGS. 10A to 10C illustrate a top view and a cross-sectional structure of a transistor of one embodiment.
Figure 10B:
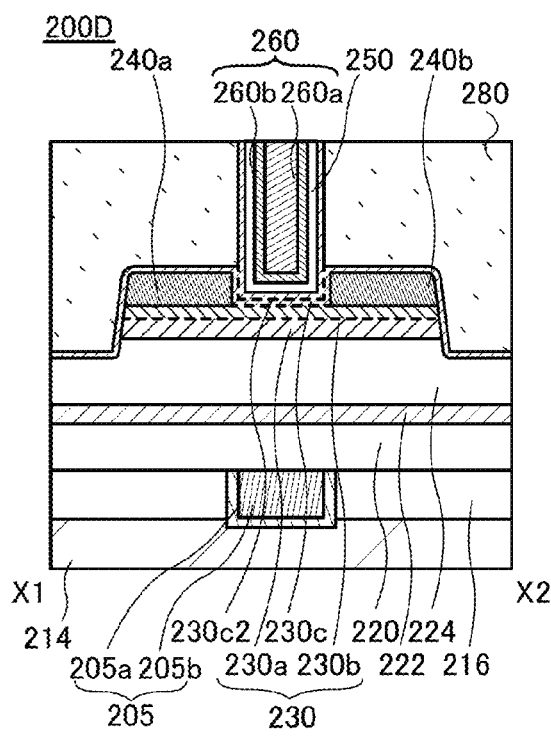
Figure 10C:
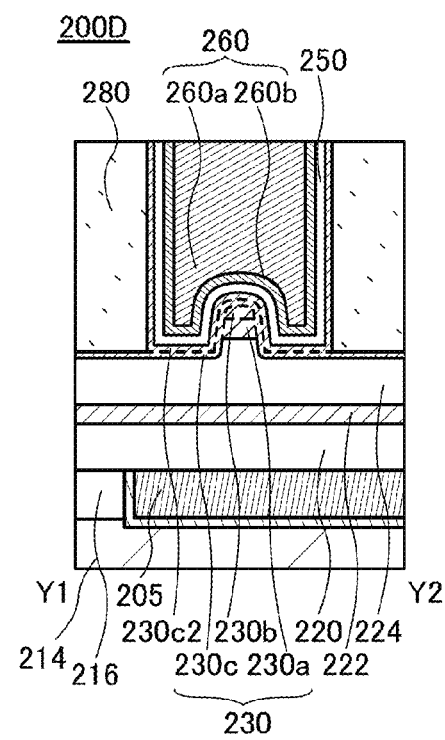

FIGS. 10A to 10C illustrate an example of a structure that can be used for the transistor 200 in FIG. 1 and the like. FIG.

10A illustrates a top surface of a transistor 200D. For simplification of the figure, some films are omitted in FIG. 10A. FIG. 10B is a cross-sectional view taken along dashed-dotted line X1-X2 in FIG. 10A, and FIG. 10C is a cross-sectional view taken along dashed-dotted line Y1-Y2 in FIG. 10A.

Note that in the transistor 200D in FIGS. 10A to 10C, components having the same function as the components in the transistor 200 in FIGS. 8A to 8C are denoted by the same reference numerals.

In the structure illustrated in FIGS. 10A to 10C, an oxide 230c2, the insulator 250, and the conductor 260 are formed in an opening portion formed in the insulator 280. Furthermore, three end portions of each of the conductor 240a and the conductor 240b are aligned with part of an end portion of the oxide 230b. Therefore, the conductor 240a and the conductor 240b can be formed concurrently with the oxide 230b. This leads to a reduction in the number of masks and steps and improvement in yield and productivity.

Since the transistor 200D illustrated in FIGS. 10A to 10C has a structure in which the conductors 240a and 240b hardly overlap with the conductor 260, the parasitic capacitance added to the conductor 260 can be reduced. Thus, the transistor 200D with a high operation frequency can be provided.

The oxide 230c2 can be formed using a material and a formation method similar to those used for forming the oxide 230c.

<Transistor Structure 4>

Figure 11A:
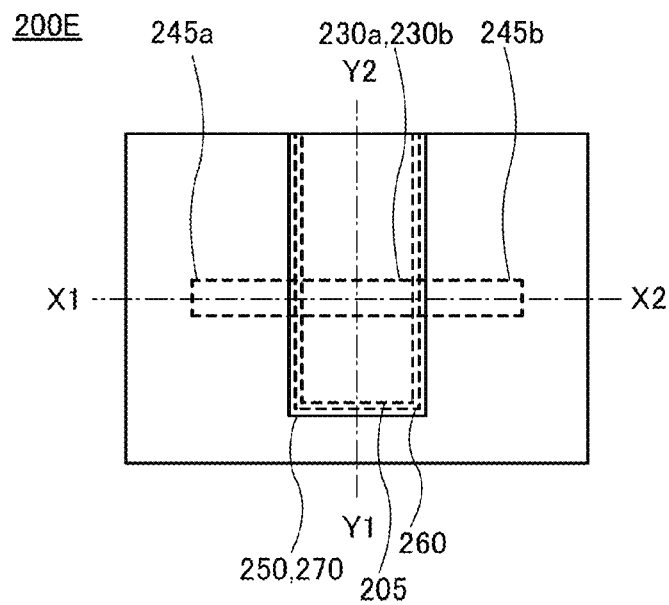
FIGS. 11A to 11C illustrate a top view and a cross-sectional structure of a transistor of one embodiment.
Figure 11B:
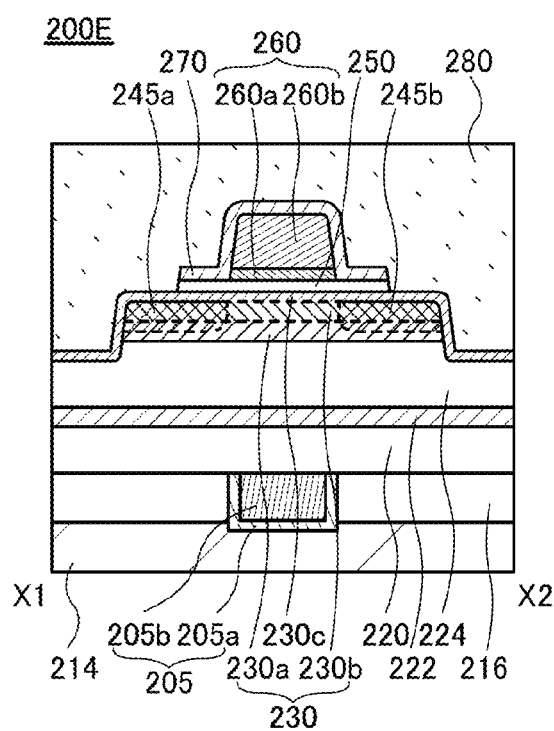
Figure 11C:
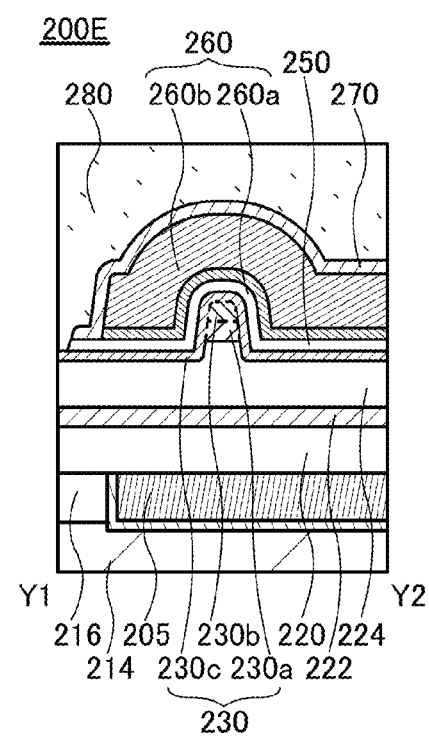

FIGS. 11A to 11C illustrate an example of a structure that can be used for the transistor 200 in FIG. 1 and the like. FIG. 11A illustrates a top surface of a transistor 200E. For simplification of the figure, some films are omitted in FIG. 11A. FIG. 11B is a cross-sectional view taken along dashed-dotted line X1-X2 in FIG. 11A, and FIG. 11C is a cross-sectional view taken along dashed-dotted line Y1-Y2 in FIG. 11A.

Note that in the transistor 200E in FIGS. 11A to 11C, components having the same function as the components in the transistor 200 in FIGS. 8A to 8C are denoted by the same reference numerals.

In the structure illustrated in FIGS. 11A to 11C, a region 245a functioning as one of a source region and a drain region and a region 245b functioning as the other of the source region and the drain region are provided in the oxides 230a and 230b. The regions can be formed in such a manner that an impurity such as boron, phosphorus, or argon is added to the oxide 230 using the conductor 260 as a mask. Alternatively, the regions can be formed in such a manner that the insulator 280 is formed of an insulator containing hydrogen, such as a silicon nitride film and hydrogen is diffused to part of the oxide 230. This leads to a reduction in the number of masks and steps and improvement in yield and productivity.

<Transistor Structure 5>

FIGS. 12A to 12C illustrate an example of a structure that can be used for the transistor 200 in FIG. 1 and the like. FIG. 12A illustrates a top surface of a transistor 200F. For simplification of the figure, some films are omitted in FIG. 12A. FIG. 12B is a cross-sectional view taken along dashed-dotted line X1-X2 in FIG. 12A, and FIG. 12C is a cross-sectional view taken along dashed-dotted line Y1-Y2 in FIG. 12A.

Note that in the transistor 200F in FIGS. 12A to 12C, components having the same function as the components in the transistor 200 in FIGS. 8A to 8C are denoted by the same reference numerals.

The structure illustrated in FIGS. 12A to 12C is different from that of the transistor 200 in FIGS. 8A to 8C in that the conductor 205 is not provided.

The structures, the methods, and the like described in this embodiment can be combined as appropriate with any of the structures, the methods, and the like described in the other embodiments and examples.

Embodiment 3

In this embodiment, an example of a method for manufacturing the transistor described in the above Structure Example is described below with reference to FIGS. 16A to 16C, FIGS. 17A and 17B, FIGS. 18A and 18B, and FIGS. 19A and 19B.

<Method for Manufacturing Transistor>

A method for manufacturing the transistor 200 in FIGS. 8A to 8C is described below. Specifically, steps of manufacturing a region including the transistor 200 in FIG. 1 from a state where the insulator 212 is formed to a state where the insulator 282 is formed are described. Cross-sectional views illustrated in FIGS. 16A to 16C, FIGS. 17A and 17B, FIGS. 18A and 18B, and FIGS. 19A and 19B correspond to cross-sectional views taken along dashed-dotted lines X1-X2 and Y1-Y2 in FIG. 8A.

First, the insulator 214 is formed over the insulator 212.

The insulator 212 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulator 212 is preferably formed using silicon nitride containing oxygen and hydrogen (SiNOH) because the amount of hydrogen released by heating can be increased. The insulator 212 can also be formed using silicon oxide with high step coverage that is formed by reacting tetraethyl orthosilicate (TEOS), silane, or the like with oxygen, nitrous oxide, or the like.

The insulator 212 can be formed by, for example, a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

The insulator 212 can be aluminum oxide formed by an ALD method as an example of a film having a barrier property against hydrogen, for example. A dense insulator including reduced defects such as cracks or pinholes or having a uniform thickness can be formed by an ALD method.

The insulator 214 can be formed using a material and a formation method similar to those used for forming the insulator 212. The insulator 214 can be aluminum oxide formed by a sputtering method as an example of a film having a barrier property against hydrogen, for example.

Figure 16A:
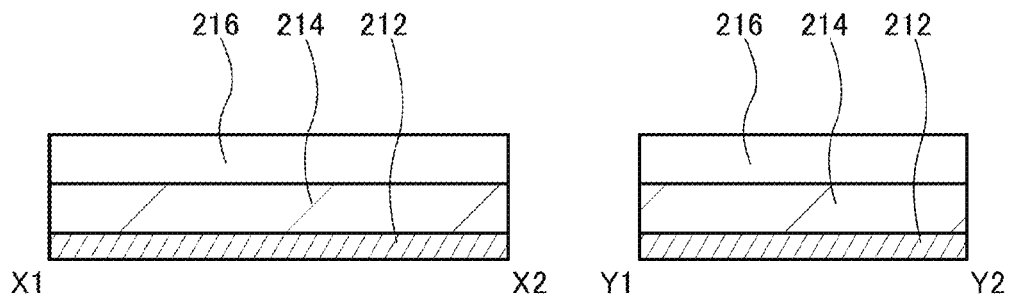
FIGS. 16A to 16C illustrate an example of a method for manufacturing a semiconductor device of one embodiment.

Then, the insulator 216 is formed over the insulator 214. The insulator 216 can be formed using a material and a method similar to those used for forming the insulator 212 (FIG. 16A).

Then, a depression is formed in the stacked-layer structure of the insulator 214 and the insulator 216. Note that the depression is preferably deep enough to form an opening portion in at least the insulator formed using a hardly-etched material. Here, the hardly-etched material denotes a material that is hardly etched, e.g., metal oxide. Typical examples of a metal oxide film formed of a hardly-etched material include a film containing any of aluminum oxide, zirconium oxide, and hafnium oxide; a silicate film containing any of these materials ($HfSi_xO_y$, $ZrSi_xO_y$, or the like), and a film of a composite oxide containing two or more of these materials ($Hf_{1-x}Al_xO_y$, $Zr_{1-x}Al_xO_y$, or the like).

Figure 16B:
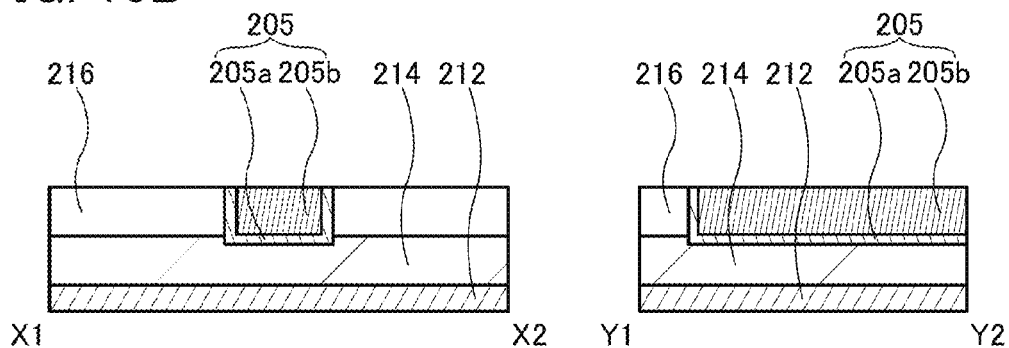

Then, a film to be the conductor 205 is formed to fill the opening portion. Then, planarization treatment using a CMP method is performed on the film to be the conductor 205 to expose a top surface of the insulator 216, whereby the conductor 205 is formed (FIG. 16B).

Figure 16C:
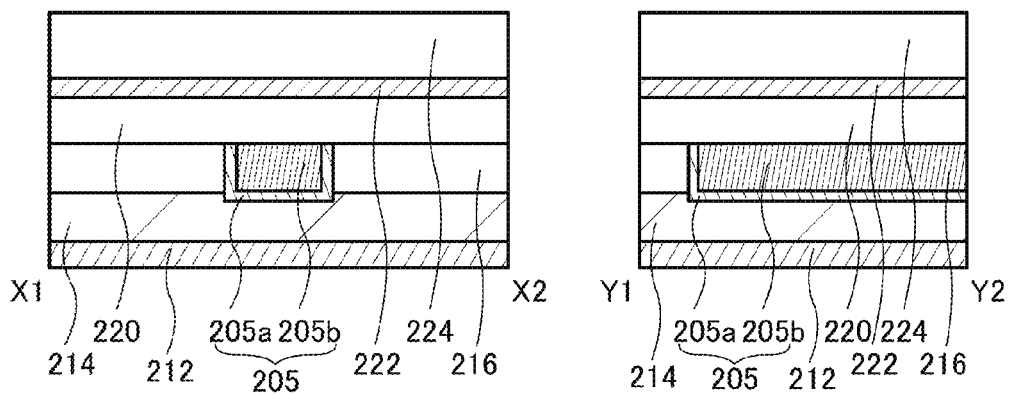

Then, the insulator 220, the insulator 222, and the insulator 224 are formed (FIG. 16C).

The insulator 220, the insulator 222, and the insulator 224 can be formed using a material and a method similar to those used for forming the insulator 212. It is particularly preferable to use a high-k material such as hafnium oxide as the insulator 222.

Then, an oxide to be the oxide 230a and an oxide to be the oxide 230b are sequentially formed. The oxides are preferably formed successively without exposure to the air.

After the oxide to be the oxide 230b is formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. The heat treatment may be performed directly after the formation of the oxide to be the oxide 230b or may be performed after the oxide to be the oxide 230b is processed into an island shape. By the heat treatment, oxygen can be supplied from the insulator formed under the oxide 230a to the oxide 230a and the oxide 230b, so that oxygen vacancies in the oxide can be reduced.

Then, a conductive film to be the conductor 240a and the conductor 240b is formed over the oxide to be the oxide 230b. Then, a resist mask is formed by a method similar to that described above, and unnecessary portions of the conductive film are removed by etching. After that, unnecessary portions of the oxides are removed by etching using the conductive film as a mask. Then, the resist mask is removed. Thus, a stacked-layer structure of the oxide 230a having an island shape, the oxide 230b having an island shape, and the conductive film having an island shape can be formed.

Figure 17A:
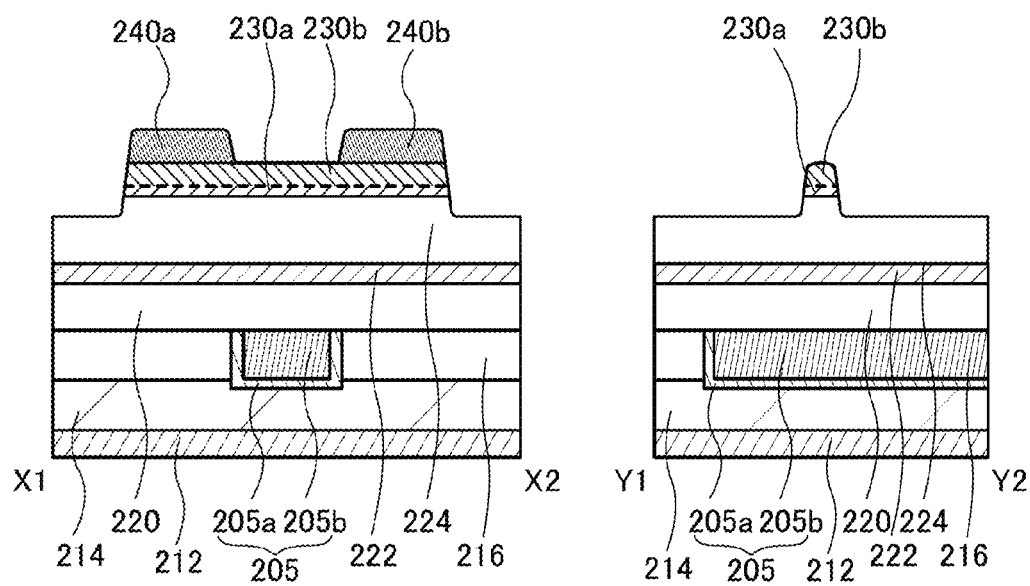
FIGS. 17A and 17B illustrate an example of a method for manufacturing a semiconductor device of one embodiment.

Then, a resist mask is formed over the conductive film having an island shape by a method similar to that described above, and unnecessary portions of the conductive film are removed by etching. Then, the resist mask is removed. Thus, the conductor 240a and the conductor 240b are formed (FIG. 17A).

Then, an oxide to be the oxide 230c, an insulator to be the insulator 250, and a conductive film to be the conductor 260 are sequentially formed. For example, the conductive film to be the conductor 260 can be formed by stacking tantalum nitride formed by an ALD method and tungsten with high conductivity. The conductive film is preferably formed using a deposition gas that does not include chlorine. By the formation of tantalum nitride that has a barrier property against oxygen, hydrogen, and water and is in contact with the insulator 250, the tungsten can be prevented from being oxidized by excess oxygen diffused into the insulator 250.

Note that the conductive film to be the conductor 260 may be formed by a sputtering method. Specifically, the conductive film can be formed by stacking titanium nitride and tungsten with high conductivity which are formed by a sputtering method. In the case where the conductive film is formed by a sputtering method, the insulator 250 may be damaged. Thus, a protective film for the insulator 250 is preferably provided over the insulator 250.

The insulator 250 functions as a gate insulating film; thus, the thickness of the protective film is preferably small so that electrical characteristics of the transistor 200 do not change because of the presence of the protective film. Specifically, the thickness of the protective film is preferably greater than or equal to 0.1 nm and less than or equal to 5 nm, further preferably greater than or equal to 0.1 nm and less than or equal to 1 nm.

For the protective film, silicon nitride is preferably used. In the case where a silicon nitride film is formed by a PECVD method, the deposition rate is preferably reduced because the protective film with a small thickness can be stably formed. For example, the silicon nitride film can be formed at a deposition rate of approximately 6 nm/min when silane at a flow rate of 0.5 sccm, nitrogen at a flow rate of 50 sccm, and ammonia at a flow rate of 10 sccm are used as the deposition gas; the deposition pressure is 1 Pa; the deposition power is 400 W; and the substrate temperature is 300° C. The deposition rate of the silicon nitride is preferably higher than or equal to 0.1 nm/min and lower than or equal to 2 nm/min.

Figure 17B:
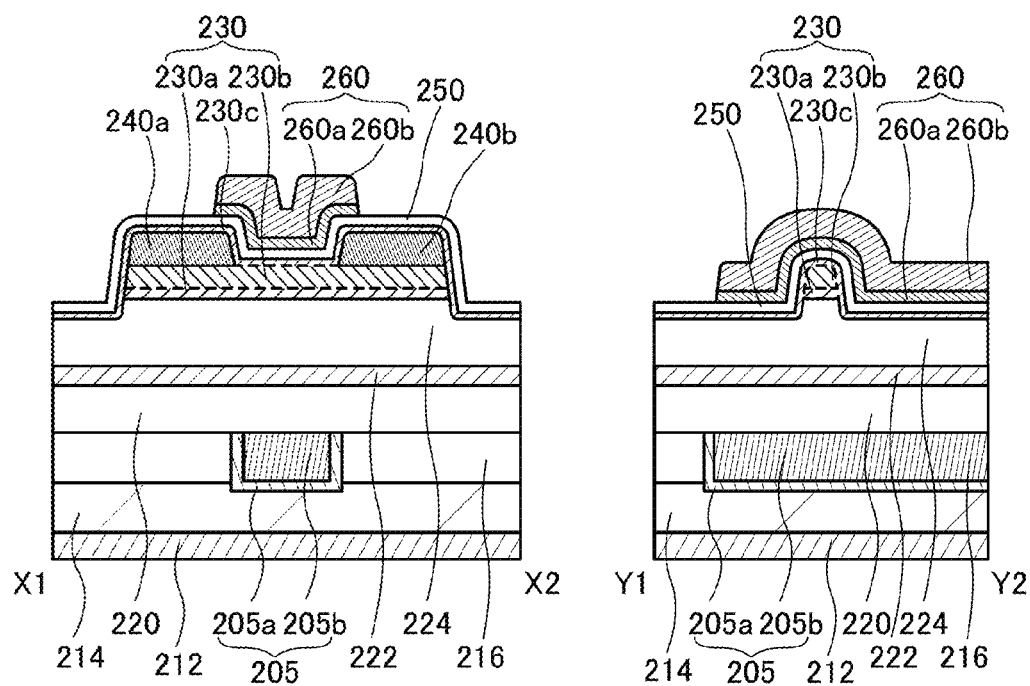

Then, a resist mask is formed over the conductive film by a method similar to that described above, and unnecessary portions of the conductive film are removed by etching, whereby the conductor 260 is formed (FIG. 17B).

Figure 18A:
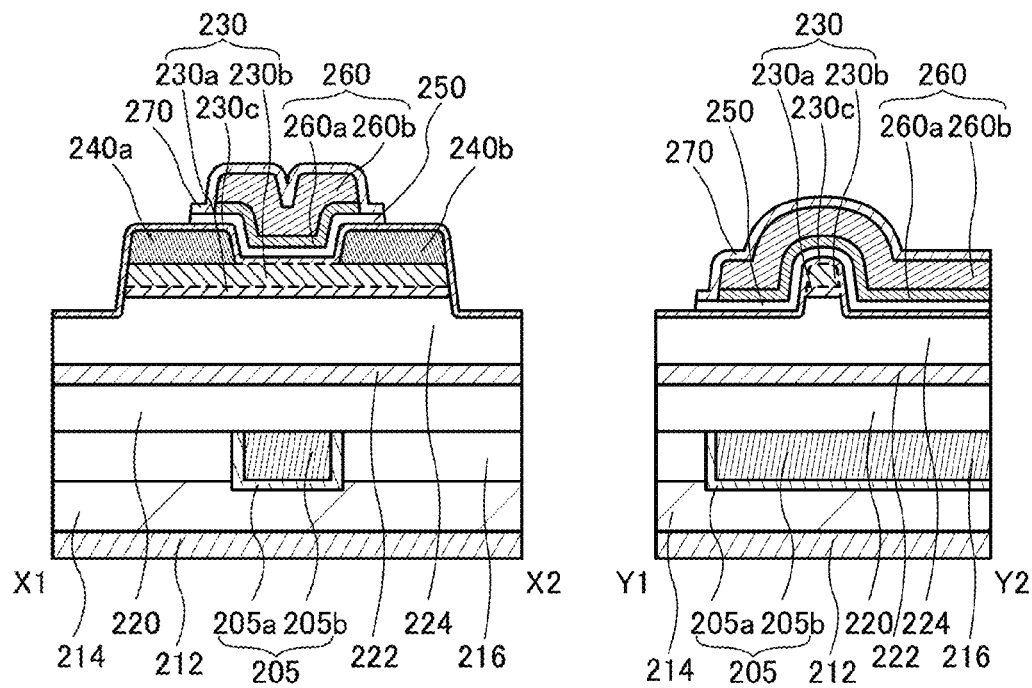
FIGS. 18A and 18B illustrate an example of a method for manufacturing a semiconductor device of one embodiment.
Figure 19A:
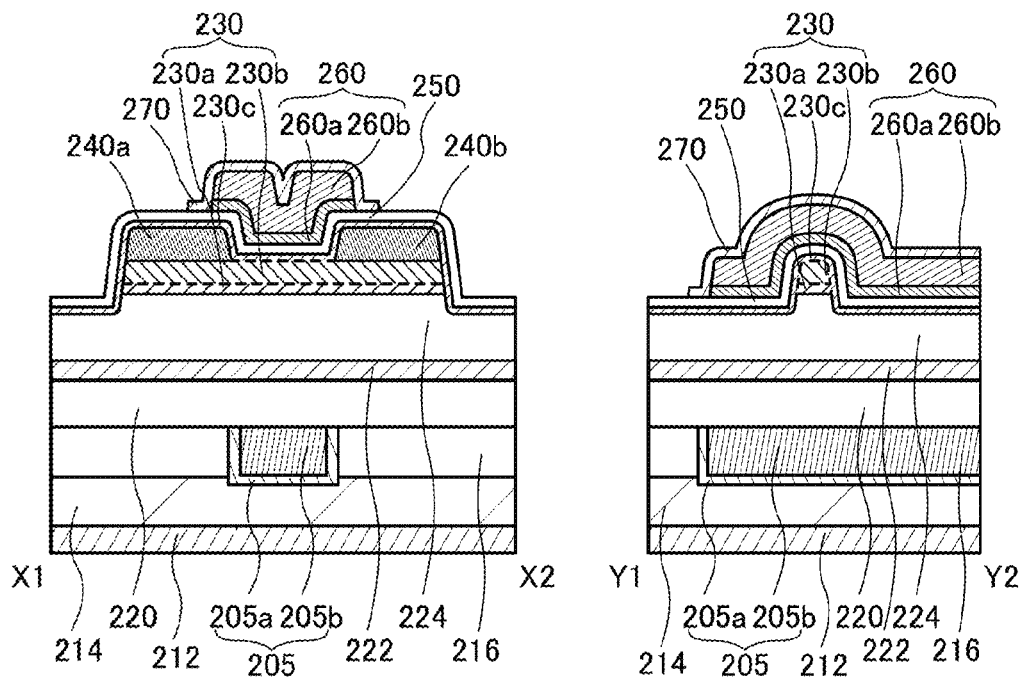
FIGS. 19A and 19B illustrate an example of a method for manufacturing a semiconductor device of one embodiment.

Then, an insulator to be the insulator 270 is formed over the insulator to be the insulator 250 and the conductor 260. The insulator to be the insulator 270 is preferably formed using a material having a barrier property against hydrogen and oxygen. Then, a resist mask is formed over the insulator by a method similar to that described above, and unnecessary portions of the insulator to be the insulator 270 and the insulator to be the insulator 250 are removed by etching. After that, the resist mask is removed. Thus, the transistor 200 is formed (FIG. 18A). In the etching, it is possible that only the insulator to be the insulator 270 is etched, and the insulator to be the insulator 250 is left without being etched (FIG. 19A).

Then, the insulator 280 is formed. The insulator 280 preferably includes an oxide containing oxygen in excess of that in the stoichiometric composition. After an insulator to be the insulator 280 is formed, planarization treatment using a CMP method or the like may be performed to improve the planarity of a top surface of the insulator.

To make the insulator 280 contain excess oxygen, the insulator 280 may be formed in an oxygen atmosphere, for example. Alternatively, a region containing excess oxygen may be formed by introducing oxygen into the insulator 280 that has been formed. Both the methods may be combined.

Figure 18B:
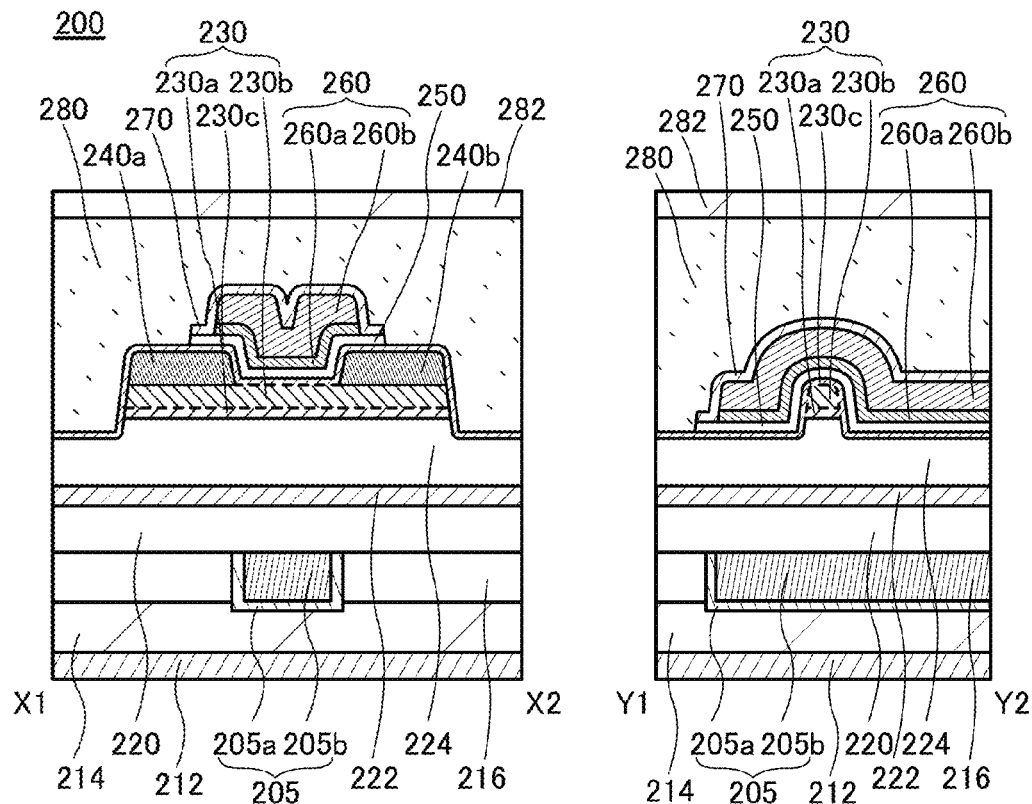
Figure 19B:
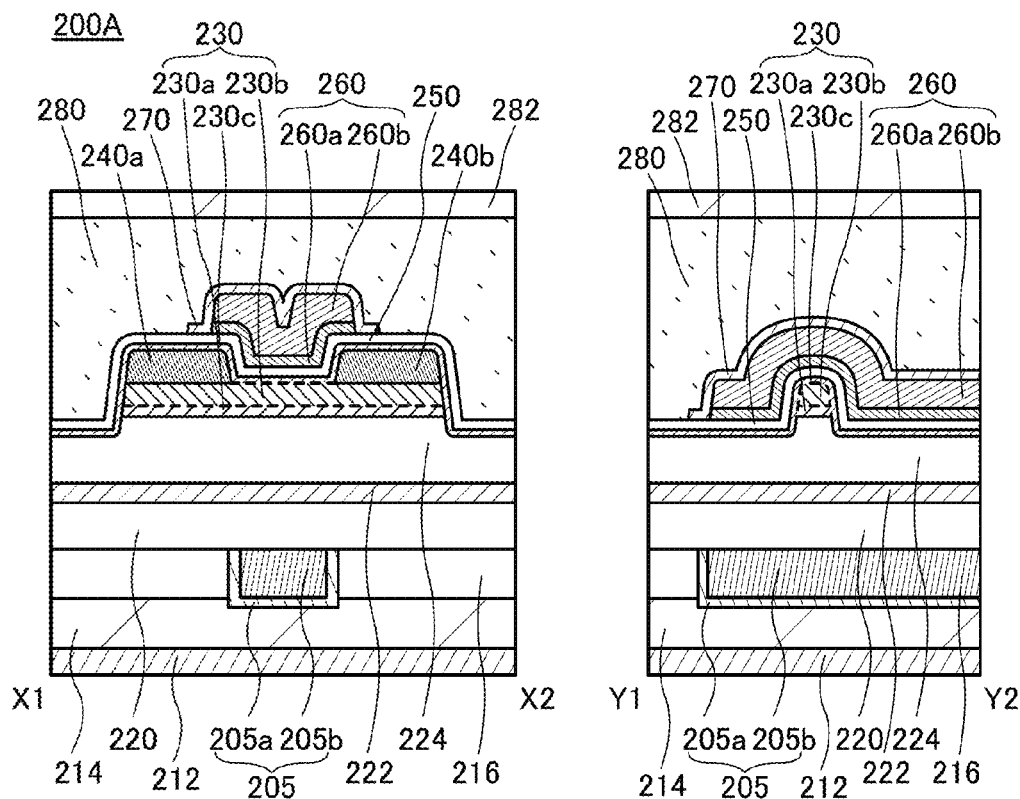

To perform the oxygen introduction treatment, an oxide, e.g., the insulator 282, is stacked over the insulator 280 using a sputtering apparatus (FIG. 18B). When the insulator to be the insulator 250 is not etched, a structure as illustrated in FIG. 19B is formed. By forming the insulator 282 in an oxygen gas atmosphere using a sputtering apparatus, oxygen can be introduced into the insulator 280 while the insulator 282 is formed.

Then, oxygen (at least including any of oxygen radicals, oxygen atoms, and oxygen ions) may be introduced into the insulator 280 through the insulator 282, so that a region containing excess oxygen is formed. Oxygen can be introduced by an ion implantation method, an ion doping method, a plasma immersion ion implantation method, plasma treatment, or the like. By performing the oxygen introduction treatment through the insulator 282, an excess oxygen region can be formed in a state where the insulator 280 is protected.

A gas containing oxygen can be used for the oxygen introducing treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

Then, heat treatment is performed. The heat treatment may be performed at a temperature higher than or equal to 250° C. and lower than or equal to 650° C., preferably higher than or equal to 300° C. and lower than or equal to 500° C., further preferably higher than or equal to 350° C. and lower than or equal to 400° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. For the heat treatment, lamp heating can be performed with the use of an RTA apparatus.

By the heat treatment, excess oxygen introduced into the insulator 280 is diffused into the insulator 280. The insulator 280 is enclosed with the insulator 212 and the insulator 282 having a barrier property against oxygen. Since the insulator 270 having a barrier property against oxygen is provided between the insulator 280 and the conductor 260, excess oxygen introduced into the insulator 280 can be prevented from being absorbed in the conductor 260. In addition, since the oxide 230c which substantially suppresses the permeation of oxygen is provided between the conductors 240a and 240b and the insulator 280, excess oxygen introduced into the insulator 280 can be substantially prevented from being absorbed in the conductors 240a and 240b. Excess oxygen introduced into the insulator 280 is prevented from being released to the outside and is substantially prevented from being absorbed in the conductor in a supply path, and thus is supplied to the oxide 230 efficiently.

Moreover, by the heat treatment, hydrogen in the insulator 280 is moved to the insulator 282. Hydrogen moved to the insulator 282 reacts with oxygen in the insulator 282, whereby water is produced in some cases. The formed water is released from a top surface of the insulator 282. Thus, hydrogen and water as impurities in the insulator 280 can be reduced. Note that in the case where insulator 282 is formed using aluminum oxide, the insulator 282 may function as a catalyst.

Oxygen supplied to the oxide 230 compensates oxygen vacancies in the oxide 230. Thus, the oxide where a channel is formed in the transistor 200 can be an oxide semiconductor with a low density of defect states and stable characteristics. That is, a change in electrical characteristics of the transistor 200 can be prevented and the reliability can be improved.

The oxygen introduction treatment and the heat treatment may be repeated a plurality of times until the excess oxygen region is formed sufficiently or as long as the barrier property of the insulator 282 is not lost by damage caused by the oxygen introduction treatment.

Through the above process, the transistor 200 or the transistor 200A in which excess oxygen is sufficiently introduced into the oxide semiconductor, in particular, into the oxide 230b can be manufactured.

In a semiconductor device including a transistor using an oxide semiconductor and manufactured through the above steps, a change in electrical characteristics can be inhibited and reliability can be improved. A transistor including an oxide semiconductor with high on-state current can be provided. A transistor including an oxide semiconductor with low off-state current can be provided. A semiconductor device with low power consumption can be provided.

At least part of this embodiment can be implemented in combination with any of the other embodiments described in this specification as appropriate.

Embodiment 4

In this embodiment, an oxide semiconductor included in the transistor described in the above embodiment will be described below with reference to FIGS. 20A to 20E, FIGS. 21A to 21E, FIGS. 22A to 22D, FIGS. 23A and 23B, and FIG. 24.

[Structure of Oxide Semiconductor]

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

Figure 20A:
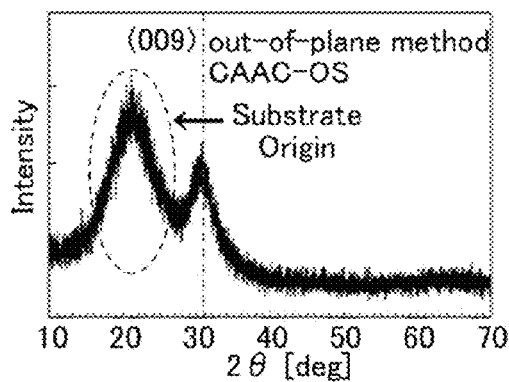
FIGS. 20A to 20E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 20A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 20B:
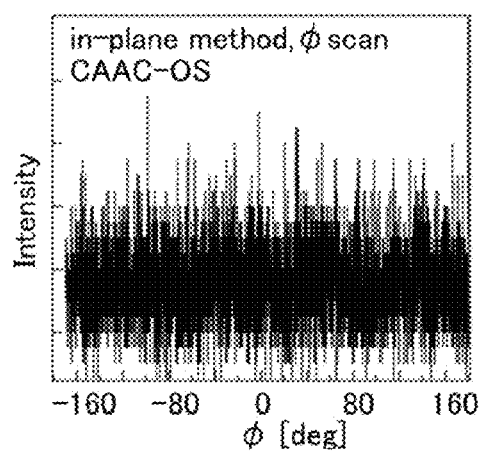
Figure 20C:
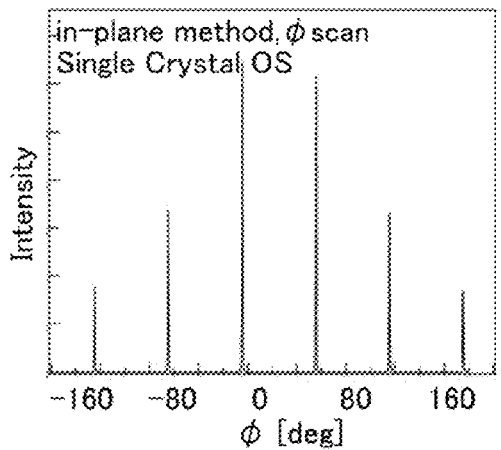
Figure 20D:
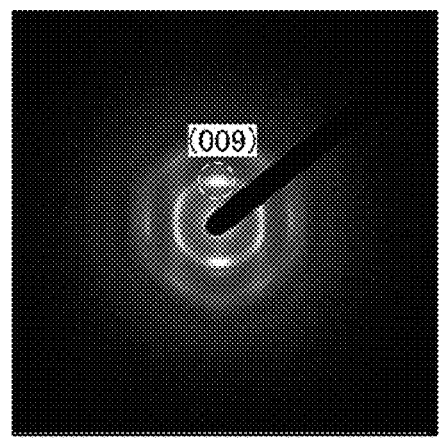

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (ϕ scan) is performed with 2θ fixed at around 56° and with the sample rotated using a normal vector to the sample surface as an axis (ϕ axis), as shown in FIG. 20B, a peak is not clearly observed. In contrast, in the case where single crystal InGaZnO$_4$ is subjected to ϕ scan with 2θ fixed at around 56°, as shown in FIG. 20C, six peaks which are derived from crystal planes equivalent to the (110) plane are observed. Accordingly, the structural analysis using XRD shows that the directions of a-axes and b-axes are irregularly oriented in the CAAC-OS.

Figure 20E:
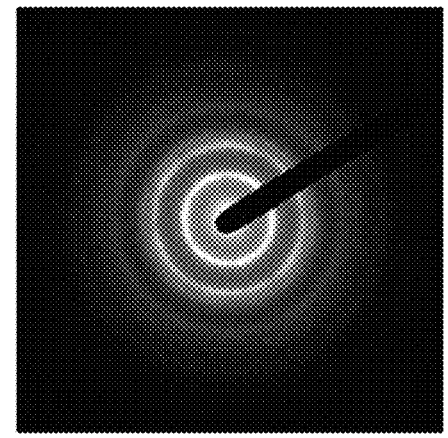

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 20D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 20E shows a diffraction pattern obtained in such a manner that an electron beam with a probe diameter of 300 nm is incident on the same sample in a direction perpendicular to the sample surface. As shown in FIG. 20E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 20E is considered to be derived from the (010) plane, the (100) plane, and the like of the InGaZnO$_4$ crystal. The second ring in FIG. 20E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 21A:
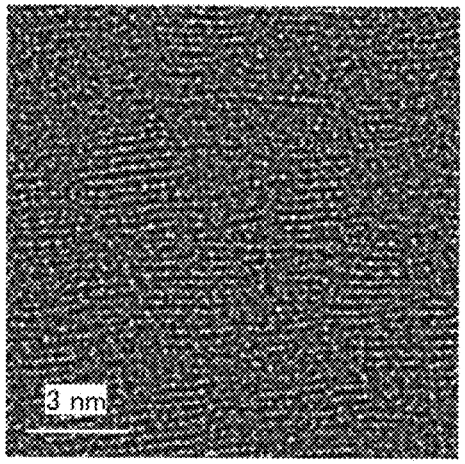
FIGS. 21A to 21E show a cross-sectional TEM image and plan-view TEM images of a CAAC-OS and images obtained through analysis thereof.

FIG. 21A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 21A shows pellets in which metal atoms are arranged in a layered manner. FIG. 21A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 21B:
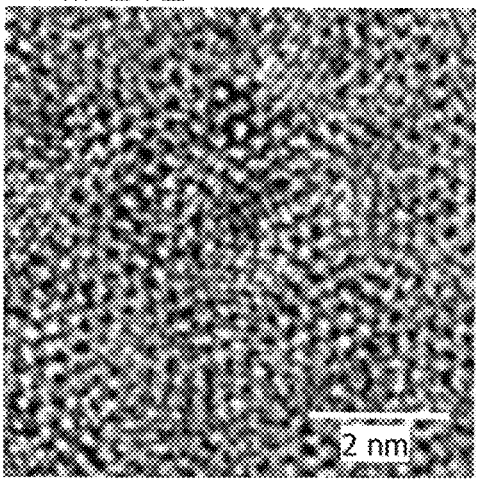
Figure 21C:
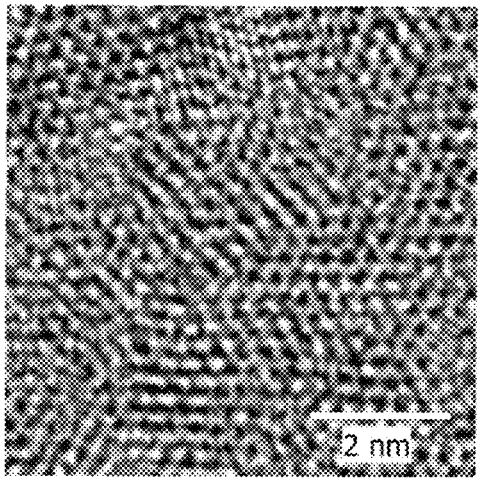
Figure 21D:
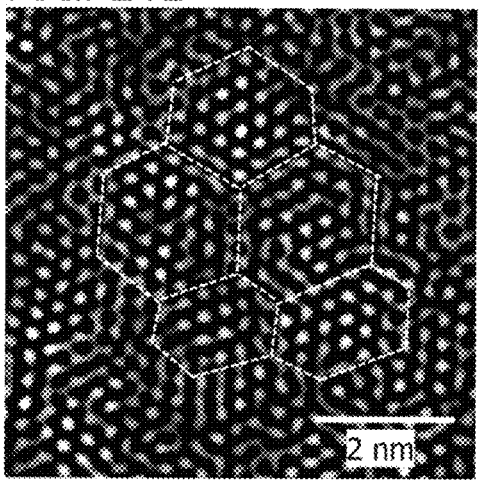
Figure 21E:
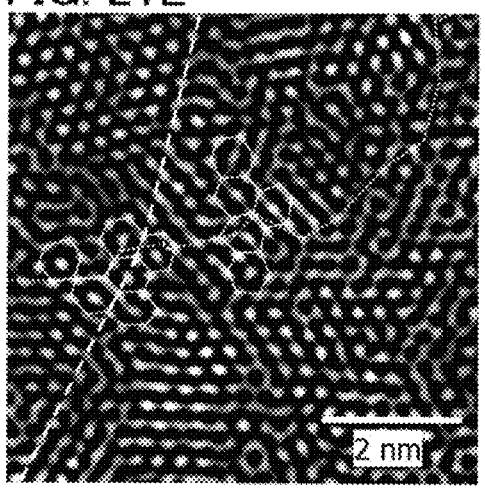

FIGS. 21B and 21C show Cs-corrected high-resolution TEM images of a plane of the CAAC-OS observed from a direction substantially perpendicular to the sample surface. FIGS. 21D and 21E are images obtained through image processing of FIGS. 21B and 21C. The method of image processing is as follows. The image in FIG. 21B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 21D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 21E, a dotted line indicates a portion where the direction of a lattice arrangement is changed between a region with a regular lattice arrangement and another region with a regular lattice arrangement, and a dashed line indicates the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 22A:
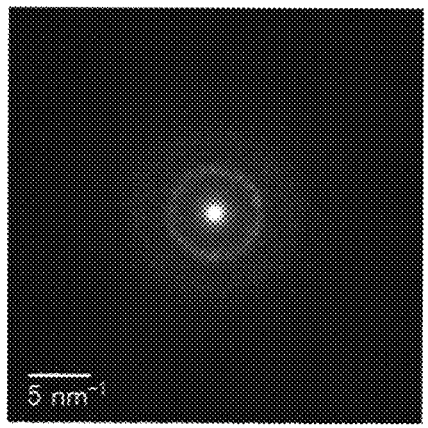
FIGS. 22A to 22D show electron diffraction patterns and a cross-sectional TEM image of an nc-OS.
Figure 22B:
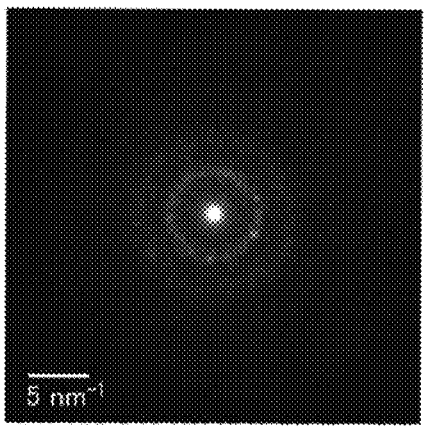

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 22A is observed. FIG. 22B shows a diffraction pattern obtained when an electron beam with a probe diameter of 1 nm is incident on the same sample. As shown in FIG. 22B, a plurality of spots are observed in a ring-like region. In other words, ordering in an nc-OS is not observed with an electron beam with a probe diameter of 50 nm but is observed with an electron beam with a probe diameter of 1 nm.

Figure 22C:
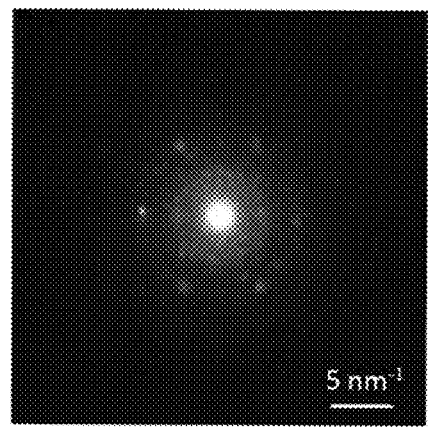

Furthermore, an electron diffraction pattern in which spots are arranged in an approximately regular hexagonal shape is observed in some cases as shown in FIG. 22C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 22D:
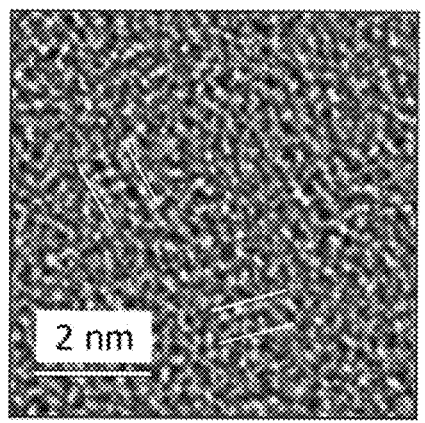

FIG. 22D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 22D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 23A:
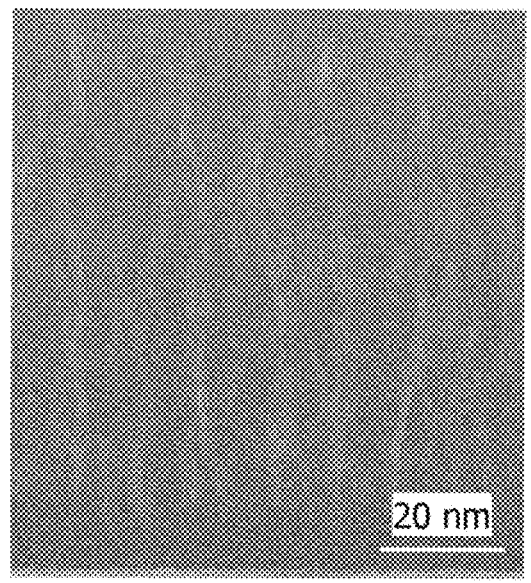
FIGS. 23A and 23B show cross-sectional TEM images of an a-like OS.
Figure 23B:
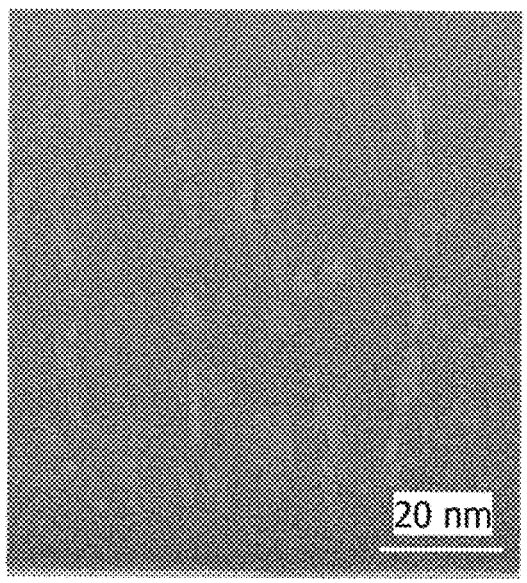

FIGS. 23A and 23B are high-resolution cross-sectional TEM images of an a-like OS. FIG. 23A is the high-resolution cross-sectional TEM image of the a-like OS at the start of the electron irradiation. FIG. 23B is the high-resolution cross-sectional TEM image of a-like OS after the electron ($e^-$) irradiation at $4.3 \times 10^8$ $e^-/nm^2$. FIGS. 23A and 23B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 24:
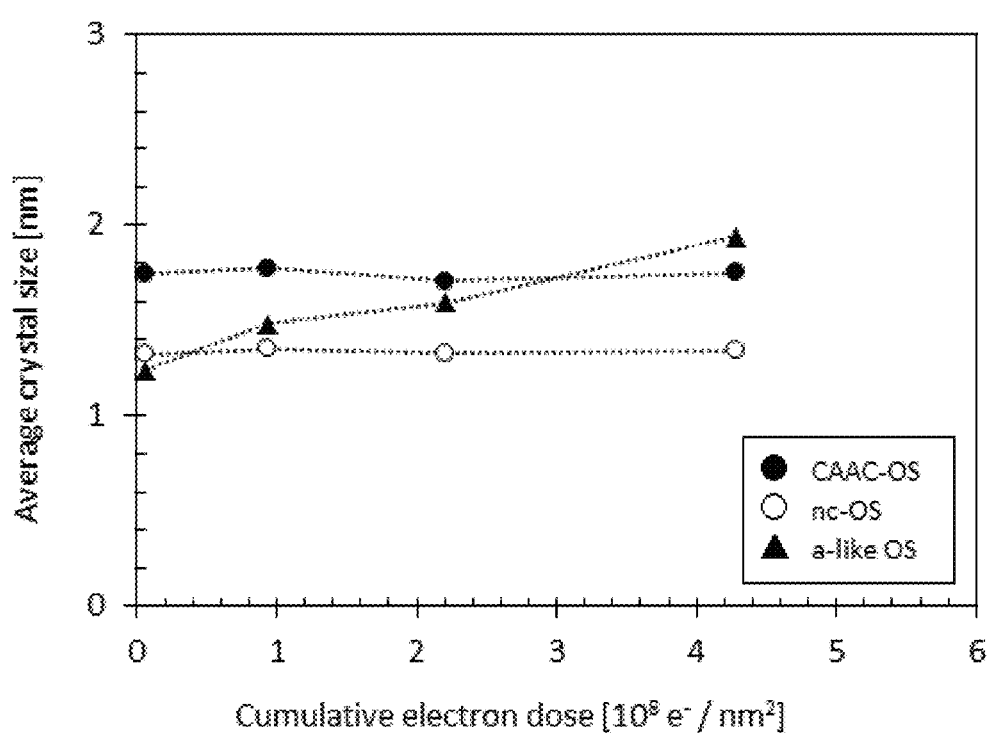
FIG. 24 shows a change in crystal part of an In—Ga—Zn oxide induced by electron irradiation.

FIG. 24 shows change in the average size of crystal parts (at 22 points to 30 points) in each sample. Note that the crystal part size corresponds to the length of a lattice fringe. FIG. 24 indicates that the crystal part size in the a-like OS increases with an increase in the cumulative electron dose in obtaining TEM images, for example. As shown in FIG. 24, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 24, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope is used. The conditions of electron beam irradiation are as follows: the accelerating voltage is 300 kV; the current density is $6.7 \times 10^5$ $e^-/(nm^2 \cdot s)$; and the diameter of irradiation region is 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

[Carrier Density of Oxide Semiconductor]

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than 8×10$^{15}$ cm$^{-3}$, preferably lower than 1×10$^{11}$ cm$^{-3}$, and further preferably lower than 1×10$^{10}$ cm$^{-3}$ and is higher than or equal to 1×10$^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to 1×10$^5$ cm$^{-3}$ and lower than 1×10$^{18}$ cm$^{-3}$, further preferably higher than or equal to 1×10$^7$ cm$^{-3}$ and lower than or equal to 1×10$^{17}$ cm$^{-3}$, still further preferably higher than or equal to 1×10$^9$ cm$^{-3}$ and lower than or equal to 5×10$^{16}$ cm$^{-3}$, yet further preferably higher than or equal to 1×10$^{10}$ cm$^{-3}$ and lower than or equal to 1×10$^{16}$ cm$^{-3}$, and yet still preferably higher than or equal to 1×10$^{11}$ cm$^{-3}$ and lower than or equal to 1×10$^{15}$ cm$^{-3}$.

The structure described in this embodiment can be used in appropriate combination with the structure described in any of the other embodiments.

Embodiment 5

In this embodiment, examples of CPUs including the transistor of one embodiment of the present invention, the above-described memory device, and the like are described.

<Configuration of CPU>

Figure 25:
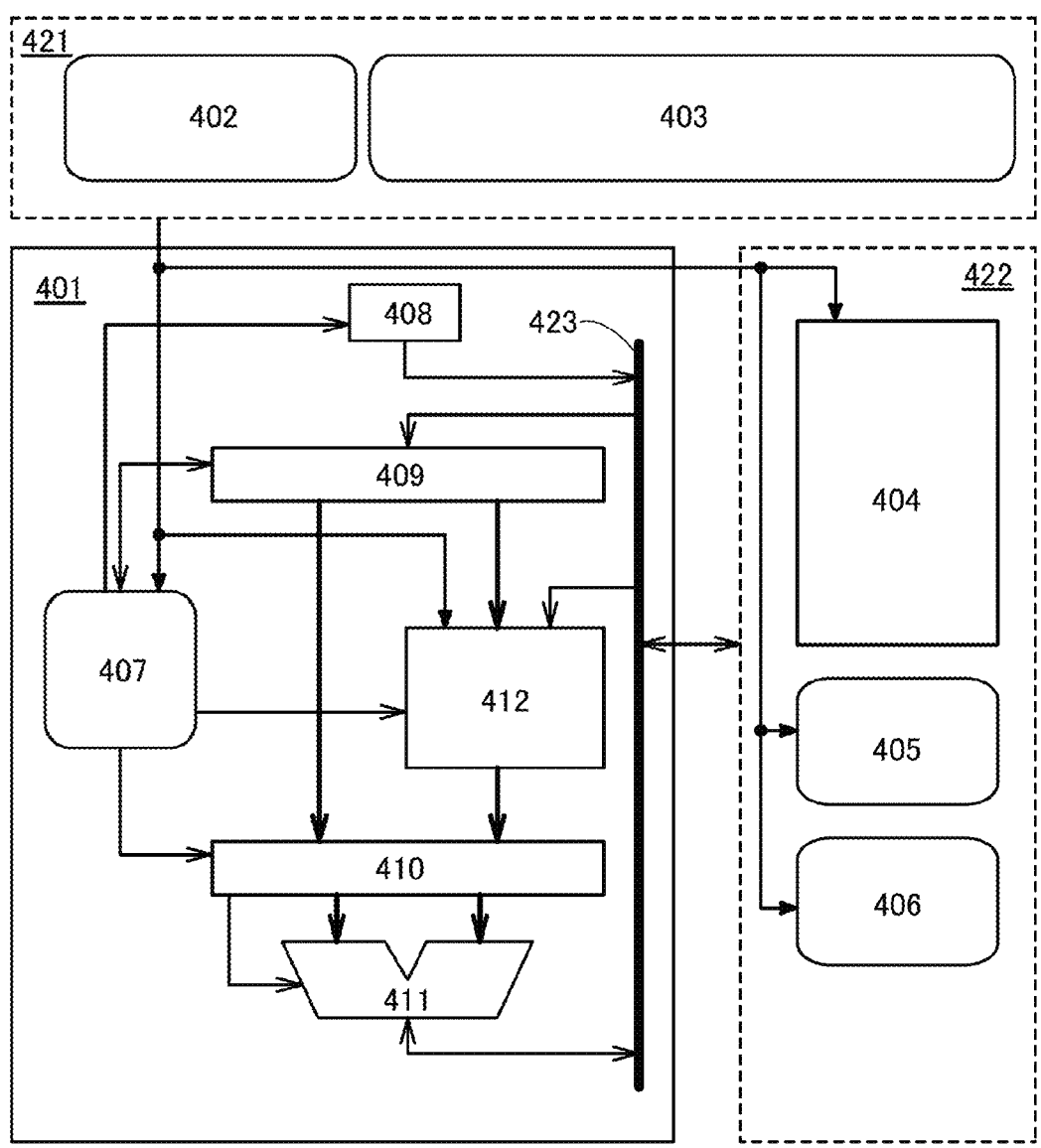
FIG. 25 is a block diagram illustrating a semiconductor device of one embodiment of the present invention.

A semiconductor device 400 shown in FIG. 25 includes a CPU core 401, a power management unit 421, and a peripheral circuit 422. The power management unit 421 includes a power controller 402 and a power switch 403. The peripheral circuit 422 includes a cache 404 including cache memory, a bus interface (BUS I/F) 405, and a debug interface (Debug I/F) 406. The CPU core 401 includes a data bus 423, a control unit 407, a PC (program counter) 408, a pipeline register 409, a pipeline register 410, an ALU (arithmetic logic unit) 411, and a register file 412. Data is transmitted between the CPU core 401 and the peripheral circuit 422 such as the cache 404 via the data bus 423.

The semiconductor device (cell) can be used for many logic circuits typified by the power controller 402 and the control unit 407, particularly to all logic circuits that can be constituted using standard cells. Accordingly, the semiconductor device 400 can be small. The semiconductor device 400 can have reduced power consumption. The semiconductor device 400 can have a higher operating speed. The semiconductor device 400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 400, the semiconductor device 400 can be small. The semiconductor device 400 can have reduced power consumption. The semiconductor device 400 can have a higher operating speed. Particularly when the Si transistors are only p-channel ones, the manufacturing cost can be reduced.

The control unit 407 has functions of totally controlling operations of the PC 408, the pipeline register 409, the pipeline register 410, the ALU 411, the register file 412, the cache 404, the bus interface 405, the debug interface 406, and the power controller 402 to decode and execute instructions contained in a program such as input applications.

The ALU 411 has a function of performing a variety of arithmetic operations such as four arithmetic operations and logic operations.

The cache 404 has a function of temporarily storing frequently-used data. The PC 408 is a register having a function of storing an address of an instruction to be executed next. Note that although not shown in FIG. 25, the cache 404 is provided with a cache controller for controlling the operation of the cache memory.

The pipeline register 409 has a function of temporarily storing instruction data.

The register file 412 includes a plurality of registers including a general purpose register and can store data that is read from the main memory, data obtained as a result of arithmetic operations in the ALU 411, or the like.

The pipeline register 410 has a function of temporarily storing data used for arithmetic operations of the ALU 411, data obtained as a result of arithmetic operations of the ALU 411, or the like.

The bus interface 405 has a function as a path for data between the semiconductor device 400 and various devices outside the semiconductor device 400. The debug interface 406 has a function as a path of a signal for inputting an instruction to control debugging to the semiconductor device 400.

The power switch 403 has a function of controlling supply of a power source voltage to various circuits included in the semiconductor device 400 other than the power controller 402. The above various circuits belong to several different power domains. The power switch 403 controls whether the power supply voltage is supplied to the various circuits in the same power domain. In addition, the power controller 402 has a function of controlling the operation of the power switch 403.

The semiconductor device 400 having the above structure is capable of performing power gating. A description will be given of an example of the power gating operation sequence.

First, by the CPU core 401, timing for stopping the supply of the power supply voltage is set in a register of the power controller 402. Then, an instruction of starting power gating is sent from the CPU core 401 to the power controller 402. Then, various registers and the cache 404 included in the semiconductor device 400 start data storing. Then, the power switch 403 stops the supply of a power supply voltage to the various circuits other than the power controller 402 included in the semiconductor device 400. Then, an interrupt signal is input to the power controller 402, whereby the supply of the power supply voltage to the various circuits included in the semiconductor device 400 is started. Note that a counter may be provided in the power controller 402 to be used to determine the timing of starting the supply of the power supply voltage regardless of input of an interrupt signal. Next, the various registers and the cache 404 start data recovery. Then, the instruction is resumed in the control unit 407.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 401 or the peripheral circuit 422 is preferably restored in a short time. In that case, the power can be turned on or off in a short time, and an effect of saving power becomes significant.

In order that the data held by the CPU core 401 or the peripheral circuit 422 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation data can restore and return data in a short time in some cases.

Figure 26:
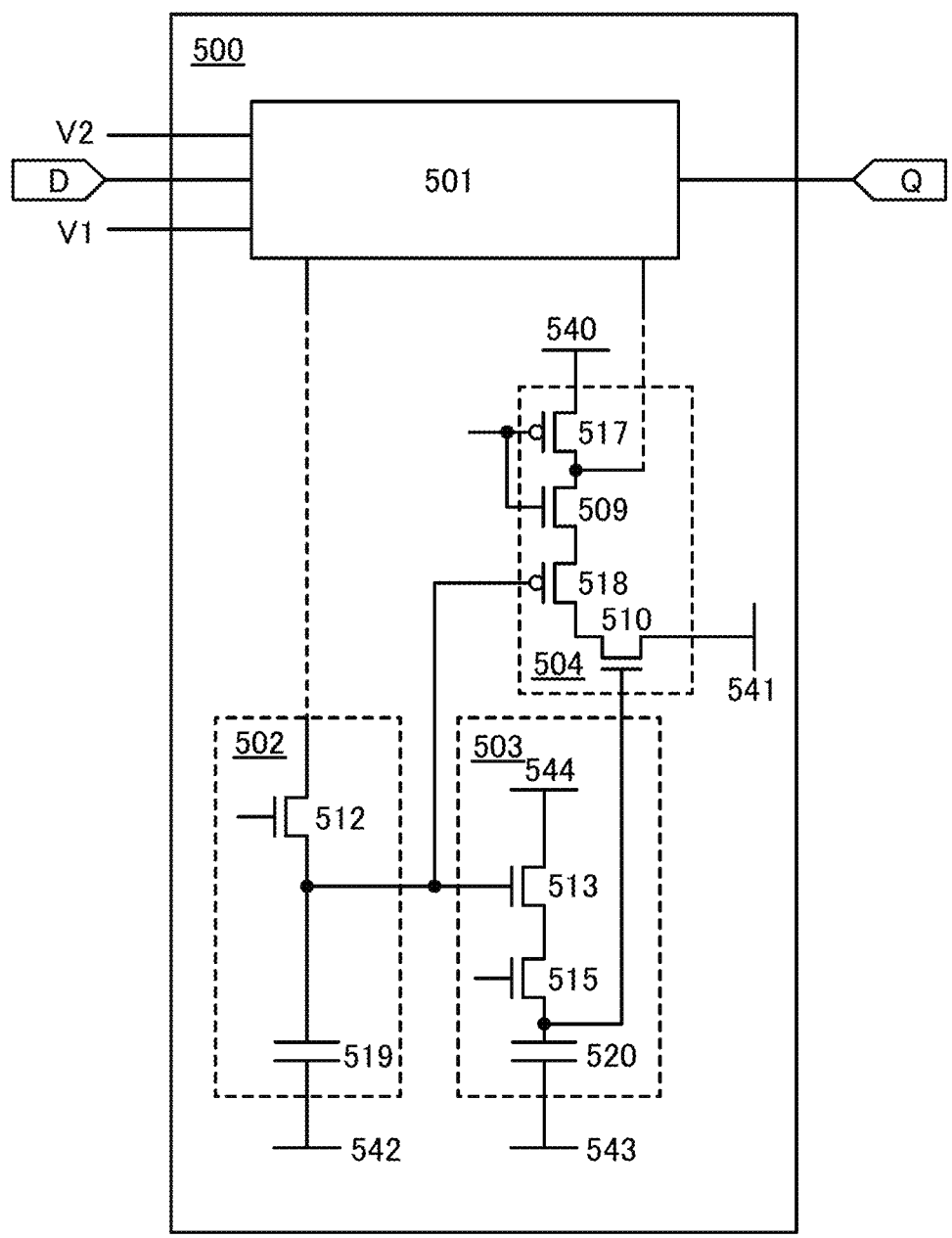
FIG. 26 shows a circuit diagram of a semiconductor device of one embodiment of the present invention.

An example of the flip-flop circuit capable of backup operation is described using FIG. 26.

A semiconductor device 500 shown in FIG. 26 is an example of the flip-flop circuit capable of backup operation. The semiconductor device 500 includes a first memory circuit 501, a second memory circuit 502, a third memory circuit 503, and a read circuit 504. As a power supply voltage, a potential difference between a potential V1 and a potential V2 is supplied to the semiconductor device 500. One of the potential V1 and the potential V2 is at a high level, and the other is at a low level. An example of the structure of the semiconductor device 500 when the potential V1 is at a low level and the potential V2 is at a high level will be described below.

The first memory circuit 501 has a function of retaining data when a signal D including the data is input in a period during which the power supply voltage is supplied to the semiconductor device 500. Furthermore, the first memory circuit 501 outputs a signal Q including the retained data in the period during which the power supply voltage is supplied to the semiconductor device 500. On the other hand, the first memory circuit 501 cannot retain data in a period during which the power supply voltage is not supplied to the semiconductor device 500. That is, the first memory circuit 501 can be referred to as a volatile memory circuit.

The second memory circuit 502 has a function of reading the data held in the first memory circuit 501 to store (or restore) it. The third memory circuit 503 has a function of reading the data held in the second memory circuit 502 to store (or restore) it. The read circuit 504 has a function of reading the data held in the second memory circuit 502 or the third memory circuit 503 to store (or return) it in (to) the first memory circuit 501.

In particular, the third memory circuit 503 has a function of reading the data held in the second memory circuit 502 to store (or restore) it even in the period during which the power supply voltage is not supplied to the semiconductor device 500.

As shown in FIG. 26, the second memory circuit 502 includes a transistor 512 and a capacitor 519. The third memory circuit 503 includes a transistor 513, a transistor 515, and a capacitor 520. The read circuit 504 includes a transistor 510, a transistor 518, a transistor 509, and a transistor 517.

The transistor 512 has a function of charging and discharging the capacitor 519 in accordance with data held in the first memory circuit 501. The transistor 512 is desirably capable of charging and discharging the capacitor 519 at a high speed in accordance with data held in the first memory circuit 501. Specifically, the transistor 512 desirably contains crystalline silicon (preferably polycrystalline silicon, further preferably single crystal silicon) in a channel formation region.

The conduction state or the non-conduction state of the transistor 513 is determined in accordance with the charge held in the capacitor 519. The transistor 515 has a function of charging and discharging the capacitor 520 in accordance with the potential of a wiring 544 when the transistor 513 is in a conduction state. It is desirable that the off-state current of the transistor 515 be extremely low. Specifically, the transistor 515 desirably contains an oxide semiconductor (preferably an oxide containing In, Ga, and Zn) in a channel formation region.

Specific connection relations between the elements are described. One of a source electrode and a drain electrode of the transistor 512 is connected to the first memory circuit 501. The other of the source electrode and the drain electrode of the transistor 512 is connected to one electrode of the capacitor 519, a gate electrode of the transistor 513, and a gate electrode of the transistor 518. The other electrode of the capacitor 519 is connected to the wiring 542. One of a source electrode and a drain electrode of the transistor 513 is connected to the wiring 544. The other of the source electrode and the drain electrode of the transistor 513 is connected to one of a source electrode and a drain electrode of the transistor 515. The other of the source electrode and the drain electrode of the transistor 515 is connected to one electrode of the capacitor 520 and a gate electrode of the transistor 510. The other electrode of the capacitor 520 is connected to the wiring 543. One of a source electrode and a drain electrode of the transistor 510 is connected to a wiring 541. The other of the source electrode and the drain electrode of the transistor 510 is connected to one of a source electrode and a drain electrode of the transistor 518. The other of the source electrode and the drain electrode of the transistor 518 is connected to one of a source electrode and a drain electrode of the transistor 509. The other of the source electrode and the drain electrode of the transistor 509 is connected to one of a source electrode and a drain electrode of the transistor 517 and the first memory circuit 501. The other of the source electrode and the drain electrode of the transistor 517 is connected to a wiring 540. Furthermore, although a gate electrode of the transistor 509 is connected to a gate electrode of the transistor 517 in FIG. 26, the gate electrode of the transistor 509 is not necessarily connected to the gate electrode of the transistor 517.

The transistor described in the above embodiment as an example can be applied to the transistor 515. Because of the low off-state current of the transistor 515, the semiconductor device 500 can retain data for a long time without power supply. The favorable switching characteristics of the transistor 515 allow the semiconductor device 500 to perform high-speed backup and recovery.

The structure described in this embodiment can be used in appropriate combination with the structure described in any of the other embodiments.

Embodiment 6

In this embodiment, a semiconductor wafer and a chip each including the semiconductor device of one embodiment of the present invention and an electronic component including the chip are described with reference to FIGS. 27A and 27B and FIGS. 28A and 28B.

<Semiconductor Wafer and Chip>

Figure 27A:
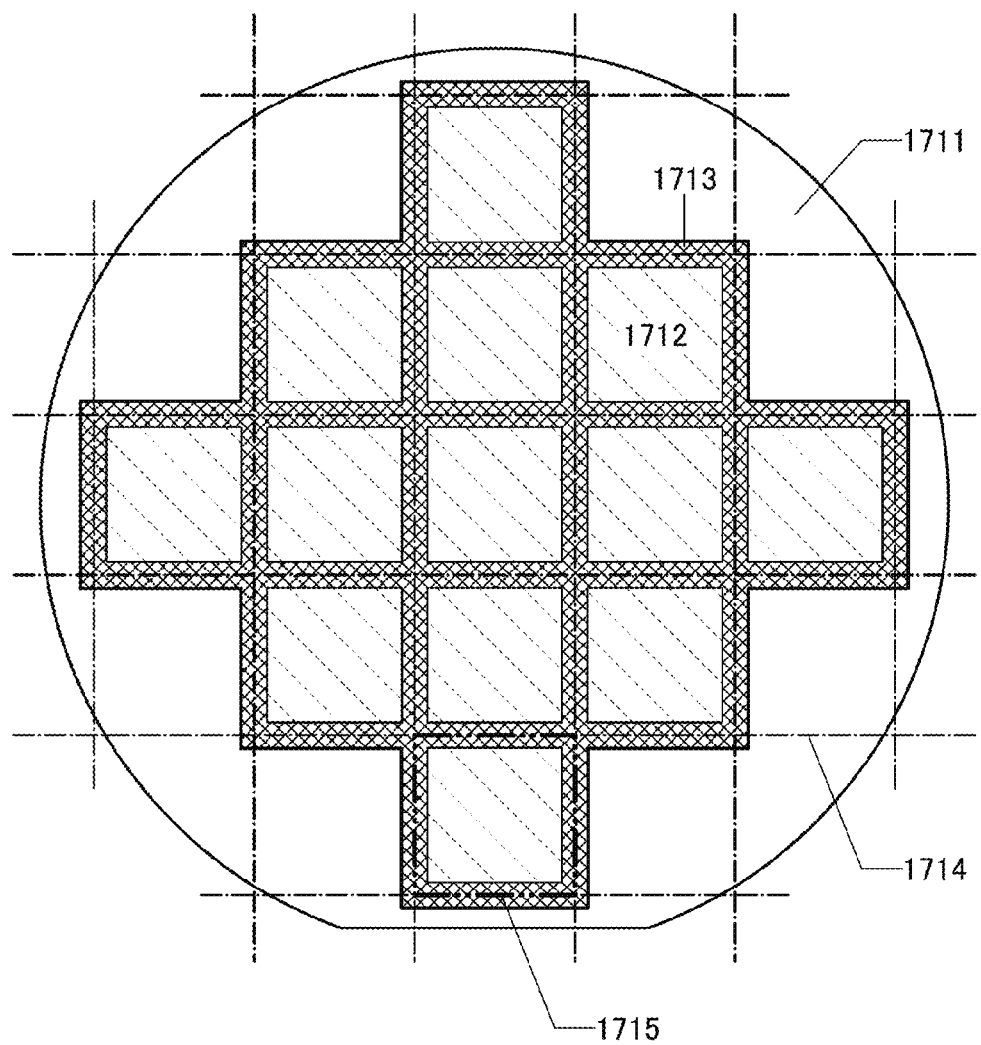
FIGS. 27A and 27B are top views of a semiconductor wafer of one embodiment of the present invention.

FIG. 27A is a top view illustrating a substrate 1711 before dicing treatment. As the substrate 1711, a semiconductor substrate (also referred to as a "semiconductor wafer") can be used, for example. A plurality of circuit regions 1712 are provided over the substrate 1711. The semiconductor device according to one embodiment of the present invention, a CPU, an RF tag, an image sensor, or the like can be provided in the circuit region 1712.

Figure 27B:
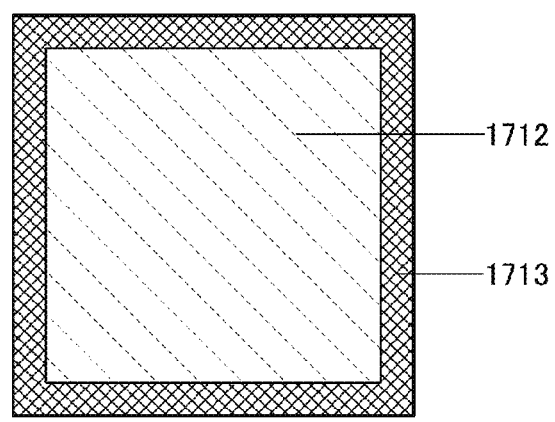

The plurality of circuit regions 1712 are each surrounded by a separation region 1713. Separation lines (also referred to as "dicing lines") 1714 are set at a position overlapping with the separation regions 1713. The substrate 1711 can be cut along the separation lines 1714 into chips 1715 including the circuit regions 1712. FIG. 27B is an enlarged view of the chip 1715.

A conductive layer or a semiconductor layer may be provided in the separation regions 1713. Providing a conductive layer or a semiconductor layer in the separation regions 1713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 1713 allows a reduction in the usage of the pure water. Therefore, the cost of manufacturing semiconductor devices can be reduced. Thus, semiconductor devices can be manufactured with improved productivity.

For a semiconductor layer provided in the separation regions 1713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 28A:
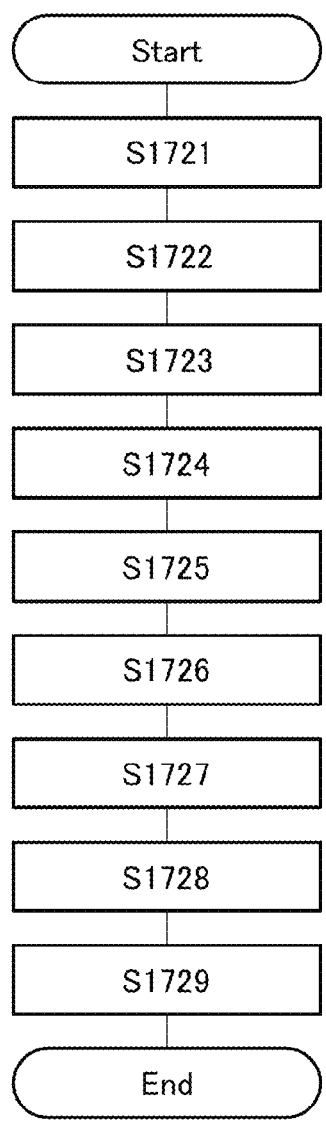
FIG. 28A is a flowchart showing a manufacturing process example of an electronic component.
Figure 28B:
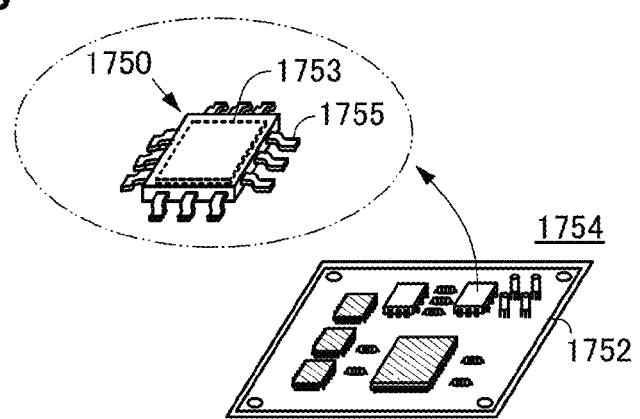
FIG. 28B is a schematic perspective view of the electronic component.

FIGS. 28A and 28B show an example where the chip 1715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 28A. After an element substrate including the semiconductor device described in any of the above embodiments is completed in a pre-process, a back surface grinding step in which a back surface (a surface where a semiconductor device and the like are not formed) of the element substrate is ground is performed (Step S1721). When the element substrate is thinned by grinding, warpage or the like of the element substrate is reduced, so that the size of the electronic component can be reduced.

Next, the element substrate is divided into a plurality of chips (chips 1715) in a dicing step (Step S1722). Then, the separated chips are individually picked up to be bonded to a lead frame in a die bonding step (Step S1723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S1724). As the metal wire, a silver wire or a gold wire can be used. Ball bonding or wedge bonding can be used as the wire bonding.

The wire-bonded chip is subjected to a molding step of sealing the chip with an epoxy resin or the like (Step S1725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S1726). This plating process prevents rust of the lead and facilitates soldering at the time of mounting the chip on a printed circuit board in a later step. Then, the lead is cut and processed in a formation step (Step S1727).

Next, a printing (marking) step is performed on a surface of the package (Step S1728). After a testing step (Step S1729) for checking whether an external shape is good and whether there is a malfunction, for example, the electronic component is completed.

FIG. 28B is a perspective schematic diagram of a completed electronic component. FIG. 28B is a perspective schematic diagram illustrating a quad flat package (QFP) as an example of the electronic component. An electronic component 1750 in FIG. 28B includes a lead 1755 and a semiconductor device 1753. As the semiconductor device 1753, the semiconductor device described in any of the above embodiments can be used.

The electronic component 1750 in FIG. 28B is mounted on a printed circuit board 1752, for example. A plurality of electronic components 1750 that are combined and electrically connected to each other over the printed circuit board 1752; thus, a substrate on which the electronic components are mounted (a circuit board 1754) is completed. The completed circuit board 1754 is provided in an electronic device or the like.

The structure described in this embodiment can be used in appropriate combination with the structure described in any of the other embodiments.

Embodiment 7

In this embodiment, display devices each including the transistor or the like of one embodiment of the present invention will be described with reference to FIGS. 29A to 29C and FIGS. 30A and 30B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or a TCP; a module in which a printed wiring board is provided at the end of TCP; and a module in which an IC is mounted directly on a display element by a COG method.

Figure 29A:
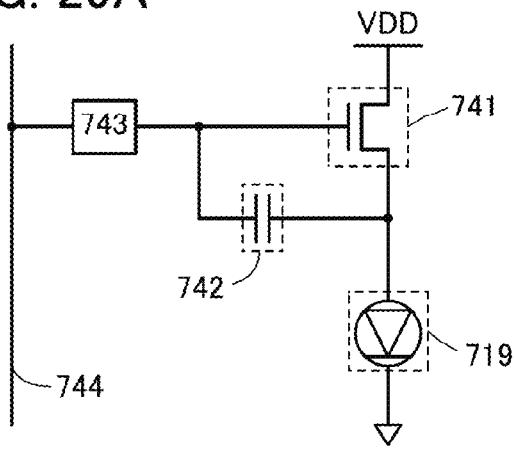
FIGS. 29A to 29C are a circuit diagram, a top view, and a cross-sectional view of a semiconductor device of one embodiment of the present invention.
Figure 29B:
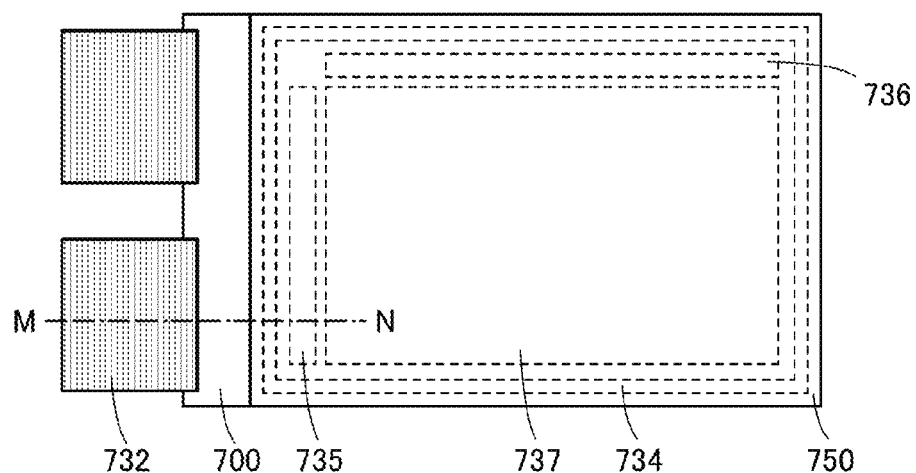
Figure 29C:
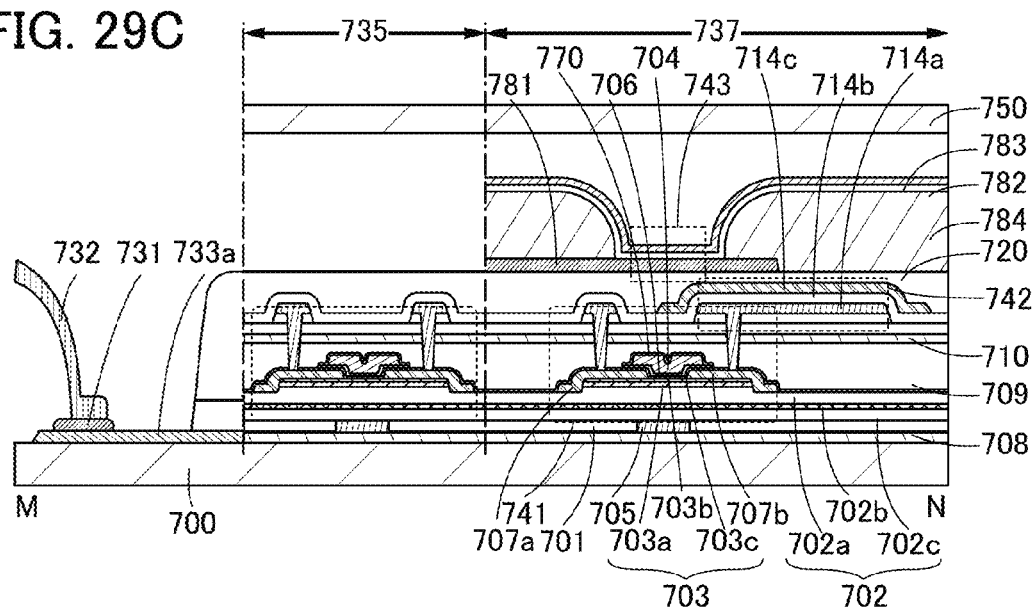

FIGS. 29A to 29C illustrate an example of an EL display device of one embodiment of the present invention. FIG. 29A is a circuit diagram of a pixel in an EL display device. FIG. 29B is a top view showing the whole of the EL display device. FIG. 29C is a cross-sectional view taken along part of dashed-dotted line M-N in FIG. 29B.

FIG. 29A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 29A includes a switching element 743, a transistor 741, a capacitor 742, and a light-emitting element 719.

Note that FIG. 29A and the like each illustrate an example of a circuit structure; therefore, a transistor can be provided additionally. In contrast, for each node in FIG. 29A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the above-described transistor can be used, for example.

FIG. 29B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 29C is a cross-sectional view of the EL display device taken along part of dashed-dotted line M-N in FIG. 29B.

The transistor 741 in FIG. 29C includes a conductor 705 over the substrate 700, an insulator 701 in which the conductor 705 is embedded, an insulator 702 over the insulator 701, a semiconductor 703a and a semiconductor 703b over the insulator 702, a conductor 707a and a conductor 707b over the semiconductor 703b, a semiconductor 703c over the semiconductor 703b and the conductors 707a and 707b, an insulator 706 over the semiconductor 703c, a conductor 704 over the insulator 706, and an insulator 770 over the conductor 704. Over the transistor 741, an insulator 709 including an excess oxygen region is provided, the conductors 707a and 707b are separated from the insulator 709 by the semiconductor 703c, and the conductor 704 is separated from the insulator 709 by the insulator 770. Note that the structure of the transistor 741 is just an example; the transistor 741 may have a structure different from that in FIG. 29C.

Thus, in the transistor 741 illustrated in FIG. 29C, the conductors 704 and 705 each function as a gate electrode, the insulators 702 and 706 each function as a gate insulator, and the conductors 707a and 707b function as a source electrode or a drain electrode. Note that in some cases, electrical characteristics of the semiconductor 703 change if light enters the semiconductor 703. To prevent this, it is preferable that one or more of the conductor 705 and the conductor 704 have a light-blocking property.

The transistor 741 is provided between an insulator 708 and an insulator 710 having a barrier property.

FIG. 29C illustrates a structure including, as the capacitor 742, a conductor 714a over an insulator 710, an insulator 714b over the conductor 714a, and a conductor 714c over the insulator 714b.

In the capacitor 742, the conductor 714a serves as one electrode, and the conductor 714c serves as the other electrode.

The capacitor 742 illustrated in FIG. 29C has a large capacitance per area occupied by the capacitor. Therefore, the EL display device illustrated in FIG. 29C has high display quality.

An insulator 720 is provided over the transistor 741 and the capacitor 742. Here, the insulator 716 and the insulator 720 may have an opening portion reaching the region 705a that serves as the source of the transistor 741. A conductor 781 is provided over the insulator 720. The conductor 781 is electrically connected to the transistor 741 through the opening portion in the insulator 720.

A partition wall 784 having an opening portion reaching the conductor 781 is provided over the conductor 781. A light-emitting layer 782 in contact with the conductor 781 through the opening portion formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 30A:
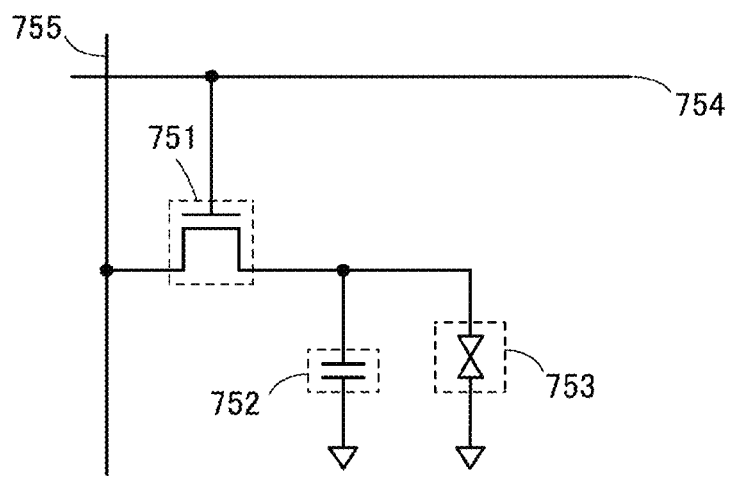
FIGS. 30A and 30B are a circuit diagram and a cross-sectional view of a semiconductor device of one embodiment of the present invention.

FIG. 30A is a circuit diagram showing a structural example of a pixel of the liquid crystal display device. A pixel illustrated in FIGS. 30A and 30B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring for supplying a common potential. The common potential supplied to the wiring electrically connected to the other electrode of the capacitor 752 may be different from that supplied to the other electrode of the liquid crystal element 753.

Figure 30B:
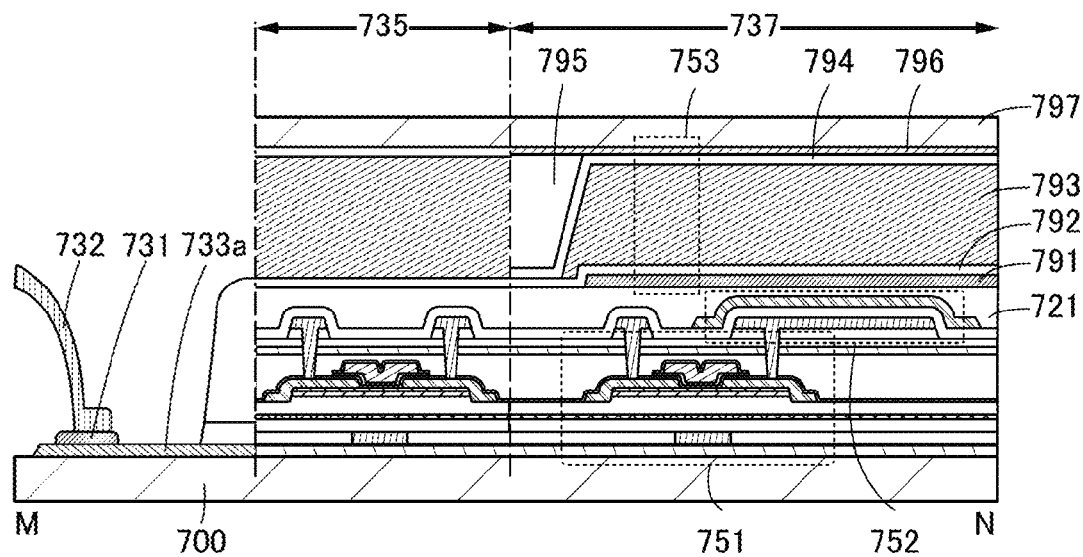

Note that the description of the liquid crystal display device is made on the assumption that the top view of the liquid crystal display device is similar to that of the EL display device. FIG. 30B is a cross-sectional view of the liquid crystal display device taken along dashed-dotted line M-N in FIG. 29B. In FIG. 30B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 30B corresponds to, but is not limited to, the structure of the capacitor 742 in FIG. 29C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening portion reaching the transistor 751. A conductor 791 is provided over the insulator 721. The conductor 791 is electrically connected to the transistor 751 through the opening portion in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described in this embodiment can be used in appropriate combination with the structure described in any of the other embodiments.

Embodiment 8

In this embodiment, electronic devices each including the transistor or the like of one embodiment of the present invention are described.
<Electronic Device>

The semiconductor device of one embodiment of the present invention can be used for display devices, laptops, or image reproducing devices provided with recording media (typically devices which reproduce the content of recording media such as DVDs (digital versatile disc) and have displays for displaying the reproduced images). Other than the above, as an electronic apparatuses which can use the semiconductor device of an embodiment of the present invention, mobile phones, portable game machines, portable information terminals, e-book readers, video cameras, digital still cameras, goggle-type displays (head mounted displays), navigation systems, audio reproducing devices (e.g., car audio players and digital audio players), copiers, facsimiles, printers, multifunction printers, automated teller machines (ATM), vending machines, and the like can be given. Specific examples of such electronic apparatuses are shown in FIGS. 31A to 31F.

Figure 31A:
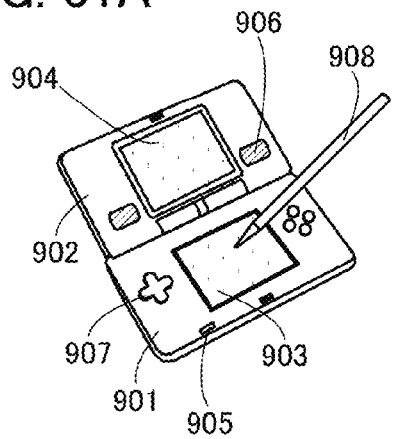
FIGS. 31A to 31F are perspective views each illustrating an electronic device of one embodiment of the present invention.

FIG. 31A illustrates a portable game machine including a housing 901, a housing 902, a display portion 903, a display portion 904, a microphone 905, a speaker 906, an operation key 907, a stylus 908, and the like. Although the portable game machine in FIG. 31A has the two display portions 903 and 904, the number of display portions included in a portable game machine is not limited to this.

Figure 31B:
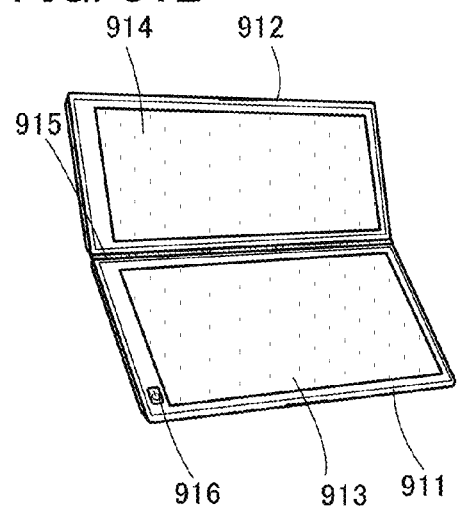

FIG. 31B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 31C:
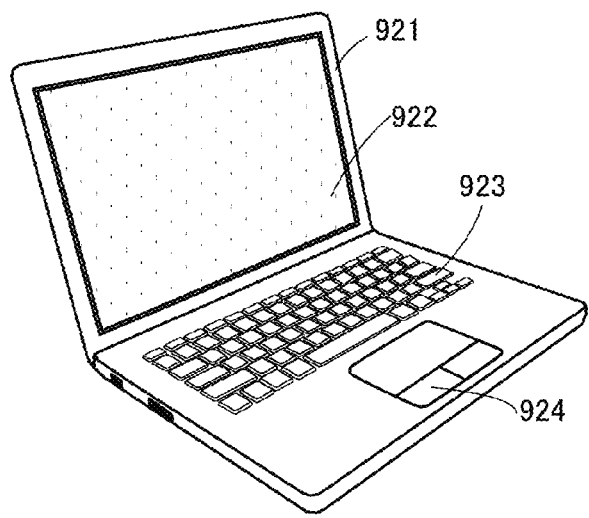

FIG. 31C illustrates a laptop personal computer, which includes a housing 921, a display portion 922, a keyboard 923, a pointing device 924, and the like.

Figure 31D:
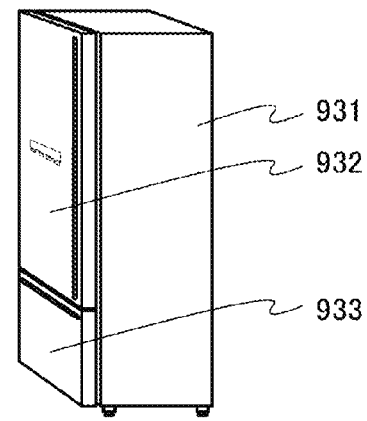

FIG. 31D illustrates the electric refrigerator-freezer including a housing 931, a door for a refrigerator 932, a door for a freezer 933, and the like.

Figure 31E:
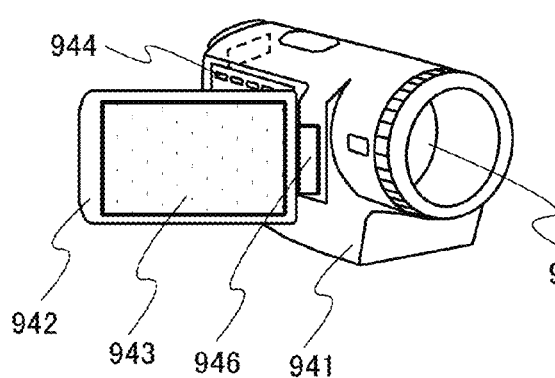

FIG. 31E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 31F:
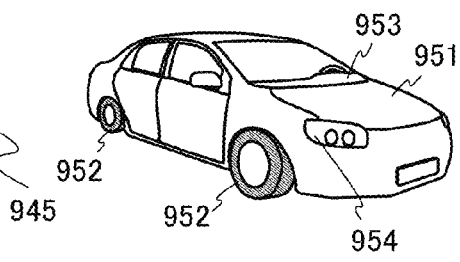

FIG. 31F illustrates a passenger car including a car body 951, wheels 952, a dashboard 953, lights 954, and the like.

The structure described in this embodiment can be used in appropriate combination with the structure described in any of the other embodiments.

Embodiments of the present invention have been described in the above embodiments. Note that one embodiment of the present invention is not limited to the above examples. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

EXAMPLE 1

In this example, the semiconductor device in FIG. 1 was fabricated, and evaluation results of electrical characteristics of the transistor 200 included in the semiconductor device are described.

FIGS. 8A to 8C and the like can be referred to for the structure of the transistor 200, and FIGS. 16A to 16C, FIGS. 17A and 17B, FIGS. 18A and 18B, FIGS. 19A and 19B, and the like can be referred to for the method for fabricating the transistor 200.

A method for fabricating a region above the insulator 214 in the semiconductor device in FIG. 1, which was fabricated for evaluation in this example, is described below.

First, on the substrate 301, the transistor 300, the insulator 322, the conductor 328, the insulator 324, the insulator 326, the conductor 330, the insulator 350, the insulator 352, the conductor 356, the insulator 354, and the conductor 358 were formed.

Next, a 30-nm-thick aluminum oxide film was formed over the insulator 354 and the conductor 358 by a sputtering method as the insulator 214. In this example, the insulator 212 was not formed.

Next, a 50-nm-thick silicon oxynitride film was formed by a PECVD method as the insulator 216 (see FIG. 16A).

Then, a depression was formed in a stacked-layer structure of the insulator 214 and the insulator 216. Then, a conductive film was formed to fill the opening portion. Specifically, a 20-nm-thick tantalum nitride film and a 5-nm-thick titanium nitride film were formed as a conductive film to be the conductor 205$a$, and a 250-nm-thick tungsten film was formed as a conductive film to be the conductor 205$b$. When the conductive films are subjected to planarization treatment, a top surface of the insulator 216 was exposed, and the conductor 205 was formed (see FIG. 16B).

Next, a 10-nm-thick silicon oxynitride film as the insulator 220, a 20-nm-thick hafnium oxide film as the insulator 222, a 30-nm-thick silicon oxynitride film as the insulator 224 were formed in this order by a PECVD method, an ALD method, and a PECVD method, respectively (see FIG. 16C).

Then, heat treatment was performed at 410° C. in an oxygen atmosphere for one hour.

Next, a 5-nm-thick In—Ga—Zn oxide film was formed by a DC sputtering method as an oxide 230_1 to be the oxide 230$a$ using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Then, a 15-nm-thick In—Ga—Zn oxide film was formed by a DC sputtering method as an oxide 230_2 to be the oxide 230b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm. The oxide 230a and the oxide 230b were formed successively without exposure to the air.

Then, heat treatment was performed at 400° C. in a nitrogen atmosphere for one hour. In addition, heat treatment was performed at 400° C. in an oxygen atmosphere for one hour.

Next, a 20-nm-thick tungsten film was formed by a DC sputtering method as a conductor film to be the conductors 240a and 240b.

Then, a resist was formed over the conductive film, and the conductive film was processed using the resist, whereby an island-shaped conductor was formed.

Next, the oxide 230_1 and the oxide 230_2 were processed using the island-shaped conductor as a mask to form the oxide 230a and the oxide 230b. After that, a resist was formed over the island-shaped conductor, and the island-shaped conductor was processed using the resist to form the conductor 240a and the conductor 240b (see FIG. 17A).

Next, a 5-nm-thick In—Ga—Zn oxide film was formed by a DC sputtering method as the oxide 230c using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

Then, a 10-nm-thick silicon oxynitride film was formed by a PECVD method as an insulating film 250_1 to be the insulator 250.

Next, as a conductive film to be the conductor 260, a 10-nm-thick titanium nitride film and a 30-nm-thick tungsten film were formed in this order by an ALD method and a DC sputtering method, respectively. Then, a resist was formed over the conductive film, and the conductive film was processed using the resist to form the conductor 260 (see FIG. 17B).

Next, a 7-nm-thick aluminum oxide film was formed by an ALD method as an insulating film 270_1 to be the insulator 270.

Then, a resist was formed over the insulating film 270_1, and the insulating film 250_1 and the insulating film 270_1 were processed using the resist to form the insulator 250 and the insulator 270 (see FIG. 18A).

Next, a 310-nm-thick silicon oxynitride film was formed by a PECVD method as an insulating film 280_1 to be the insulator 280. After that, the insulating film 280_1 was subjected to planarization treatment, whereby the insulator 280 was formed.

Next, a 40-nm-thick aluminum oxide film was formed by an RF sputtering method as the insulator 282 (see FIG. 18B). The aluminum oxide film was formed using a target having an atomic ratio of Al:O=2:3 and deposition gases of an argon gas at 25 sccm and an oxygen gas at 25 sccm. A deposition pressure was 0.4 Pa. A deposition power was 2.5 kW. A substrate temperature was 250° C. A distance between the target and the substrate was 60 mm.

Then, heat treatment was performed at 350° C. in an oxygen atmosphere for one hour.

Through the above steps, a transistor with a channel length L of 60 nm and a channel width W of 60 nm was fabricated.

Eight kinds of transistors A1 to A8 were measured. The transistors A1 to A8 have the same structure as the transistor 200 in FIGS. 8A to 8C, and cells each including the transistors A1 to A8 have different structures of peripheral circuits, such as the transistor 300 and the capacitor 100 in FIGS. 7A and 7B.

The transistor A1 is a single transistor to which the transistor 300 and the capacitor 100 are not connected.

The transistors A2 to A4 are each a transistor to which the capacitor 100 is connected as illustrated in FIG. 7A and the transistor 300 is connected in a pseudo manner as illustrated in FIG. 7A. Here, "in a pseudo manner" means that although the transistors A2 to A4 are each assumed to be provided in a semiconductor device as the transistor 200 in the circuit in FIG. 7A, the transistors A2 to A4 are each not connected to the transistor 300 actually. That is, one of a source and a drain of each of the transistors A2 to A4 is connected to the conductors (the conductor 218, the conductor 358, and the like) below the insulator 222 of the semiconductor device in FIG. 1, but is not connected to the transistor 300.

Figure 32A:
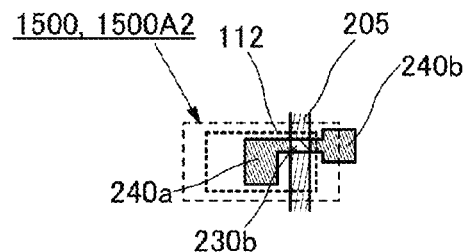
FIGS. 32A to 32C illustrate a structure and arrangement of cells of Example 1.
Figure 32B:
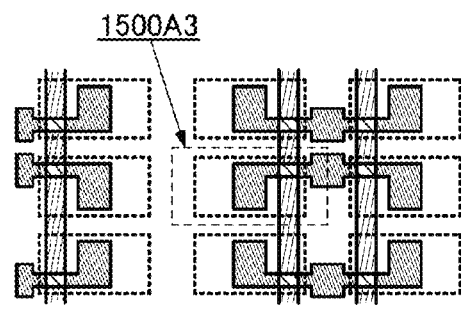
Figure 32C:
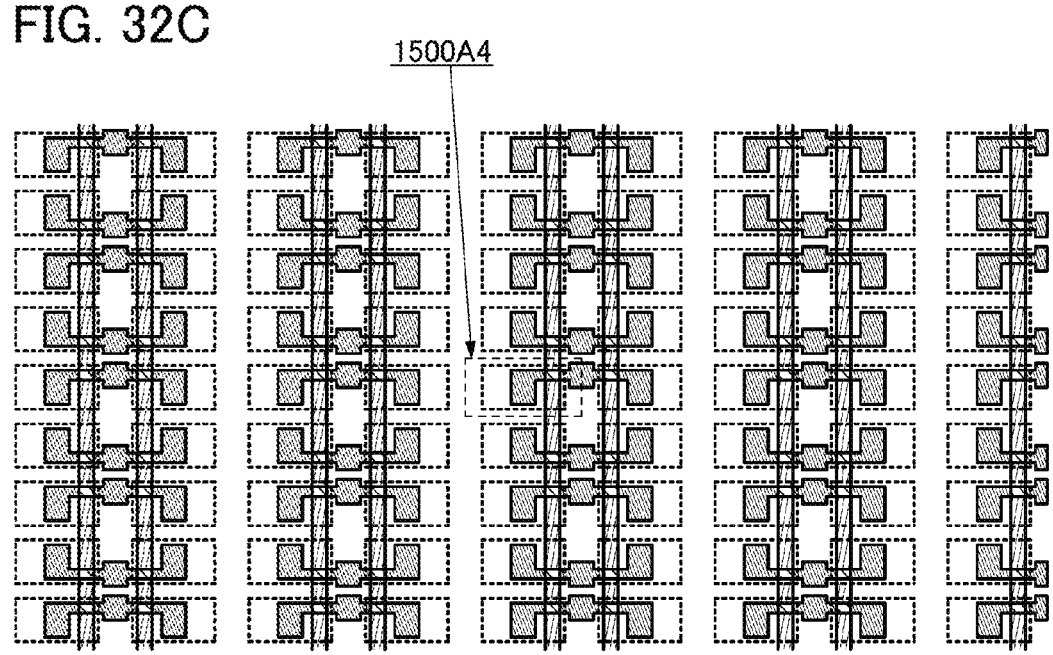

In one cell 1500, the transistor 200 and the capacitor 100 are included (see FIG. 32A). Furthermore, the number of transistors 200 per square micrometer ($\mu m^2$) is 0.89. The transistor A2 is a transistor in the cell 1500 (also referred to as a cell 1500A2 in FIG. 32A for convenience) which is provided alone. The transistor A3 is a transistor in the cell 1500 (cell 1500A3) which is provided at the center of nine (3×3) cells 1500 which are arranged in a tile pattern (see FIG. 32B). The transistor A4 is a transistor in the cell 1500 (cell 1500A4) which is provided at the center of 81 (9×9) cells 1500 which are arranged in a tile pattern (see FIG. 32C). That is, the transistors A2 to A4 are different from each other in the number of transistors provided in the vicinity of and having the same structure as the transistors A2 to A4. The top views of FIGS. 32A to 32C each illustrate some components of the transistor 200 and the capacitor 100. As illustrated in FIG. 32A, in the cell 1500, the oxide 230b where a channel region of the transistor 200 is formed and the conductor 112 which serves as an electrode of the capacitor 100 overlap with each other.

The transistors A5 to A8 are each a transistor to which the capacitor 100 is connected as illustrated in FIG. 7B. In one cell 1510, the transistor 200 and the capacitor 100 are included (see FIG. 33A). In the cells 1510 including the transistor A5 and in the cells 1510 including the transistor A7, the number of transistors 200 per square micrometer ($\mu m^2$) is 0.66. In the cells 1510 including the transistor A6 and in the cells 1510 including the transistor A8, the number of transistors 200 per square micrometer ($\mu m^2$) is 0.34. The transistors A5 to A8 are each a transistor in the ninth cell 1510 when counting from a corner of 1280 (20×64) cells 1510 in a vertical direction and a horizontal direction which are arranged in a tile pattern including transistors having the same structure.

Figure 33A:
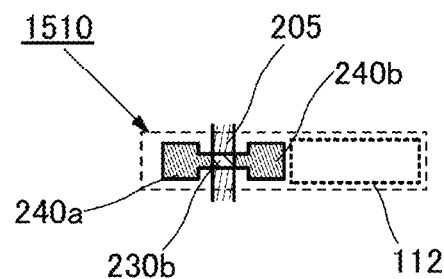
FIGS. 33A to 33C illustrate a structure and arrangement of cells of Example 1.
Figure 33B:
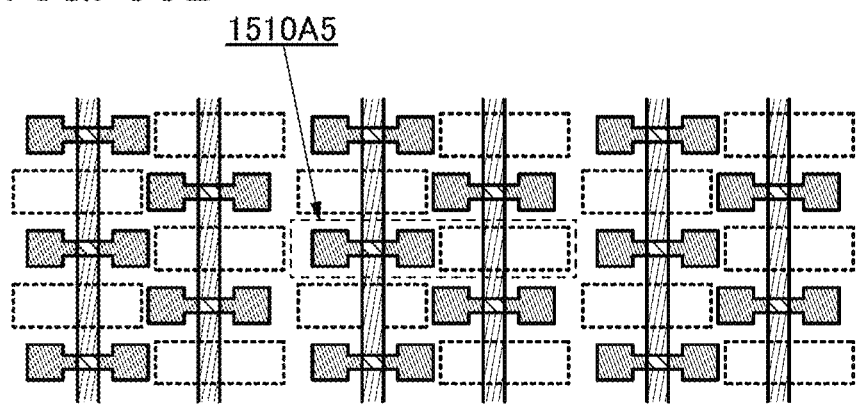
Figure 33C:
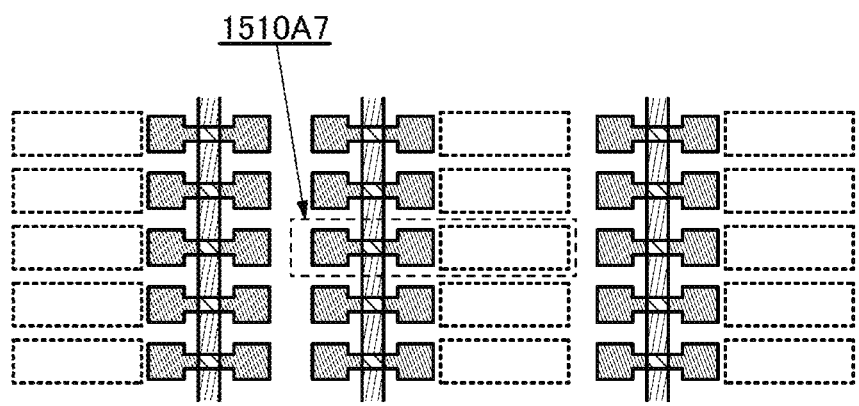
Figure 34A:
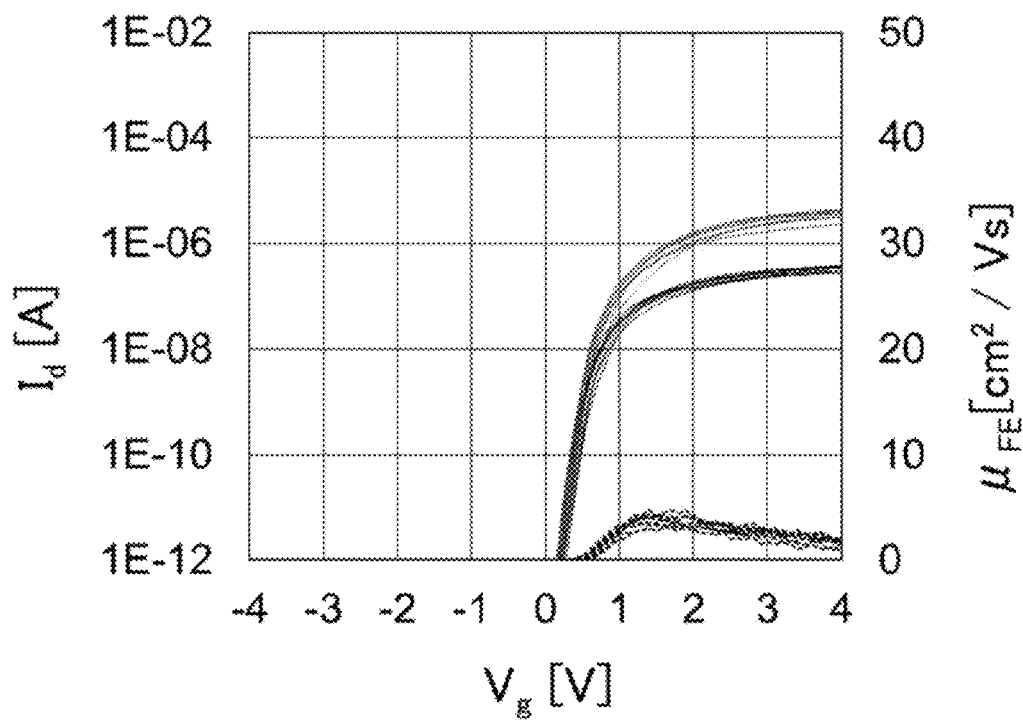
FIGS. 34A and 34B each show $I_d$-$V_g$ characteristics of transistors of Example 1.
Figure 34B:
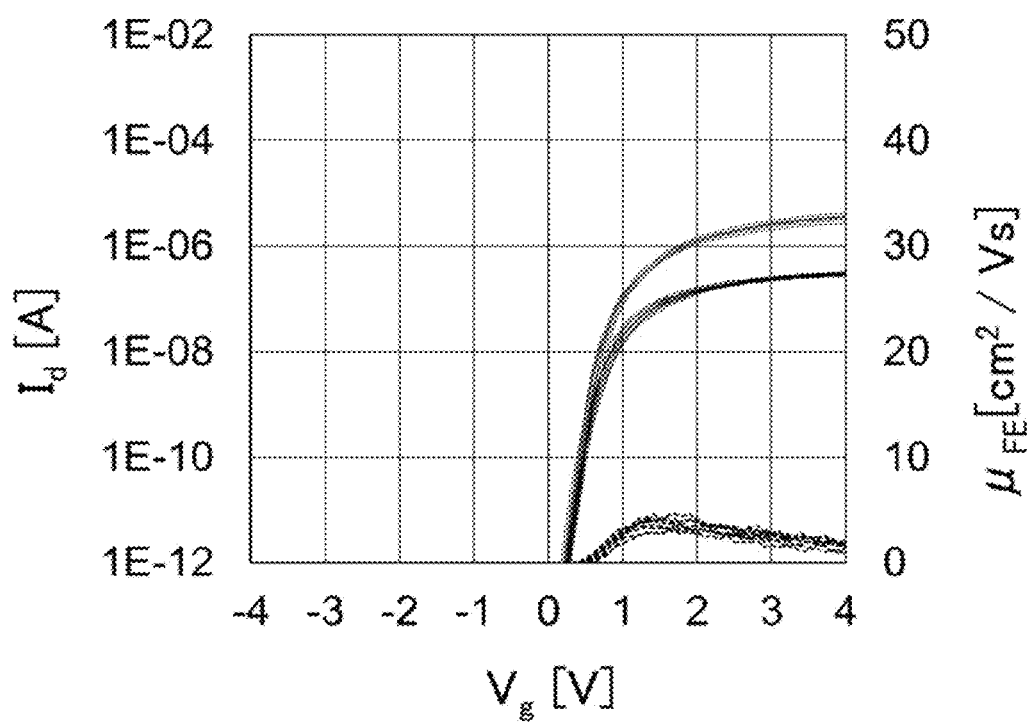
Figure 35A:
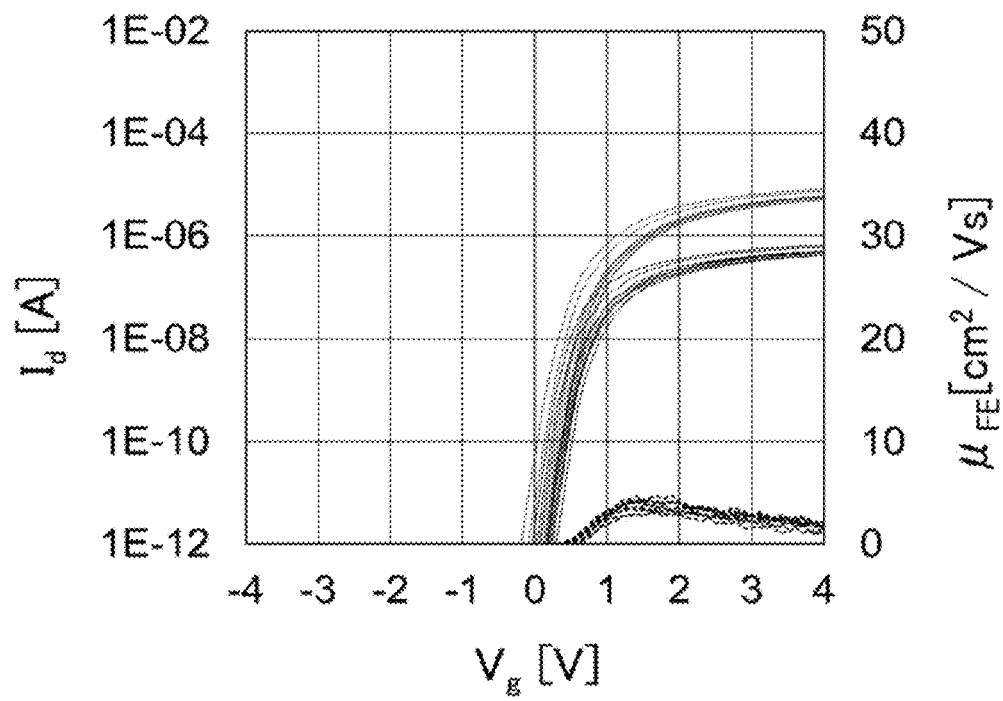
FIGS. 35A and 35B each show $I_d$-$V_g$ characteristics of transistors of Example 1.
Figure 35B:
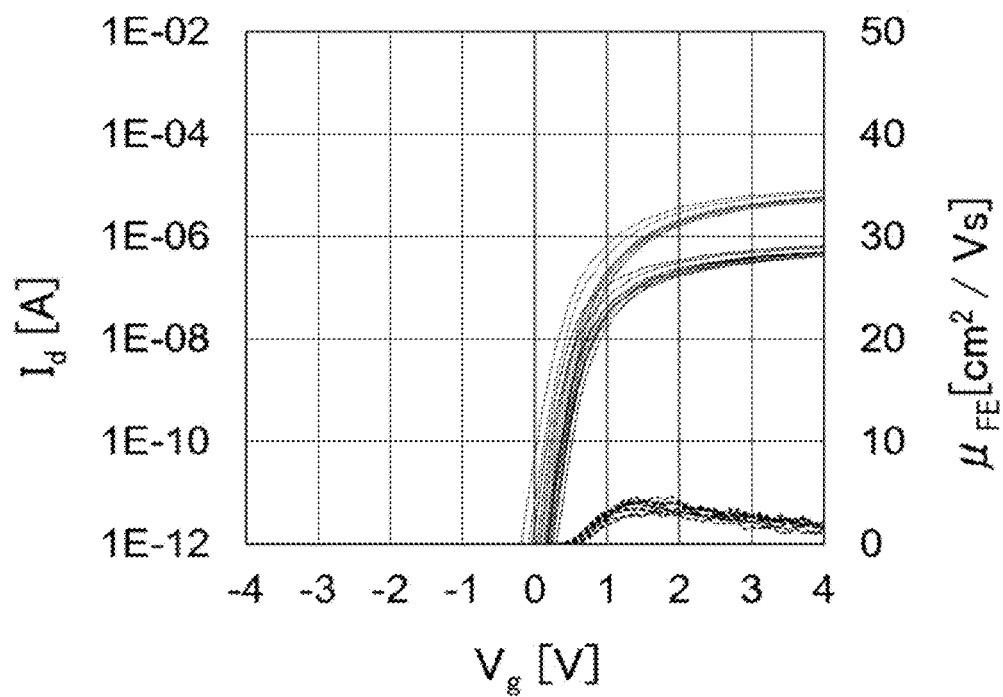
Figure 36A:
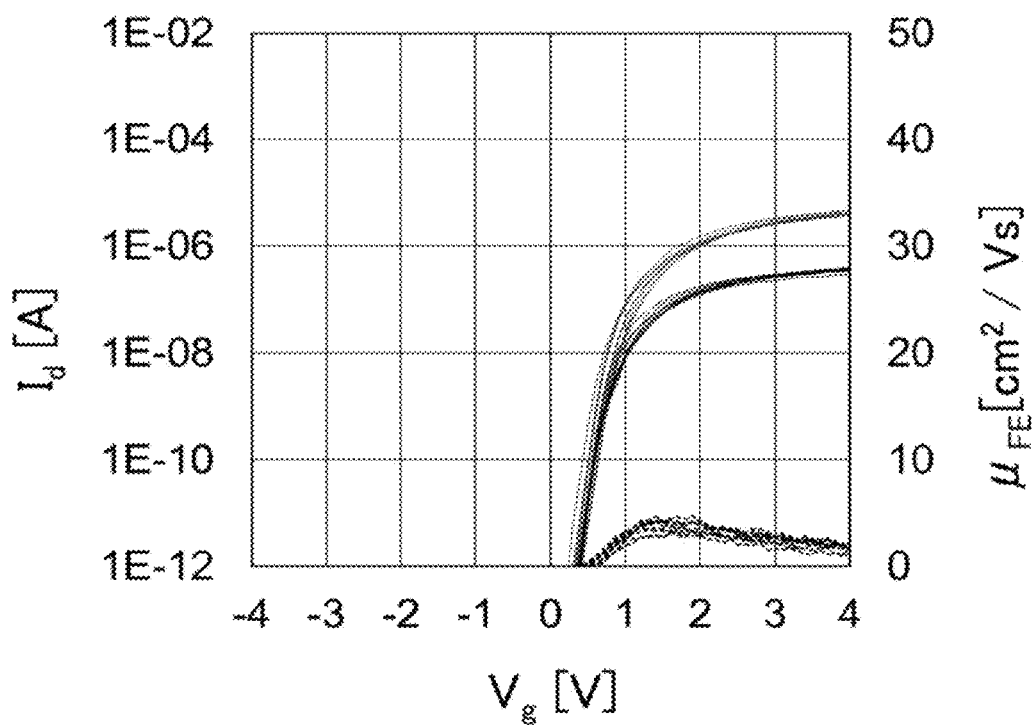
FIGS. 36A and 36B each show $I_d$-$V_g$ characteristics of transistors of Example 1.
Figure 36B:
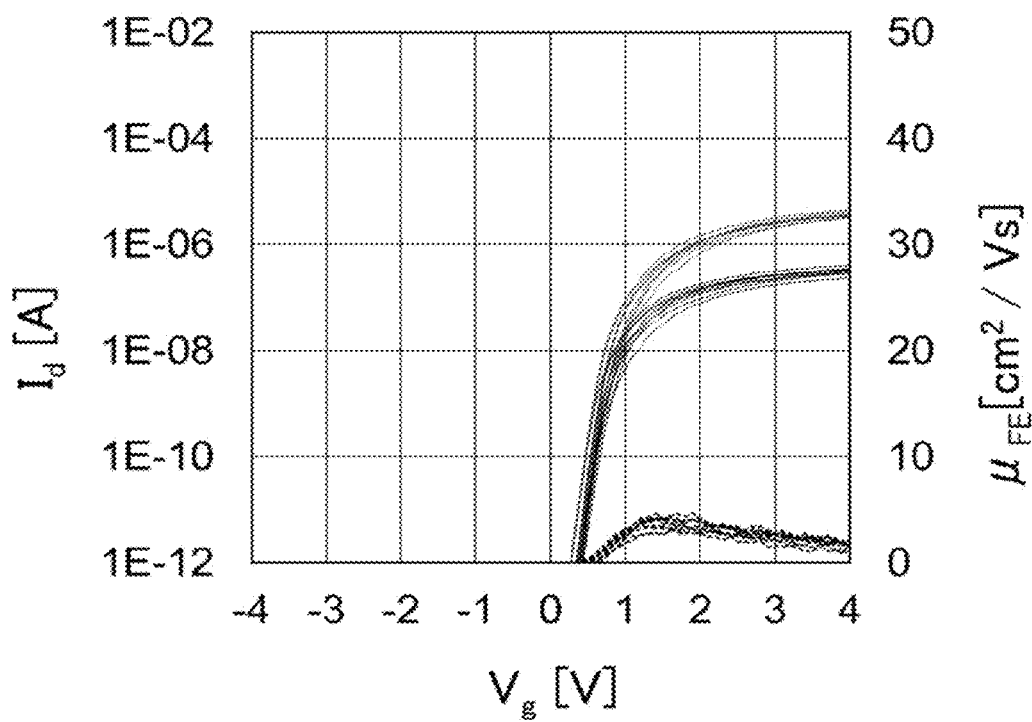
Figure 37A:
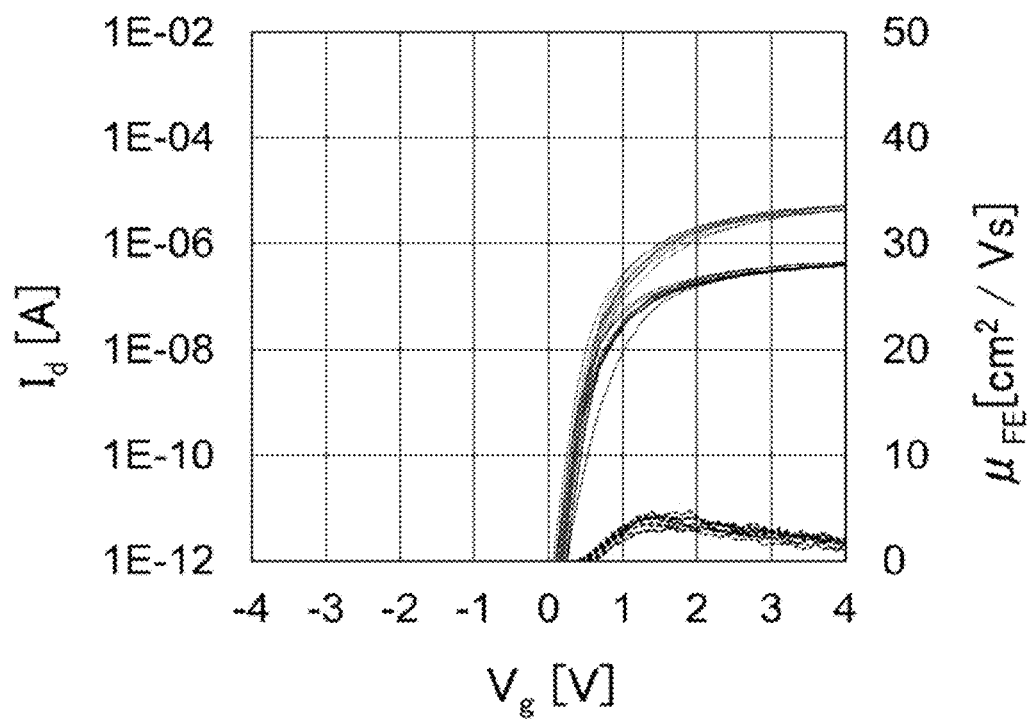
FIGS. 37A and 37B each show $I_d$-$V_g$ characteristics of transistors of Example 1.
Figure 37B:
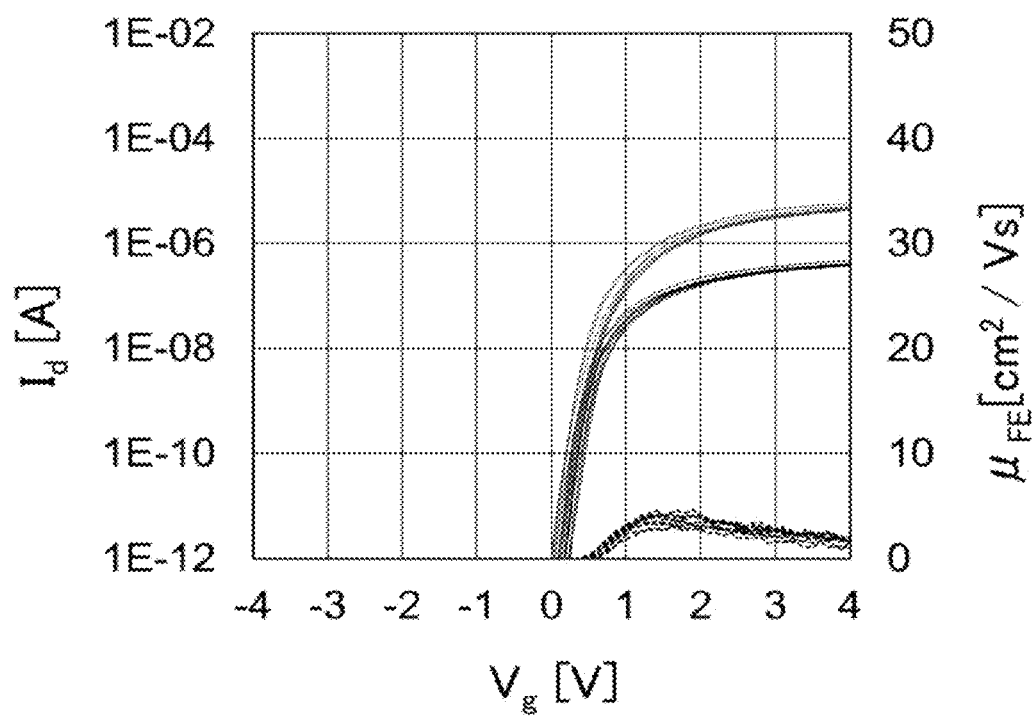
Figure 38A:
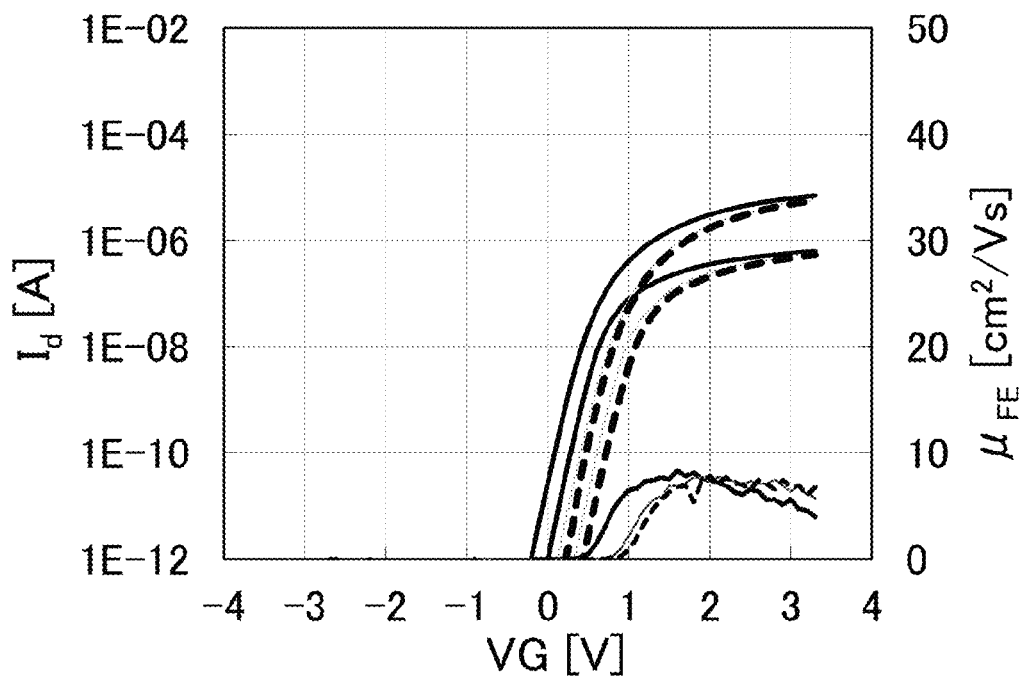
FIGS. 38A and 38B each show results of a BT stress test performed on a transistor of Example 1.
Figure 38B:
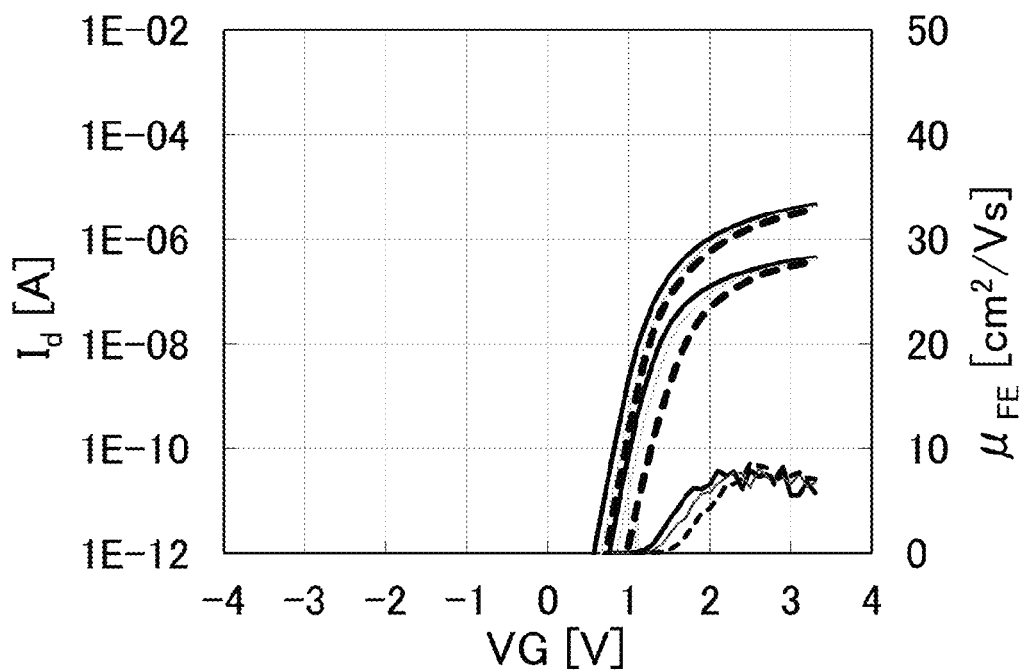
Figure 39A:
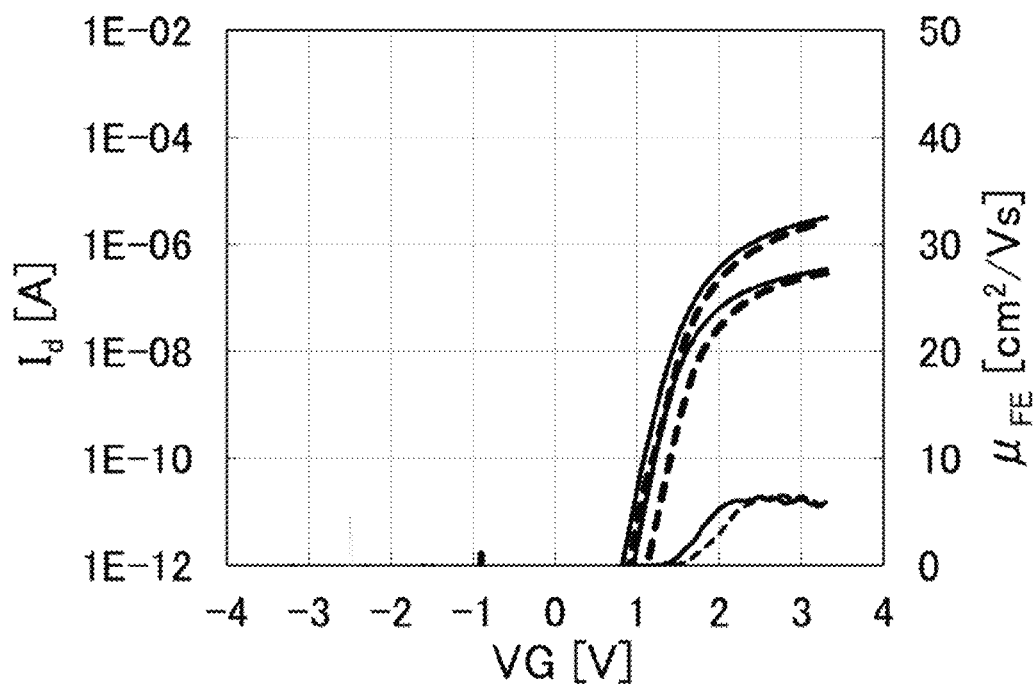
FIGS. 39A and 39B each show results of a BT stress test performed on a transistor of Example 1.
Figure 39B:
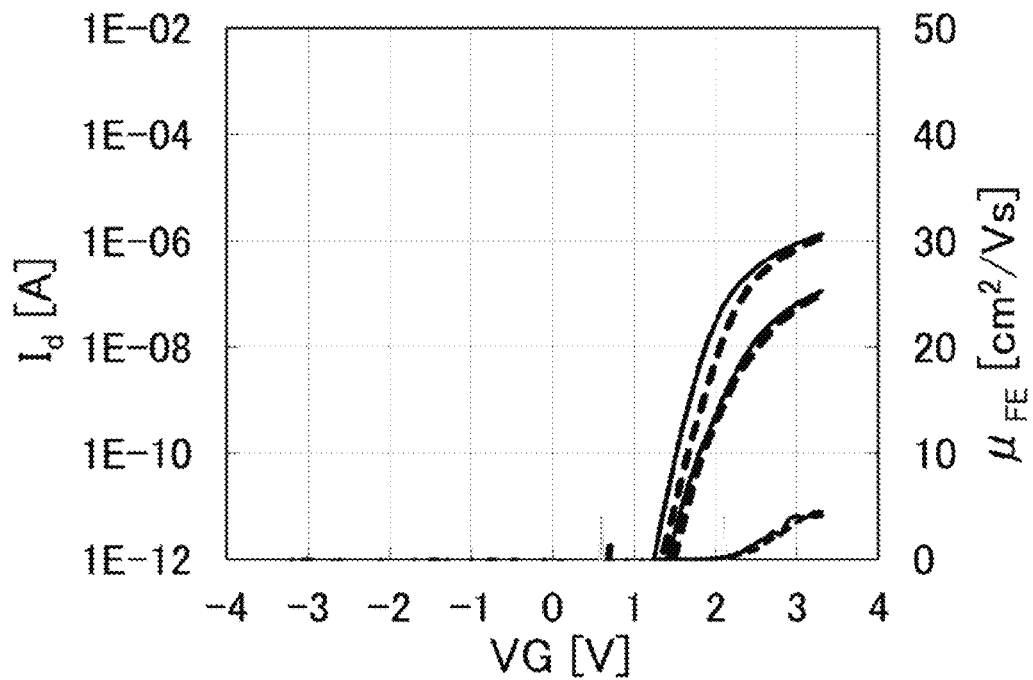

The cells 1510 including the transistor A5 and the cells 1510 including the transistor A7 are different from the cells 1510 including the transistor A6 and the cells 1510 including the transistor A8 in the area of one cell 1510 and the area occupied by the capacitor 100 in the cell 1510. Specifically, the area occupied by the capacitor 100 in each of the cells 1510 including the transistors A6 and A8 is twice as large as the area occupied by the capacitor 100 in each of the cells 1510 including the transistors A5 and A7. Moreover, the cells 1510 including the transistor A5 and the cells 1510 including the transistor A6 are different from the cells 1510 including the transistor A7 and the cells 1510 including the transistor A8 in how the cells 1510 are arranged in a tile pattern. FIG. 33B is a top view illustrating the arrangement of the cell 1510 (cell 1510A5) including the transistor A5 and the cells 1510 around the cell 1510A5. FIG. 33C is a top view illustrating the arrangement of the cell 1510 (cell 1510A7) including the transistor A7 and the cells 1510 around the cell 1510A7. As illustrated in FIG. 33A, in the cell 1510, the oxide 230b where a channel region of the transistor 200 is formed and the conductor 112 which serves as an electrode of the capacitor 100 do not overlap with each other.

The $I_d$-$V_g$ characteristics (drain current-gate voltage characteristics) of the above-described transistors A1 to A8 were measured. The $I_d$-$V_g$ characteristics of the transistors were measured under the following conditions: the back gate voltage was 0 V, the drain voltage was 0.1 V or 1.8 V, and the gate voltage was swept from −4.0 V to 4.0 V in increments of 0.1 V.

Measured $I_d$-$V_g$ characteristics are shown in FIGS. 34A and 34B, FIGS. 35A and 35B, FIGS. 36A and 36B, and FIGS. 37A and 37B. FIGS. 34A and 34B, FIGS. 35A and 35B, FIGS. 36A and 36B, and FIGS. 37A and 37B show the $I_d$-$V_g$ characteristics of the transistors A1, A2, A3, A4, A5, A6, A7, and A8, respectively. The horizontal axis represents gate voltage $V_g$ [V], the left vertical axis represents drain current $I_d$ [A], and the right vertical axis represents field-effect mobility $\mu_{FE}$ [cm$^2$/Vs]. In FIGS. 34A and 34B, FIGS. 35A and 35B, FIGS. 36A and 36B, and FIGS. 37A and 37B, a solid line indicates drain current and a dashed line indicates field-effect mobility. A 5-inch substrate was divided into 3×3 blocks, the transistors A1 to A8 were formed in each block, and the measurement was performed at the nine points.

As shown in FIGS. 34A and 34B, FIGS. 35A and 35B, FIGS. 36A and 36B, and FIGS. 37A and 37B, it is found that the transistor included in the semiconductor device of one embodiment of the present invention has favorable electrical characteristics such as a high on-off ratio. Furthermore, Table 1 shows the average values of the characteristics at the nine points of each of the transistors A1 to A8. The field-effect mobility and the subthreshold swing value (S value) are values obtained when the back gate voltage $V_{BG}$ was 0 V and the drain voltage $V_d$ was 0.1 V. Here, the threshold voltage $V_{th}$ and Shift of the transistors in this example are described.

The threshold voltage is defined as, in the $V_g$-$I_d$ curve where the horizontal axis represents gate voltage $V_g$ [V] and the vertical axis represents the square root of drain current $I_d^{1/2}$ [A], a gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 1.2 V.

Note that the gate voltage at the rising of drain current in $I_d$-$V_g$ characteristics is referred to as Shift. Shift in this example is defined as, in the $V_g$-$I_d$ curve where the horizontal axis represents the gate voltage $V_g$ [V] and the vertical axis represents the logarithm of the drain current $I_d$ [A], a gate voltage at the intersection point of the line of $I_d$=1.0×10$^{-12}$ [A] and the tangent to the curve at a point where the slope of the curve is the steepest. Note that here, Shift is calculated with a drain voltage $V_d$ of 1.2 V.

TABLE 1

| | $\mu_{FE}$ [cm$^2$/Vs] | S value [mV/dec] | Threshold voltage [V] | Shift [V] |
| --- | --- | --- | --- | --- |
| Transistor A1 | 3.91 | 92.72 | 0.61 | 0.19 |
| Transistor A2 | 3.88 | 95.61 | 0.65 | 0.23 |
| Transistor A3 | 5.59 | 100.53 | 0.54 | 0.06 |
| Transistor A4 | 5.97 | 102.05 | 0.57 | 0.06 |
| Transistor A5 | 4.60 | 96.61 | 0.80 | 0.33 |
| Transistor A6 | 4.06 | 95.34 | 0.80 | 0.35 |
| Transistor A7 | 4.70 | 101.50 | 0.60 | 0.13 |
| Transistor A8 | 4.60 | 94.81 | 0.56 | 0.10 |

As shown in Table 1, each of the transistors A1 to A8 has favorable field-effect mobility and a favorable S value. In addition, from the threshold voltage and Shift of each of the transistors A1 to A8, it is found that each of the transistors A1 to A8 has normally-off characteristics. Moreover, from the measurement results of the transistors A2 to A8, it can be said that the transistor of one embodiment of the present invention can be used without any problem even in a circuit in which a transistor, a capacitor, a wiring, and the like are highly integrated.

The above results indicate that a film which suppresses or substantially suppresses permeation of oxygen is provided between the insulator 280 and the conductors 240a, 240b, and 260, whereby excess oxygen can be supplied from the insulator 280 to the oxide 230b, and defects such as oxygen vacancies in the oxide semiconductor of the transistor 200 can be reduced. The use of such an oxide semiconductor with reduced defects makes it possible to provide a transistor with stable electrical characteristics.

Next, changes in electrical characteristics of transistors by stress tests were measured. The measured transistors each have a structure similar to that of the above-described transistor A1. In FIGS. 38A and 38B, FIGS. 39A and 39B, FIGS. 40A and 40B, and FIGS. 41A and 41B, a solid line indicates the $I_d$-$V_g$ characteristics before the stress test, and a dashed line indicates those after the stress test.

FIGS. 38A and 38B and FIGS. 39A and 39B show results of positive gate bias-temperature (BT) stress tests performed on four transistors. In the positive gate BT stress test, measurements were performed as follows. First, $I_d$-$V_g$ characteristics before the stress test were measured. In the measurement, the back gate voltage was a predetermined voltage that varies among the tests, the drain voltage was 0.1 V or 1.2 V, and the gate voltage was swept from −3.3 V to 3.3 V in increments of 0.1 V. Next, $I_d$-$V_g$ characteristics after the stress test were measured. The stress test was performed by applying a drain voltage of 0 V, a back gate voltage which is the same voltage as above, and a gate voltage of 3.63 V for one hour. FIGS. 38A and 38B and FIGS. 39A and 39B show stress test results obtained when the back gate voltages were 0 V, −5.2 V, −8 V, and −12 V, respectively. As shown in FIGS. 38A and 38B and FIGS. 39A and 39B, changes in Shift (ΔShift) through the positive gate BT stress tests for one hour were 0.44 V, 0.15 V, 0.07 V, and 0.10 V, respectively. Furthermore, in FIGS. 38A and 38B and FIGS. 39A and 39B, changes in threshold voltages (ΔV$_{th}$) through the positive gate BT stress tests for one hour were 0.38 V, 0.15 V, 0.09 V, and 0.22 V, respectively.

Figure 40A:
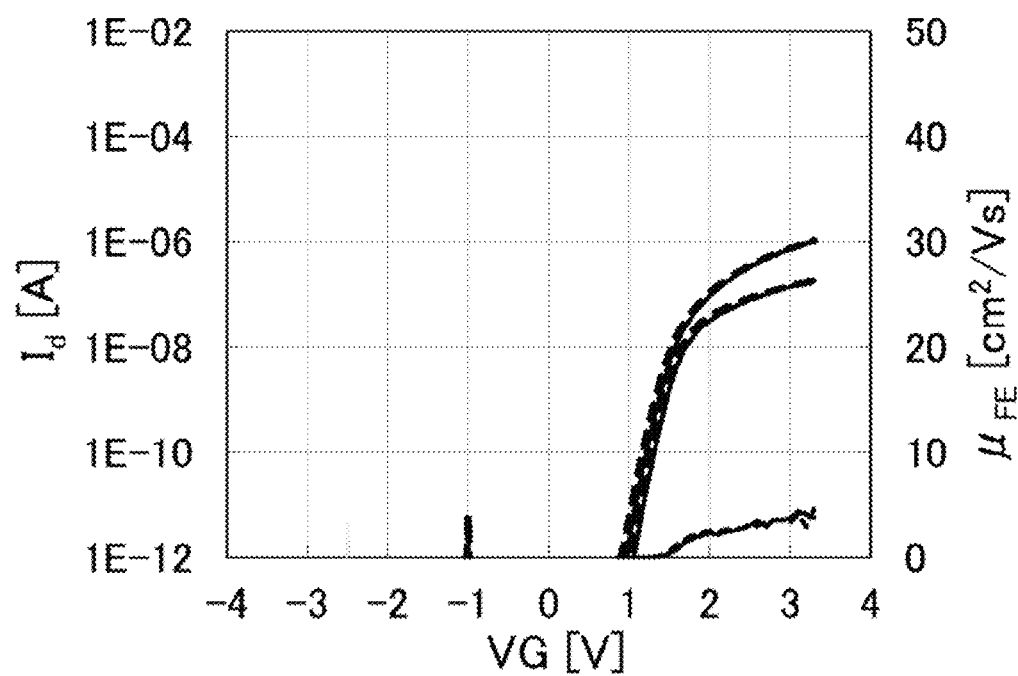
FIGS. 40A and 40B each show results of a BT stress test performed on a transistor of Example 1.
Figure 40B:
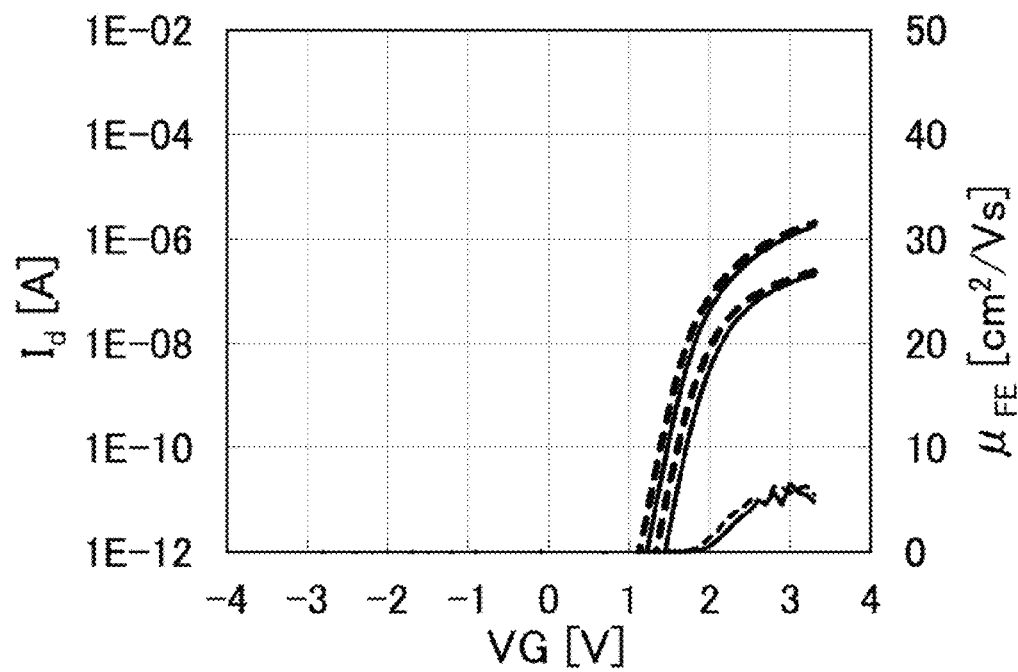

FIGS. 40A and 40B show results of negative back gate BT stress tests performed on two transistors. In the negative back gate BT stress test, measurements were performed as follows. First, $I_d$-$V_g$ characteristics before the stress test were measured. In the measurement, the back gate voltage was a predetermined voltage that varies among the tests, the drain voltage was 0.1 V or 1.2 V, and the gate voltage was swept from −3.3 V to 3.3 V in increments of 0.1 V. Next, $I_d$-$V_g$ characteristics after the stress test were measured. The stress test was performed by applying a drain voltage of 0 V, a gate voltage of 0 V, and a back gate voltage which is the same voltage as above for one hour. FIGS. 40A and 40B show stress test results obtained when the back gate voltages were −8 V and −12 V, respectively. As shown in FIGS. 40A and 40B, ΔShift values through the negative back gate BT stress tests for one hour were −0.06 V and −0.09 V, respectively. In addition, in FIGS. 40A and 40B, $\Delta V_{th}$ values through the negative back gate BT stress tests for one hour were −0.03 V and −0.06 V, respectively.

Figure 41A:
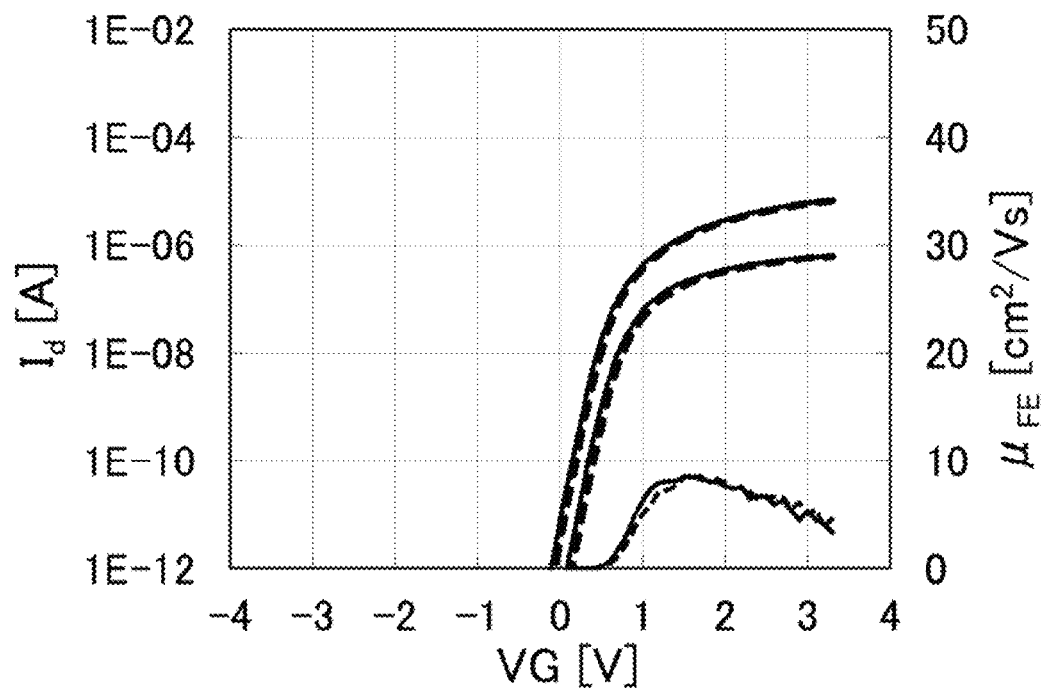
FIGS. 41A and 41B each show results of a BT stress test performed on a transistor of Example 1.
Figure 41B:
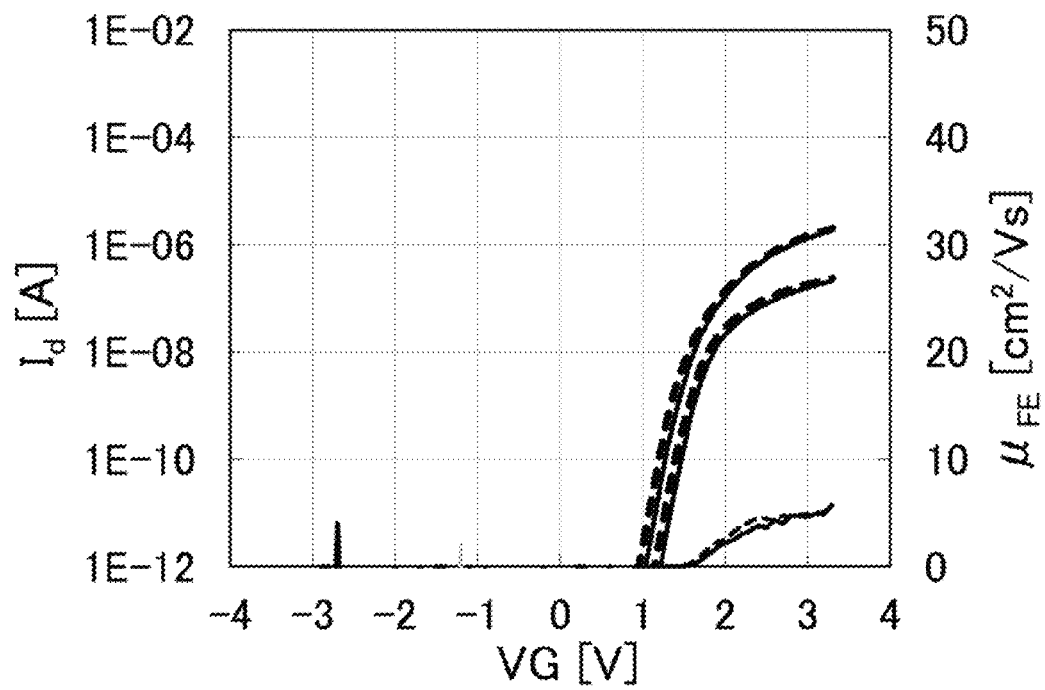

FIGS. 41A and 41B show results of positive drain BT stress tests performed on two transistors. In the positive drain BT stress test, measurements were performed as follows. First, $I_d$-$V_g$ characteristics before the stress test were measured. In the measurement, the back gate voltage was a predetermined voltage that varies among the tests, the drain voltage was 0.1 V or 1.2 V, and the gate voltage was swept from −3.3 V to 3.3 V in increments of 0.1 V. Next, $I_d$-$V_g$ characteristics after the stress test were measured. The stress test was performed by applying a gate voltage of 0 V, a back gate voltage which is the same voltage as above, and a drain voltage of 1.32 V for one hour. FIGS. 41A and 41B show stress test results obtained when the back gate voltages were 0 V and −12 V, respectively. As shown in FIGS. 41A and 41B, ΔShift values through the positive drain BT stress tests for one hour were 0.05 V and −0.08 V, respectively. In addition, in FIGS. 41A and 41B, $\Delta V_{th}$ values through the positive drain BT stress tests for one hour were 0.05 V and −0.02 V, respectively.

Figure 42A:
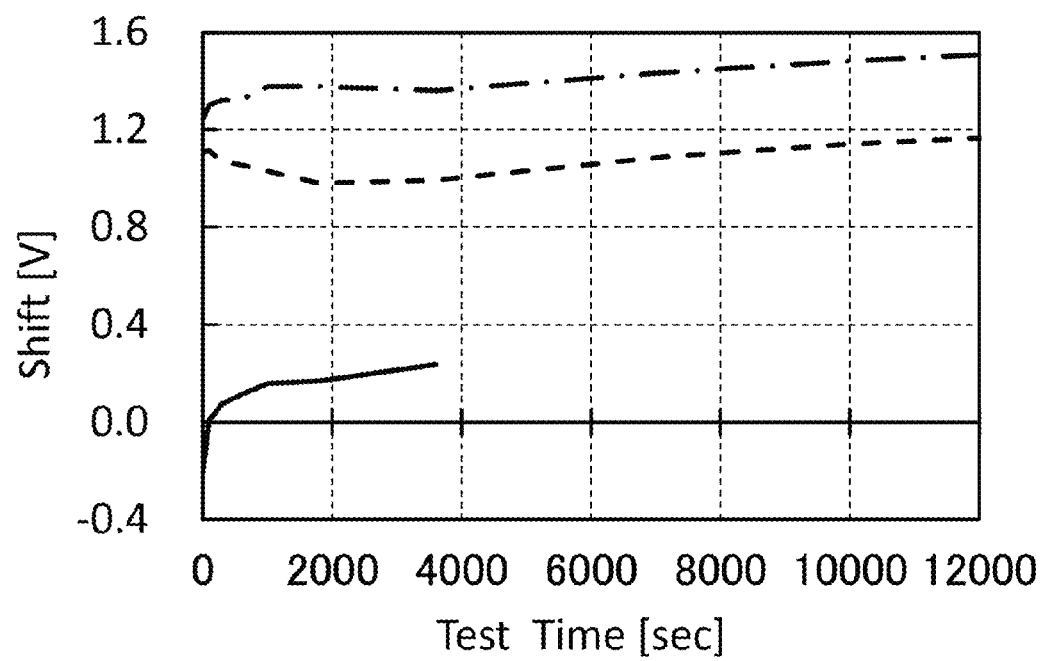
FIGS. 42A and 42B show results of BT stress tests performed on transistors of Example 1.
Figure 42B:
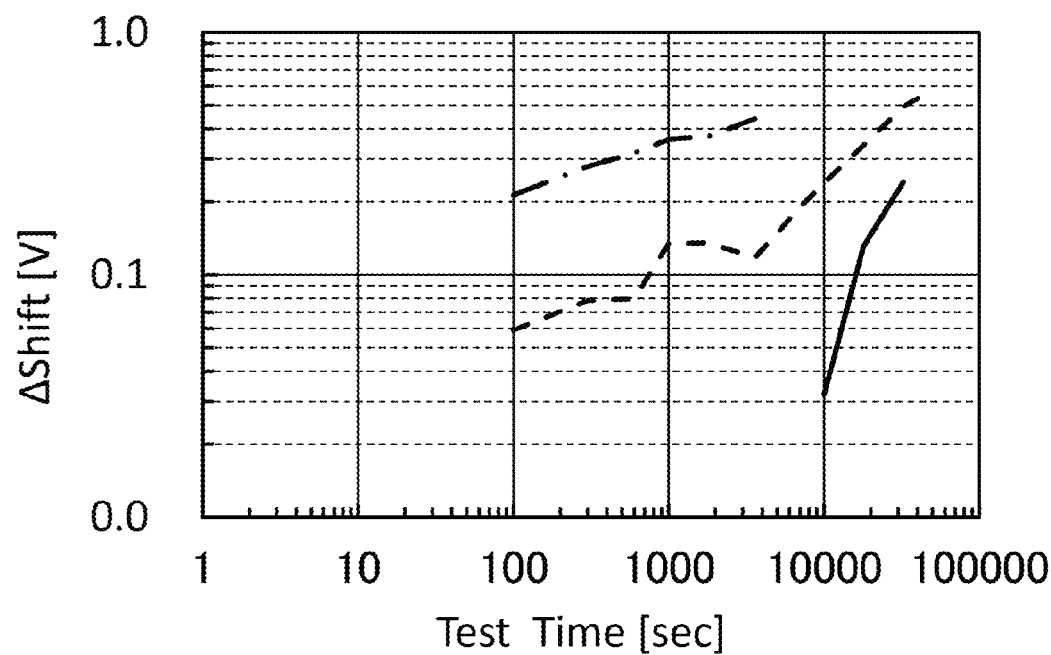

FIGS. 42A and 42B show results of stress tests performed on three transistors over time under different conditions. In FIGS. 42A and 42B, the horizontal axis indicates stress time. In addition, the vertical axis in FIG. 42A indicates Shift and the vertical axis in FIG. 42B indicates ΔShift relative to Shift before the stress test.

In the stress test whose results are shown by solid lines in FIGS. 42A and 42B, the gate voltage was 3.63 V and the drain voltage, the source voltage, and the back gate voltage were 0 V. In other words, the solid lines indicate the results of positive gate BT stress test performed on the transistor over time. In addition, in the stress test whose results are shown by dashed lines, the back gate voltage was −12 V and the gate voltage, the drain voltage, and the source voltage were 0 V. In other words, the dashed lines indicate the results of negative back gate BT stress test performed on the transistor over time. In addition, in the stress tests whose results are shown by dashed-dotted lines, the gate voltage was 3.63 V, the back gate voltage was −12 V, and the drain voltage and the source voltage were 0 V. In other words, the dashed-dotted lines indicate the results of the positive gate BT stress test and the negative back gate BT stress test performed at the same time on the transistor over time. In each stress test, a temperature of a substrate over which the measured transistor was provided was 125° C.

Figure 43A:
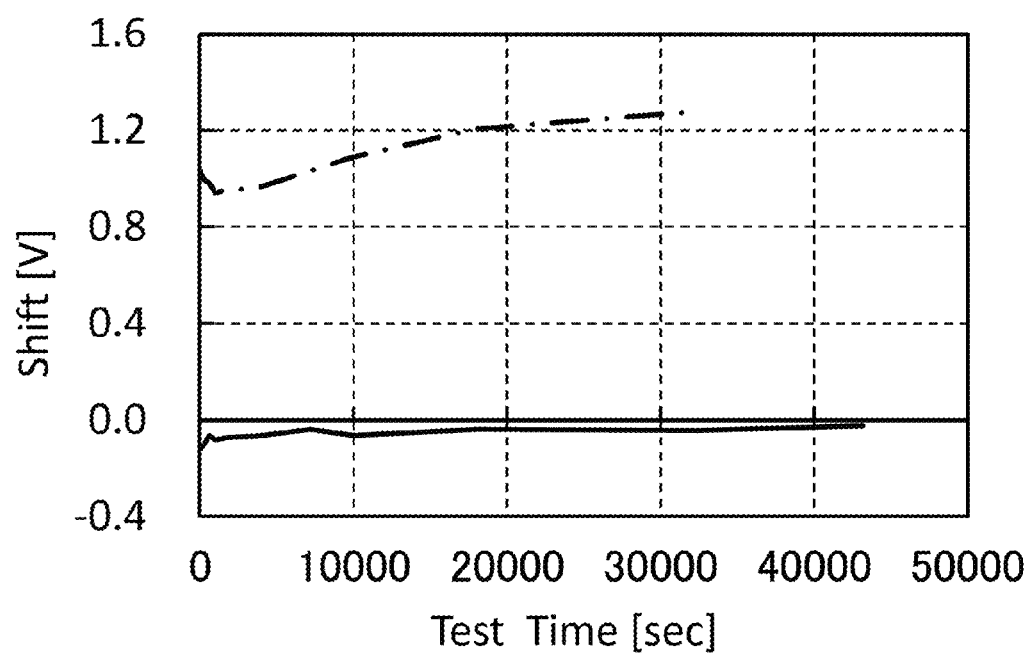
FIGS. 43A and 43B show results of BT stress tests performed on transistors of Example 1.
Figure 43B:
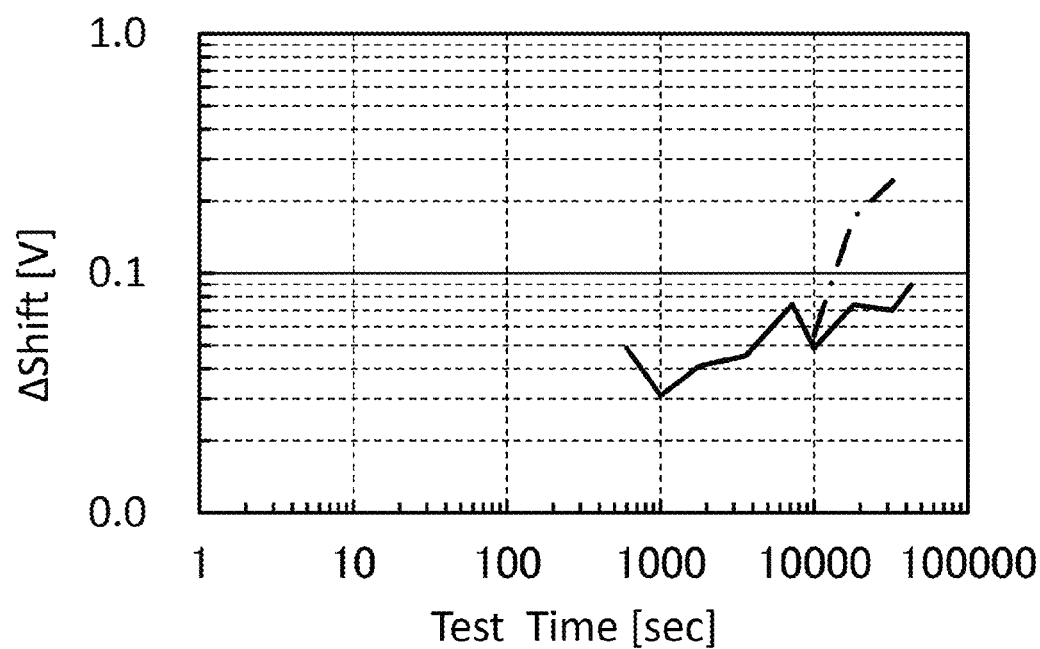

FIGS. 43A and 43B show results of stress tests performed on two transistors over time under different conditions. In FIGS. 43A and 43B, the horizontal axis indicates stress time. In addition, the vertical axis in FIG. 43A indicates Shift and the vertical axis in FIG. 43B indicates ΔShift relative to Shift before the stress test.

In the stress test whose results are shown by solid lines in FIGS. 43A and 43B, the drain voltage was 1.32 V and the gate voltage, the source voltage, and the back gate voltage were 0 V. In other words, the solid lines indicate the results of positive drain BT stress test performed on the transistor over time. In addition, in the stress test whose results are shown by dashed-dotted lines, the drain voltage was 1.32 V, the back gate voltage was −12 V, and the gate voltage and the source voltage were 0 V. In other words, the dashed-dotted lines indicate the results of the positive drain BT stress test and the negative back gate BT stress test performed at the same time on the transistor over time. In each stress test, a temperature of a substrate over which the measured transistor was provided was 125° C.

As described above, even when oxygen ions were added through formation of the insulator 282 by a sputtering method, changes in electrical characteristics of the transistor after the stress tests were small. Thus, by employing the structure described in this example, a highly reliable transistor can be provided.

EXAMPLE 2

In this example, samples were fabricated to measure the amount of movement of excess oxygen in the conductor 240a, the conductor 240b, the oxide 230c, and the insulator 280 of the transistor 200 included in the semiconductor device of one embodiment of the present invention, and TDS analysis results of silicon oxynitride films of the samples are described.

The samples used in the TDS analysis are Samples B1 to B3. Manufacturing methods thereof are described below.

First, in each of Samples B1 to B3, by thermal oxidation of a silicon wafer 800, a 100-nm-thick thermal oxide film 801 was formed on a surface of the silicon wafer. The thermal oxidation was performed at 950° C. in an oxygen atmosphere containing HCl at 3 volume % for four hours.

Next, in each of Samples B1 and B2, a 20-nm-thick tungsten film 811 was formed by a DC sputtering method.

Next, in each of Samples B2 and B3, a 5-nm-thick In—Ga—Zn oxide film (hereinafter also referred to as an oxide film) 812 was formed by a DC sputtering method. The In—Ga—Zn oxide film was formed using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

Next, in each of Samples B1 to B3, a 100-nm-thick silicon oxynitride film 813 was formed by a PECVD method.

Then, in each of Samples B1 to B3, a 40-nm-thick aluminum oxide film was formed by an RF sputtering method. The aluminum oxide film was formed using a target having an atomic ratio of Al:O=2:3 and deposition gases of an argon gas at 25 sccm and an oxygen gas at 25 sccm. A deposition pressure was 0.4 Pa. A deposition power was 2.5 kW. A substrate temperature was 250° C. A distance between the target and the substrate was 60 mm.

Next, Samples B1 to B3 were each subjected to heat treatment at 350° C. for one hour under an oxygen atmosphere.

Then, for Samples B1 to B3, wet etching was performed at 85° C. to remove the aluminum oxide film.

Figure 44A:
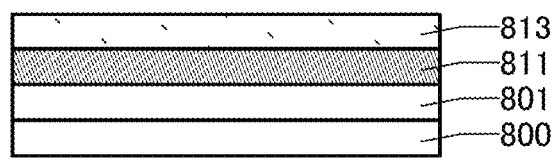
FIGS. 44A to 44C are each a schematic cross-sectional view of a sample used in TDS analysis of Example 2.
Figure 44B:
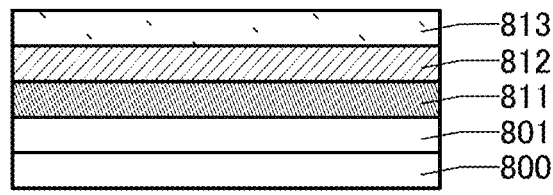
Figure 44C:
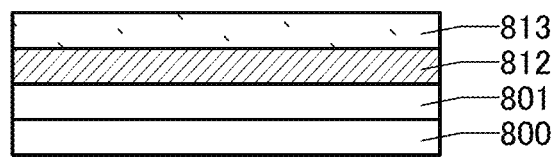

In this manner, Samples B1 to B3 were fabricated. FIGS. 44A to 44C illustrate cross-sectional schematic views of Samples B1 to B3.

Figure 45A:
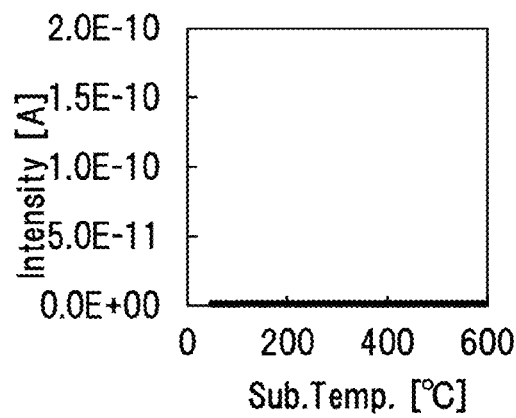
FIGS. 45A to 45C show TDS analysis results of Example 2.
Figure 45B:
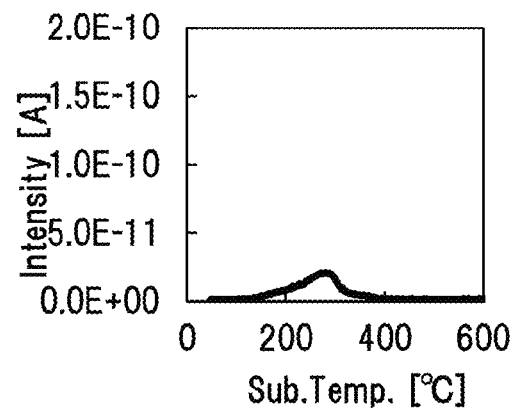
Figure 45C:
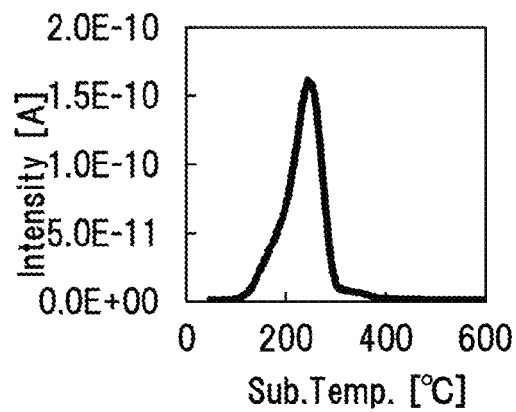

FIGS. 45A to 45C show results of TDS analysis which was performed on the silicon oxynitride films of Samples B1 to B3. Note that in the TDS analysis, the amount of a released gas with a mass-to-charge ratio m/z=32, which corresponds to an oxygen molecule, was measured. In each of FIGS. 45A to 45C, the horizontal axis represents substrate heating temperature [° C.] and the vertical axis represents intensity proportional to the amount of the released gas with m/z=32. In addition, Table 2 shows the amount of oxygen released from the silicon oxynitride films of Samples B1 to B3. In Table 2, the amount of released oxygen in the case of being converted into oxygen molecules, the amount of released oxygen in the case of being converted into oxygen atoms, and the amount of released oxygen per unit thickness of the silicon oxynitride film in the case of being converted into oxygen atoms of each of Samples B1 to B3 are shown.

TABLE 2

|  | Released oxygen converted into $O_2$ [molecules/cm$^2$] | Released oxygen converted into O [atoms/cm$^2$] | Released oxygen converted into O per unit thickness [atoms/cm$^3$] |
| --- | --- | --- | --- |
| Sample B1 | 2.0E+13 | 4.0E+13 | 4.0E+18 |
| Sample B2 | 2.7E+14 | 5.5E+14 | 5.5E+19 |
| Sample B3 | 2.0E+15 | 3.9E+15 | 3.9E+20 |

As shown in FIG. 45A, in Sample B1 in which the oxide film 812 is not provided between the tungsten film 811 and the silicon oxynitride film 813, oxygen molecules are hardly released from the silicon oxynitride film 813. This indicates that oxygen molecules released from the silicon oxynitride film 813 by heat treatment are absorbed into the tungsten film 811 because an aluminum oxide film has a barrier property against oxygen molecules. On the other hand, as shown in FIG. 45B, in Sample B2 in which the oxide film 812 is provided between the tungsten film 811 and the silicon oxynitride film 813, oxygen molecules released from the silicon oxynitride film 813 is observed. Thus, it is probable that the oxide film 812 has a function of substantially suppressing permeation of oxygen molecules. In Sample B3 in which the tungsten film 811 is not provided, a larger amount of oxygen molecules released from the silicon oxynitride film 813 than that in Sample B2 is observed (see FIG. 45C).

The above results indicate that, in consideration of the amount of released oxygen in Sample B2 and Sample B3, the amount of oxygen released from the conductor 240*a* and the conductor 240*b* of the transistor 200 included in the semiconductor device of one embodiment of the present invention in the case of being converted into oxygen atoms per unit area is less than or equal to $3.4 \times 10^{15}$ atoms/cm$^2$, preferably less than or equal to $6.8 \times 10^{14}$ atoms/cm$^2$ in TDS analysis.

This application is based on Japanese Patent Application serial no. 2015-257709 filed with Japan Patent Office on Dec. 29, 2015, the entire contents of which are hereby incorporated by reference.

What is claimed is:

1. A transistor comprising:
   a first insulator over a substrate:
   a first oxide over the first insulator;
   an oxide semiconductor over the first oxide;
   a first conductor over the oxide semiconductor;
   a second oxide over and in contact with the first insulator, the first oxide, the oxide semiconductor, and the first conductor;
   a second insulator over the second oxide;
   a second conductor over the second insulator;
   a third insulator over the second insulator and the second conductor; and
   a fourth insulator over the second oxide, the second insulator, and the third insulator, the fourth insulator comprising a region containing oxygen in excess of the stoichiometric composition,
   wherein the first conductor is separated from the fourth insulator by the second oxide,
   wherein the second conductor is separated from the fourth insulator by the third insulator,
   wherein the second oxide is configured to control permeation of oxygen as long as oxygen contained in the fourth insulator is sufficiently supplied to the oxide semiconductor through the second oxide, and
   wherein the third insulator has a barrier property against oxygen.

2. The transistor according to claim 1, further comprising:
   a third conductor;
   a fifth insulator over the third conductor; and
   a sixth insulator over the fifth insulator,
   wherein the first insulator is provided over the sixth insulator.

3. The transistor according to claim 2,
   wherein the first conductor comprises a region serving as a source or a drain,
   wherein the second insulator comprises a region serving as a gate insulating film,
   wherein the second conductor comprises a region serving as a first gate electrode, and
   wherein the third conductor serves as a second gate electrode.

4. The transistor according to claim 3, further comprising a fourth conductor over the second conductor,
   wherein the fourth conductor comprises a region serving as the first gate electrode, and
   wherein an end portion of the fourth conductor is substantially aligned with an end portion of the second conductor.

5. The transistor according to claim 4,
   wherein the second conductor comprises titanium nitride, and
   wherein the fourth conductor comprises tungsten.

6. The transistor according to claim 2,
   wherein the first insulator and the second insulator each comprise a region containing oxygen in excess of the stoichiometric composition.

7. The transistor according to claim 1,
   wherein an end portion of the oxide semiconductor is substantially aligned with an end portion of the first oxide.

8. The transistor according to claim 1,
   wherein an end portion of the second insulator is substantially aligned with an end portion of the third insulator.

9. The transistor according to claim 1,
   wherein the first oxide, the oxide semiconductor, and the second oxide each comprise In-M-Zn oxide, and
   wherein M is Al, Ga, Y, or Sn.

10. The transistor according to claim 1,
    wherein the first conductor comprises tungsten.

11. The transistor according to claim 10,
    wherein the first conductor is tungsten in which an amount of released oxygen that is converted into oxygen atoms in TDS analysis at a temperature in the range from 50° C. to 500° C. is less than or equal to $3.4 \times 10^{15}$ atoms/cm$^2$.

12. A semiconductor device comprising:
the transistor according to claim 1; and
a capacitor,
wherein one of a source and a drain of the transistor is electrically connected to one of a pair of electrodes of the capacitor.

13. The semiconductor device according to claim 12, further comprising a second transistor,
wherein the second transistor comprises silicon in a semiconductor region, and
wherein the one of the source and the drain of the transistor is electrically connected to a gate of the second transistor.

14. A semiconductor wafer comprising:
the transistor according to claim 1; and
a region for dicing.

15. A transistor comprising:
a first conductor over a substrate;
a first insulator over the first conductor;
a first oxide over the first insulator;
an oxide semiconductor over the first oxide;
a second conductor over the oxide semiconductor;
a second oxide over the first insulator, the first oxide, the oxide semiconductor, and the second conductor;
a second insulator over the second oxide;
a third conductor over the second insulator;
a third insulator over the second insulator and the third conductor; and
a fourth insulator over the second oxide, the second insulator, and the third insulator, the fourth insulator comprising a region containing oxygen in excess of the stoichiometric composition,
wherein the second conductor is separated from the fourth insulator by the second oxide,
wherein the third conductor is separated from the fourth insulator by the third insulator,
wherein the second oxide is configured to control permeation of oxygen as long as oxygen contained in the fourth insulator is sufficiently supplied to the oxide semiconductor through the second oxide, and
wherein the third insulator has a barrier property against oxygen.

16. The transistor according to claim 15, further comprising:
a fifth insulator over the first conductor; and
a sixth insulator over the fifth insulator,
wherein the first insulator is provided over the sixth insulator.

17. The transistor according to claim 15,
wherein the first conductor serves as a second gate electrode,
wherein the second conductor comprises a region serving as a source or a drain,
wherein the second insulator comprises a region serving as a gate insulating film, and
wherein the third conductor comprises a region serving as a first gate electrode.

18. The transistor according to claim 17, further comprising a fourth conductor over the third conductor,
wherein the fourth conductor comprises a region serving as the first gate electrode, and
wherein an end portion of the fourth conductor is substantially aligned with an end portion of the third conductor.

19. The transistor according to claim 18,
wherein the third conductor comprises titanium nitride, and
wherein the fourth conductor comprises tungsten.

20. The transistor according to claim 15,
wherein an end portion of the oxide semiconductor is substantially aligned with an end portion of the first oxide.

21. The transistor according to claim 15,
wherein an end portion of the second insulator is substantially aligned with an end portion of the third insulator.

22. The transistor according to claim 15,
wherein the first oxide, the oxide semiconductor, and the second oxide each comprise In-M-Zn oxide, and
wherein M is Al, Ga, Y, or Sn.

23. The transistor according to claim 15,
wherein the second conductor comprises tungsten.

24. The transistor according to claim 23,
wherein the second conductor is tungsten in which an amount of released oxygen that is converted into oxygen atoms in TDS analysis at a temperature in the range from 50° C. to 500° C. is less than or equal to $3.4 \times 10^{15}$ atoms/cm$^2$.

25. A semiconductor device comprising:
the transistor according to claim 15; and
a capacitor,
wherein one of a source and a drain of the transistor is electrically connected to one of a pair of electrodes of the capacitor.

26. The semiconductor device according to claim 25, further comprising a second transistor,
wherein the second transistor comprises silicon in a semiconductor region, and
wherein the one of the source and the drain of the transistor is electrically connected to a gate of the second transistor.

27. A semiconductor wafer comprising:
the transistor according to claim 15; and
a region for dicing.

28. The transistor according to claim 15,
wherein the first insulator and the second insulator each comprise a region containing oxygen in excess of the stoichiometric composition.

\* \* \* \* \*